United States Patent
Yang

(10) Patent No.: US 8,431,977 B2
(45) Date of Patent: Apr. 30, 2013

(54) WAFER LEVEL PROCESSING METHOD AND STRUCTURE TO MANUFACTURE SEMICONDUCTOR CHIP

(75) Inventor: Ping-Jung Yang, Hsin-Chu (TW)

(73) Assignee: Megica Corporation, Hsin-Chu (TW)

( * ) Notice: Subject to any disclaimer, the term of this patent is extended or adjusted under 35 U.S.C. 154(b) by 2 days.

(21) Appl. No.: 13/158,315

(22) Filed: Jun. 10, 2011

(65) Prior Publication Data

US 2011/0304008 A1    Dec. 15, 2011

Related U.S. Application Data

(60) Provisional application No. 61/353,616, filed on Jun. 10, 2010.

(51) Int. Cl.
*H01L 31/062* (2012.01)

(52) U.S. Cl.
USPC .................................. 257/294; 257/E31.121

(58) Field of Classification Search .................. 257/294, 257/E31.121
See application file for complete search history.

(56) References Cited

U.S. PATENT DOCUMENTS

| | | | |
|---|---|---|---|
| 6,777,767 B2 | 8/2004 | Badehi | |
| 7,582,556 B2 | 9/2009 | Lin | |
| 8,193,555 B2 * | 6/2012 | Lin et al. ...................... | 257/99 |
| 2006/0193691 A1 | 8/2006 | Gonzalez et al. | |
| 2009/0014826 A1 | 1/2009 | Chien | |
| 2009/0042338 A1 | 2/2009 | Purushothaman | |
| 2009/0057868 A1 | 3/2009 | Wang | |

FOREIGN PATENT DOCUMENTS

KR    20030002628    1/2003

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

(Continued)

*Primary Examiner* — Trung Q Dang
(74) *Attorney, Agent, or Firm* — Seyfarth Shaw LLP

(57) ABSTRACT

A semiconductor chip includes a silicon substrate, a transistor in or on a bottom side surface of the substrate, a metallization structure under a bottom side surface of the substrate, a dielectric layer under the substrate and between a first and second metal layers of the metallization structure, a passivation layer under the metallization structure and the dielectric layer, where an opening in the passivation layer may be under a contact point of the metallization structure, a polymer layer under the passivation layer, a metal post under the passivation layer and in the polymer layer, where the polymer layer may not cover a bottom surface of the metal post, a metal bump connected with the bottom surface of the metal post, a microlense over the top side surface of the substrate, and a glass substrate over the micro-lense and over the top side surface of the substrate.

20 Claims, 42 Drawing Sheets

OTHER PUBLICATIONS

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

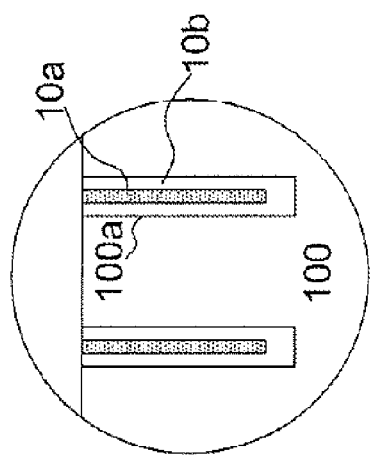
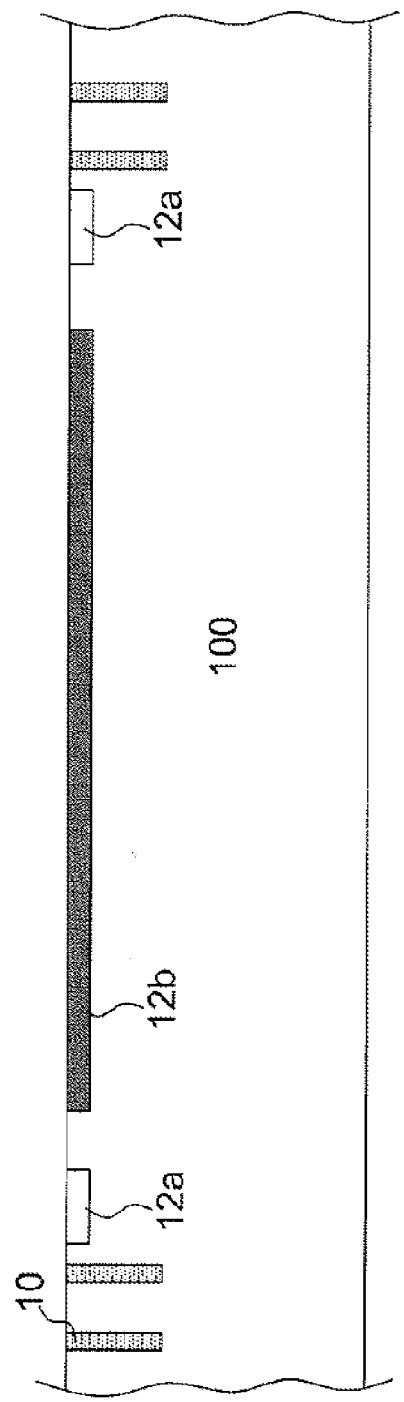

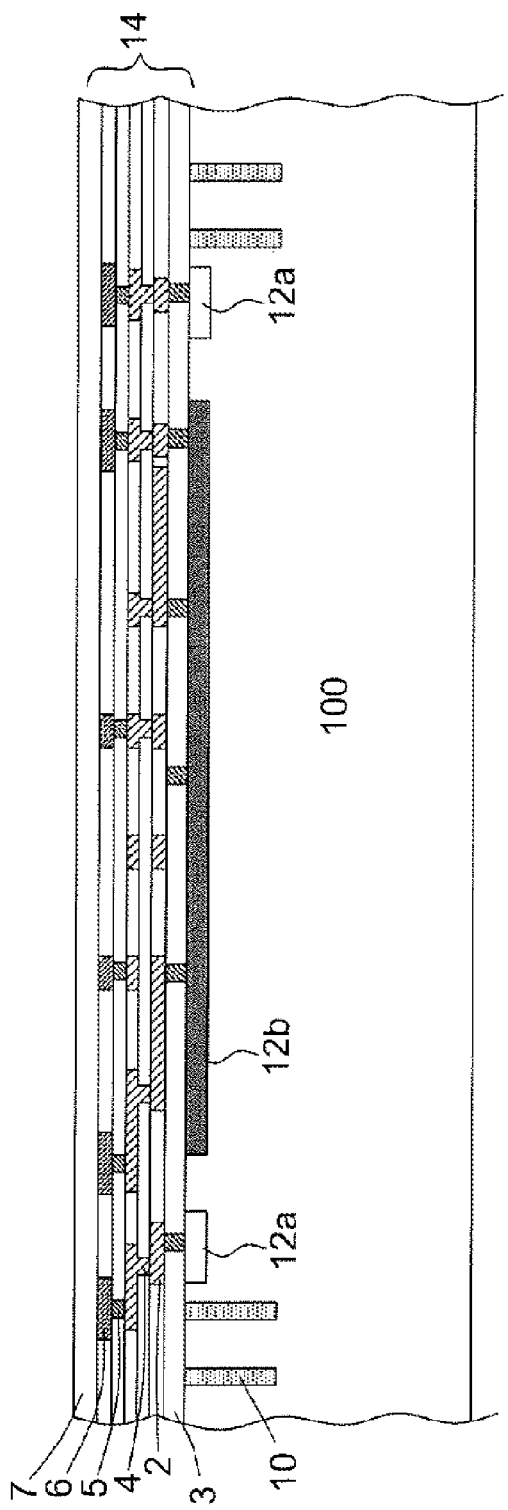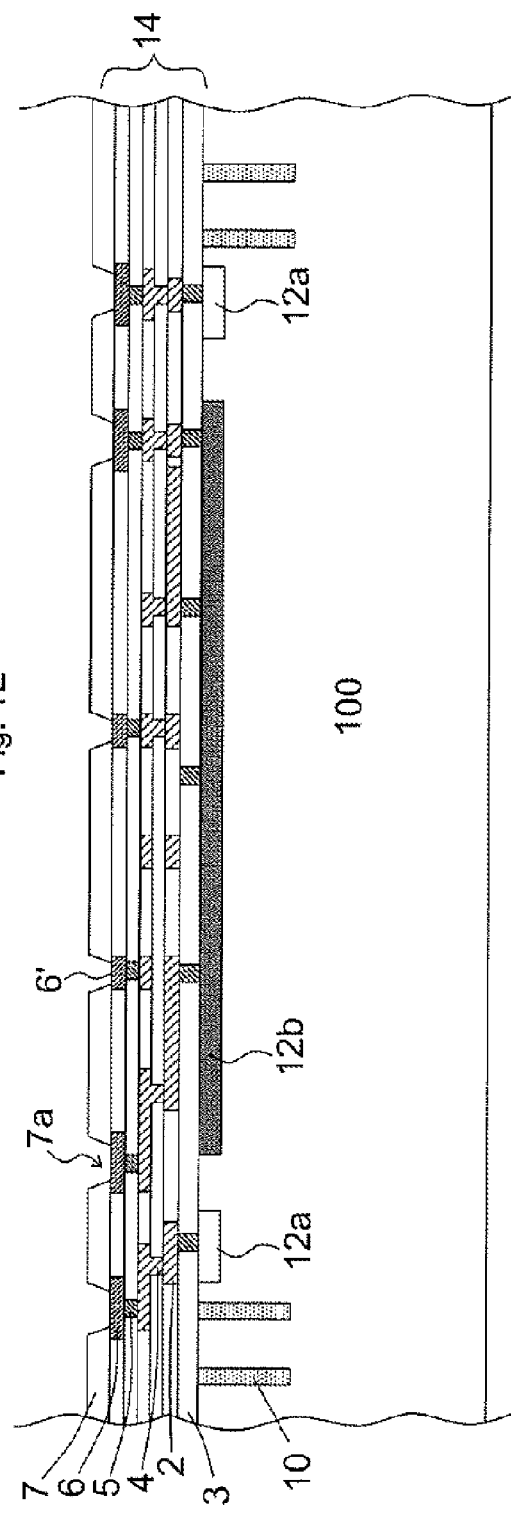

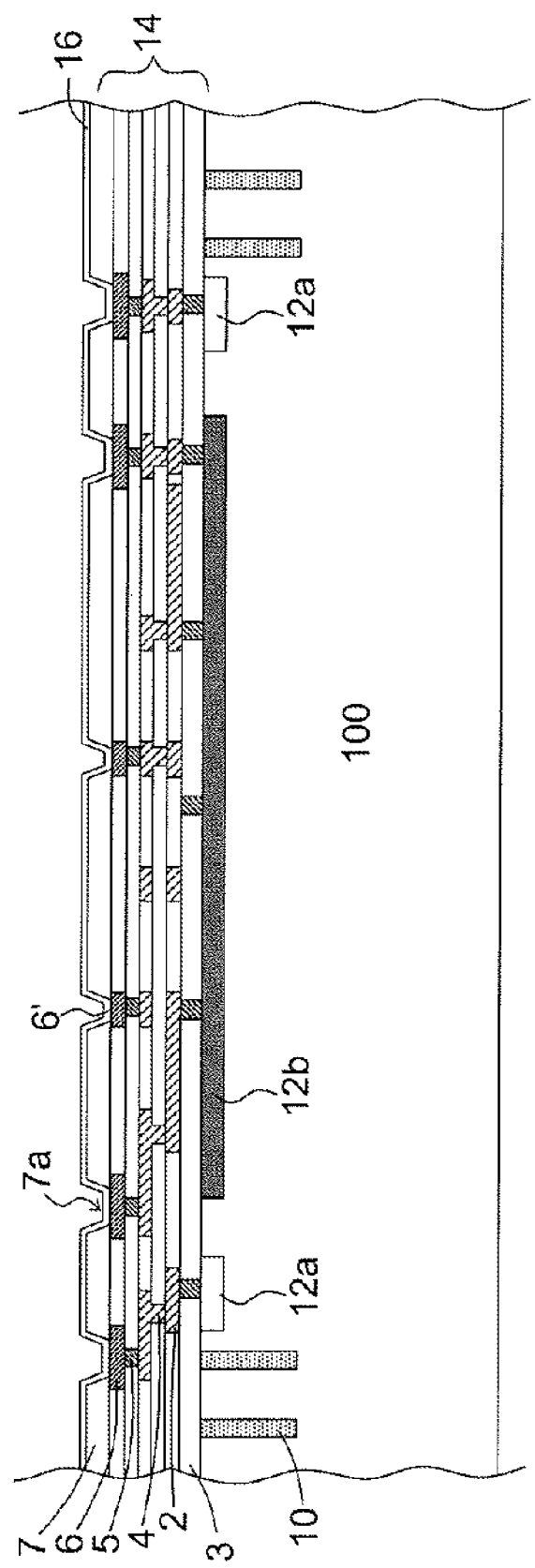

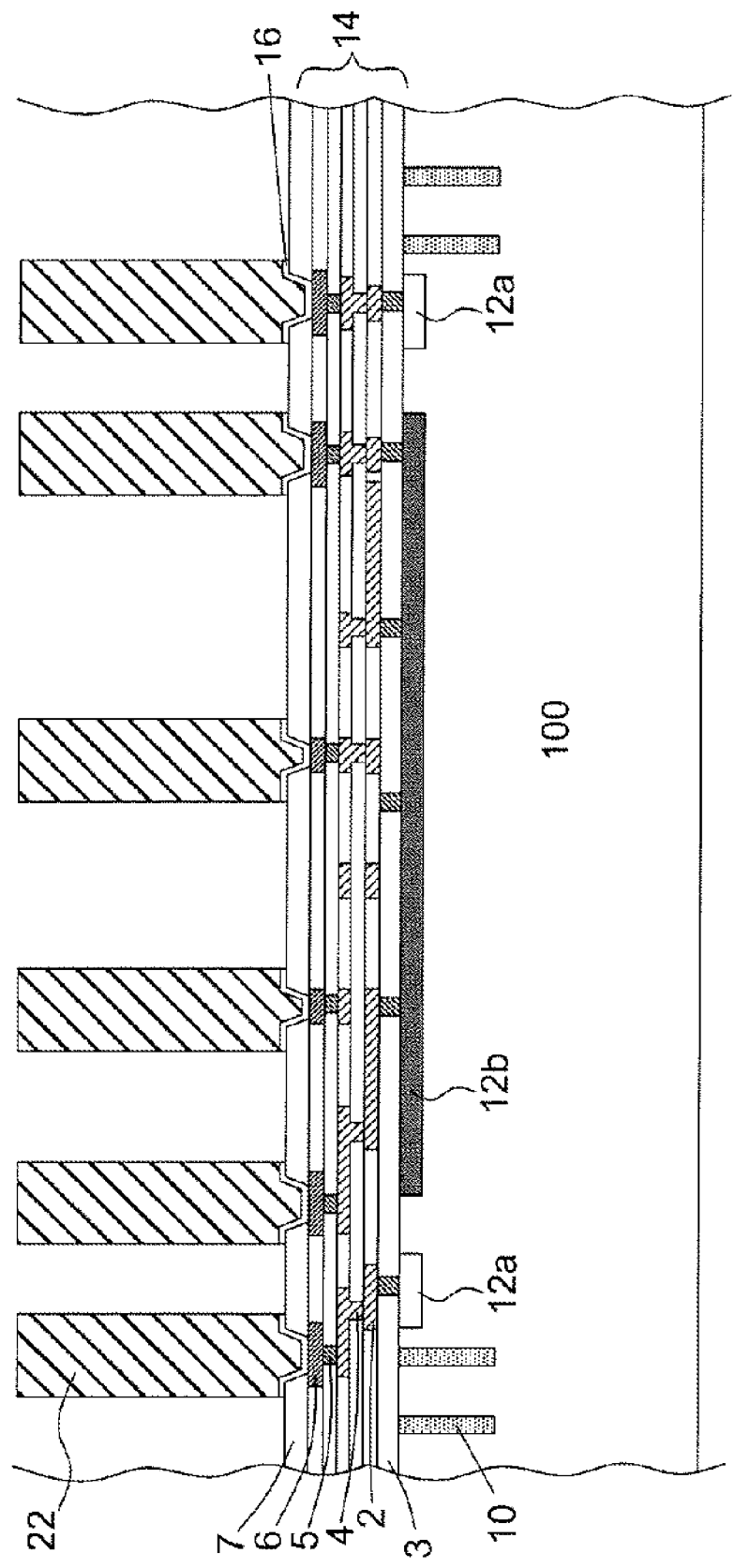

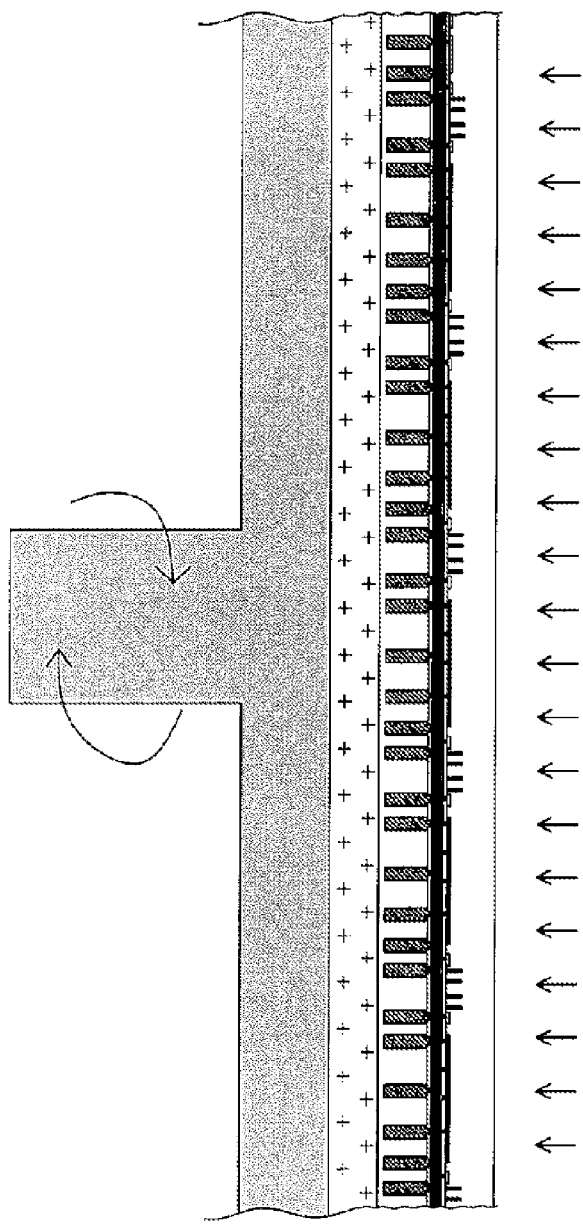
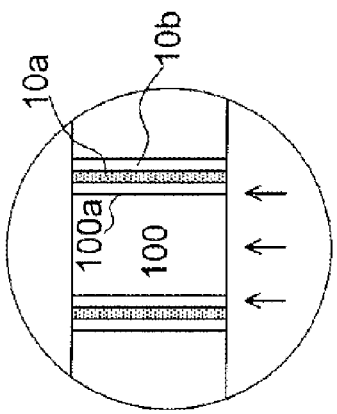
Fig. 1L
Fig. 1L-1

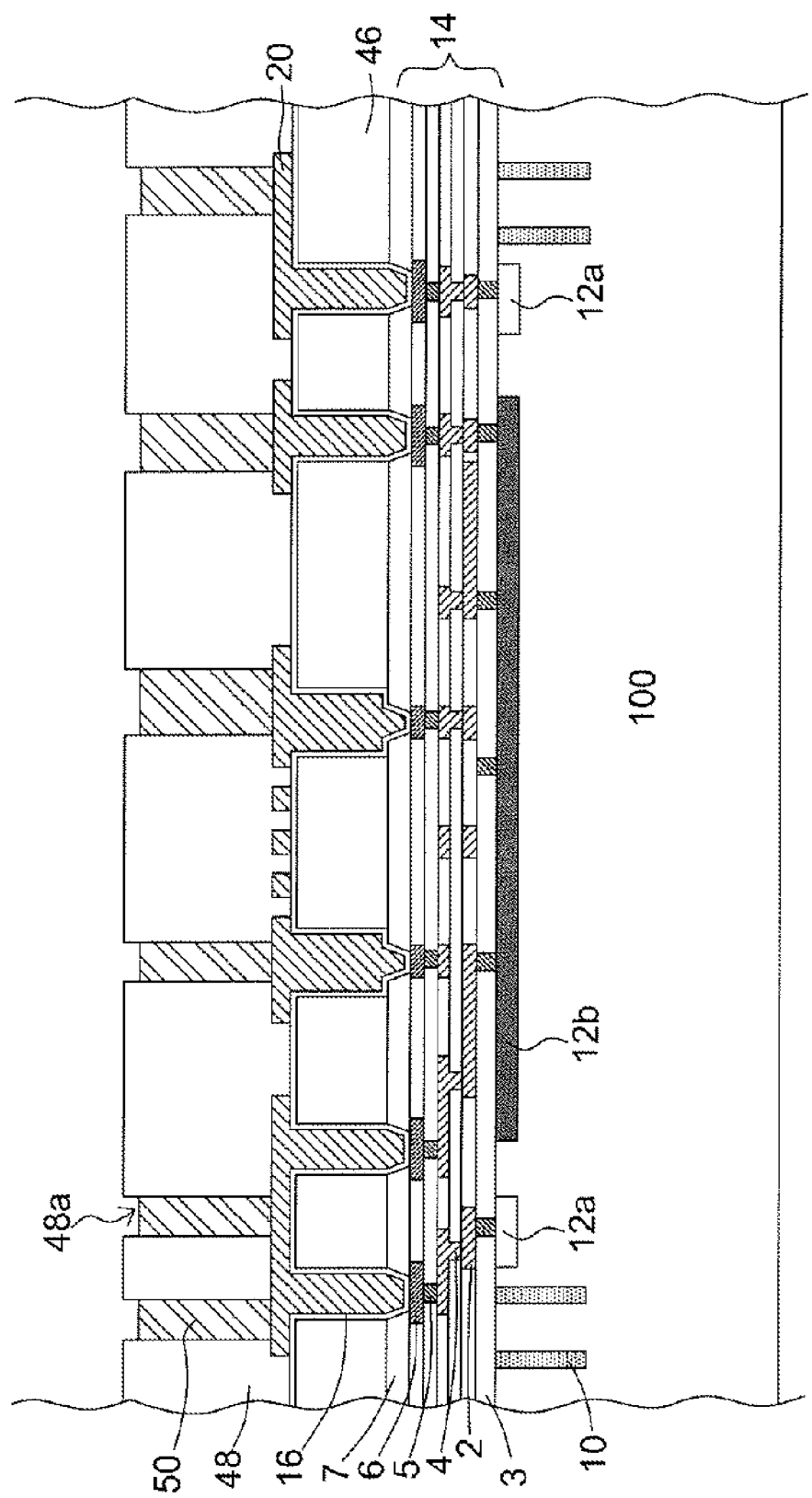

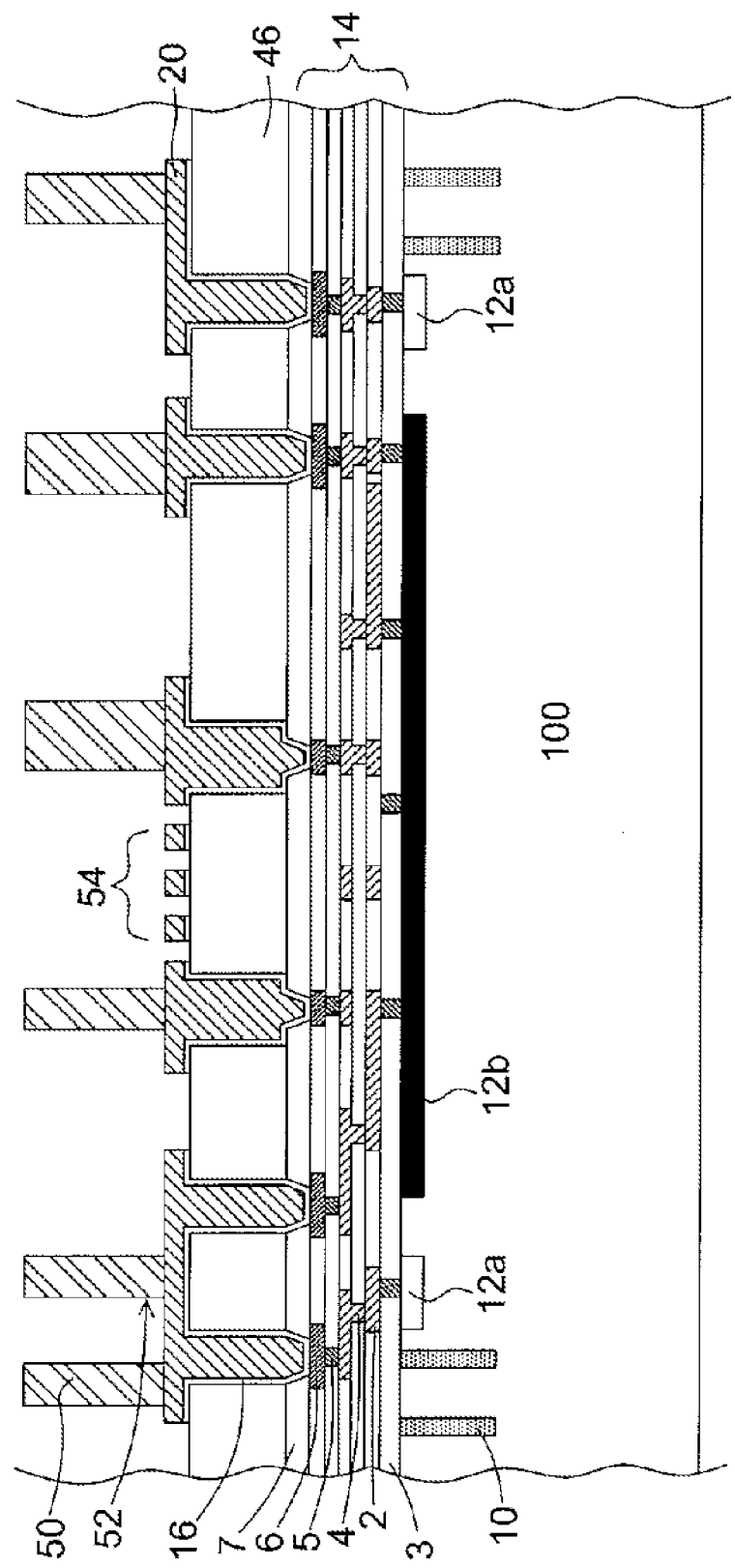

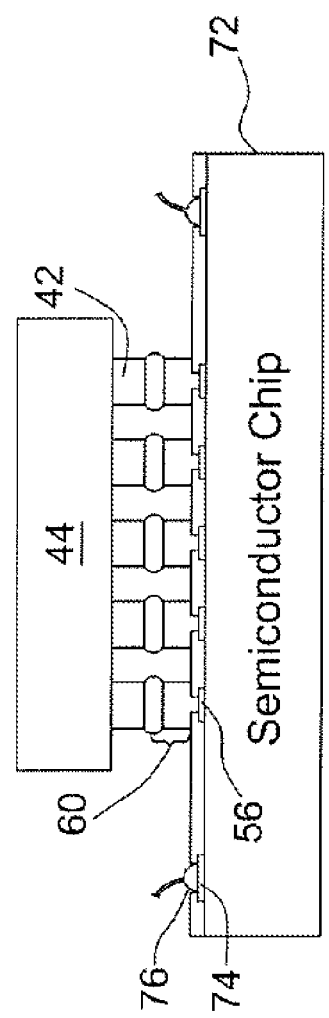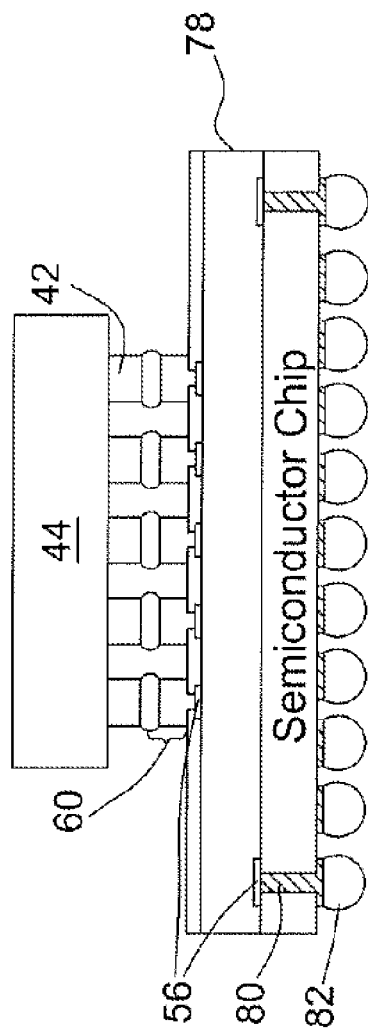

WAFER LEVEL PROCESSING METHOD AND STRUCTURE TO MANUFACTURE SEMICONDUCTOR CHIP

CROSS-REFERENCE TO RELATED APPLICATIONS

This application claims the benefit of priority from U.S. Provisional Patent Application Ser. No. 61/353,616, entitled "WAFER LEVEL PROCESSING METHOD AND STRUCTURE TO MANUFACTURE SEMICONDUCTOR CHIP," filed on Jun. 10, 2010, which is herein incorporated by reference in its entirety.

BACKGROUND OF THE DISCLOSURE

1. Field of the Disclosure

The present disclosure a wafer level processing method and structure to manufacture a semiconductor chip, the semiconductor chip to be as a backside illumination (BSI) image Sensor Chip.

2. Brief Description of the Related Art

Various methods and systems have been proposed for manufacturing semiconductor chips. For example, an image sensor package and a method for fabricating thereof has been proposed where a substrate having an insulator filled cavity is provided with an image sensor device electrical connected to a metal layer, thereon. A covering plate is then disposed on the substrate. The substrate is subsequently thinned to expose the insulator. Removing a portion of the insulator, a hole is formed and a conductive layer is filled therein to form a via hole. Next, a solder ball is located over a backside of the substrate which is electrically connected to the metal layer through the via hole. The image sensor package is thinned, thus, the dimensions thereof are reduced.

In another example, a crystalline substrate based device has been proposed that includes a crystalline substrate having formed thereon a microstructure, and a transparent packaging layer which is sealed over the microstructure by an adhesive and defines therewith at least one gap between the crystalline substrate and the packaging layer. The microstructure receives light via the transparent packaging layer.

In another example, a wafer level chip size package has been proposed where the package has cavities within which micro-machined parts are free to move, allowing access to electrical contacts, and optimized for device performance. Also a method for fabricating a wafer level chip size package for Microelectromechanical systems (MEMS) devices has been proposed that provides a well packed device with the size much closely to the original one, making it possible to package the whole wafer at the same time and therefore, saves the cost and cycle time.

In another example, a circuit structure has been proposed that includes a semiconductor substrate, first and second metallic posts over the semiconductor substrate, an insulating layer over the semiconductor substrate and covering the first and second metallic posts, first and second bumps over the first and second metallic posts or over the insulating layer. The first and second metallic posts have a height of between 20 and 300 microns, with the ratio of the maximum horizontal dimension thereof to the height thereof being less than 4. The distance between the center of the first bump and the center of the second bump is between 10 and 250 microns.

SUMMARY OF THE DISCLOSURE

Aspects and embodiments of the present disclosure address the shortcomings noted previously by providing a semiconductor chip, the semiconductor chip including a fine-pitched chip having multiple metal posts and thick polymer preformed on the front side of the chip, a transparent substrate adhesive to the back side of the chip and a very thin silicon substrate to allow a light to pass through the silicon substrate.

Embodiments of the present disclosure provide a semiconductor chip including a silicon substrate including a top side surface and a bottom side surface, wherein the silicon substrate has a thickness smaller than 10 micrometers, a transistor in or on said bottom side surface, a metallization structure under the bottom side surface of the silicon substrate, wherein said metallization structure includes a first metal layer, a second metal layer over the first metal layer, a dielectric layer under the silicon substrate and between the first and second metal layers, a passivation layer under the metallization structure and under the dielectric layer, wherein the passivation layer includes a nitride layer, wherein an opening in the passivation layer is under a contact point of the metallization structure, a polymer layer under the passivation layer, wherein the polymer layer has a thickness between 20 and 200 micrometers, a metal post under the passivation layer and in the polymer layer, wherein the polymer layer is not cover a bottom surface of said metal post, a metal bump connected with said bottom surface of said metal post, a micro-lense over the top side surface of the silicon substrate and a glass substrate over the micro-lense and over said top side surface of the silicon substrate.

Embodiments of the present disclosure provide a semiconductor chip including a silicon substrate including a top side surface and a bottom side surface, wherein the silicon substrate has a thickness smaller than 10 micrometers, a transistor in or on said bottom side surface of the silicon substrate, a metallization structure under the bottom side surface of the silicon substrate, wherein the metallization structure includes a first metal layer, a second metal layer over said first copper layer, a dielectric layer under the silicon substrate and between the first and second metal layers, a passivation layer under the metallization structure and under the dielectric layer, wherein the passivation layer includes a nitride layer, wherein an opening in the passivation layer is under a contact point of the metallization structure, a metal trace under the passivation layer, a polymer layer under the passivation layer and under the metal trace, wherein the polymer layer has a thickness between 20 and 200 micrometers, a metal post under the metal trace and in the polymer layer, wherein the polymer layer is not cover a bottom surface of the metal post, wherein the metal post is connected to the contact point through the metal trace, a metal bump connected with said bottom surface of the metal post, a micro-lense over the top side surface of the silicon substrate, a glass substrate over the micro-lense and over said top side surface of silicon substrate.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure.

FIGS. 3A-3G are cross-sectional views of the chip packaging in accordance with the present disclosure.

Figure 1A:
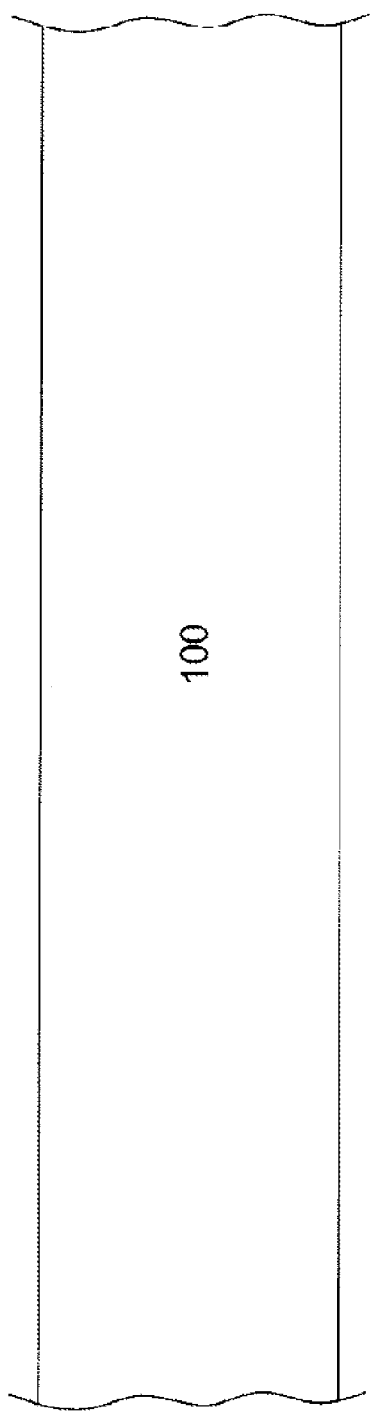
FIGS. 1A-1Y are cross-sectional views and a process showing a embodiment 1 of a process of forming a semiconductor chip, in accordance with the present disclosure.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE DISCLOSURE

Illustrative embodiments are now discussed. Other embodiments may be used in addition or instead. Details that may be apparent or unnecessary may be omitted to save space or for a more effective presentation. Conversely, some embodiments may be practiced without all of the details that are disclosed.

Embodiments of the present disclosure are directed to image or light sensor chip including a one or more metal posts or pillars preformed on the image or light sensor chip for improved electrical performance and a thick polymer layer preformed on the image or light sensor chip for improved the stress of silicon substrate. Exemplary embodiments are described below; other embodiments may be practiced within the scope of the present disclosure.

Embodiment 1

Figure 1B:
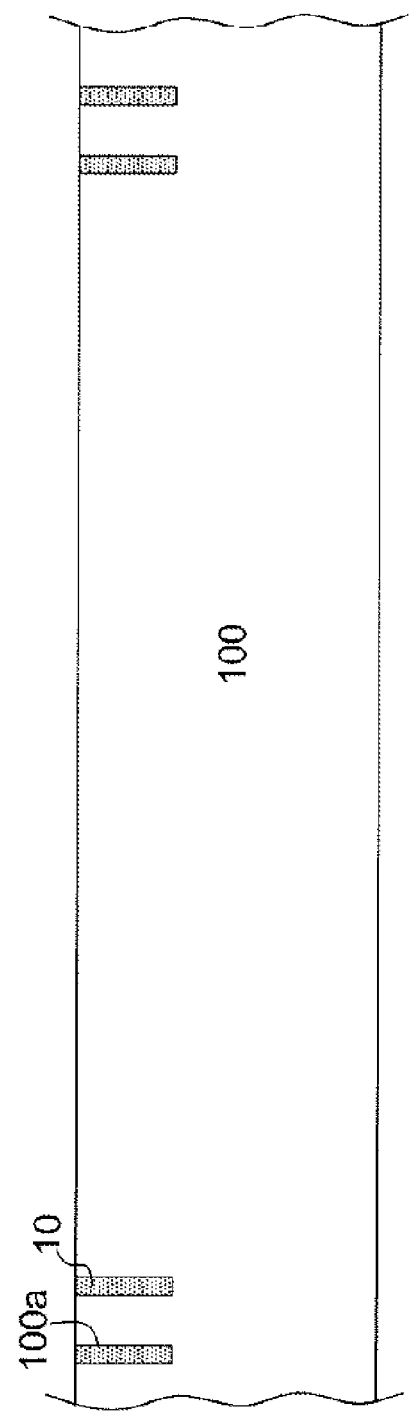
Figure 1H:
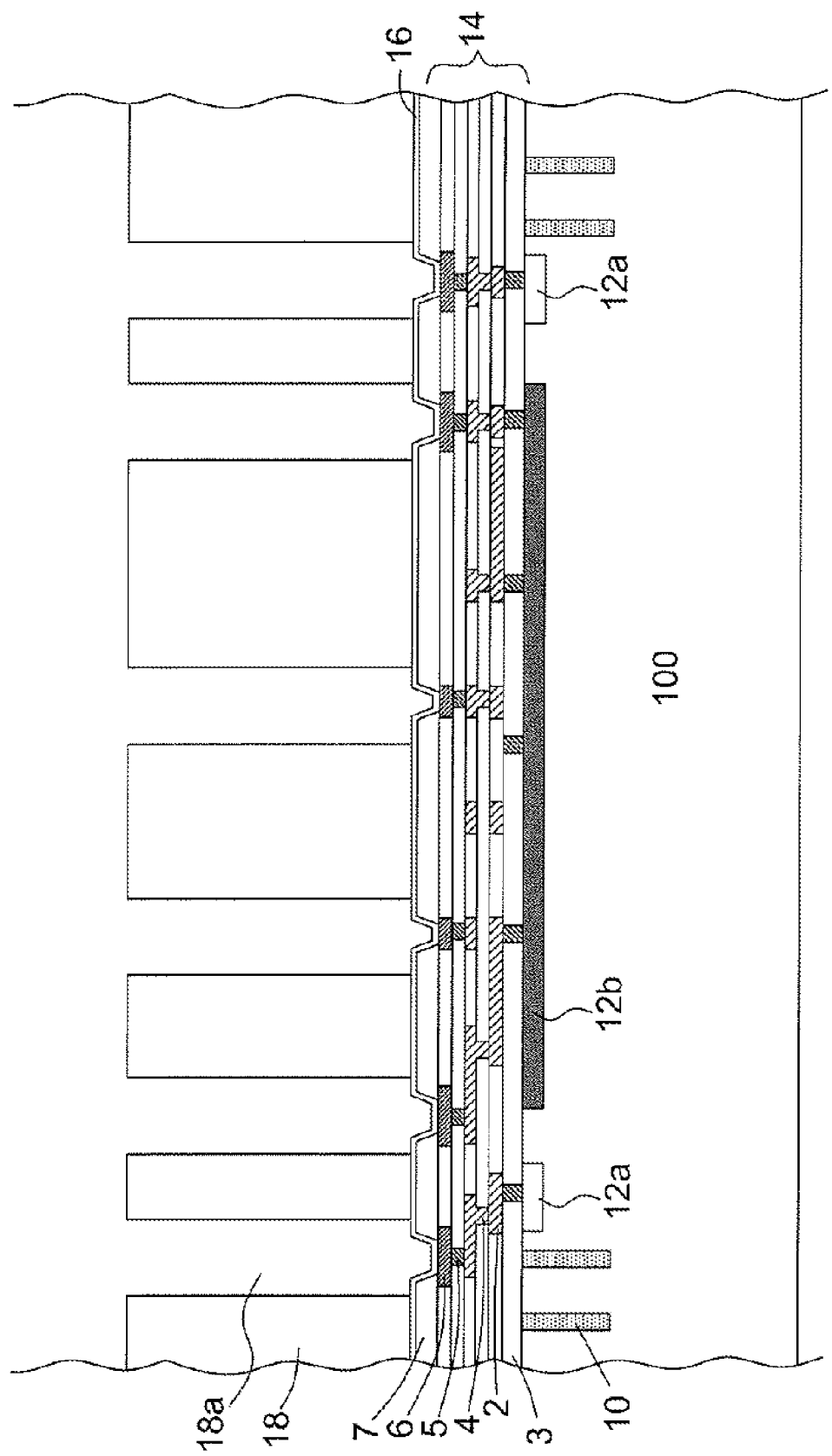
Figure 11:
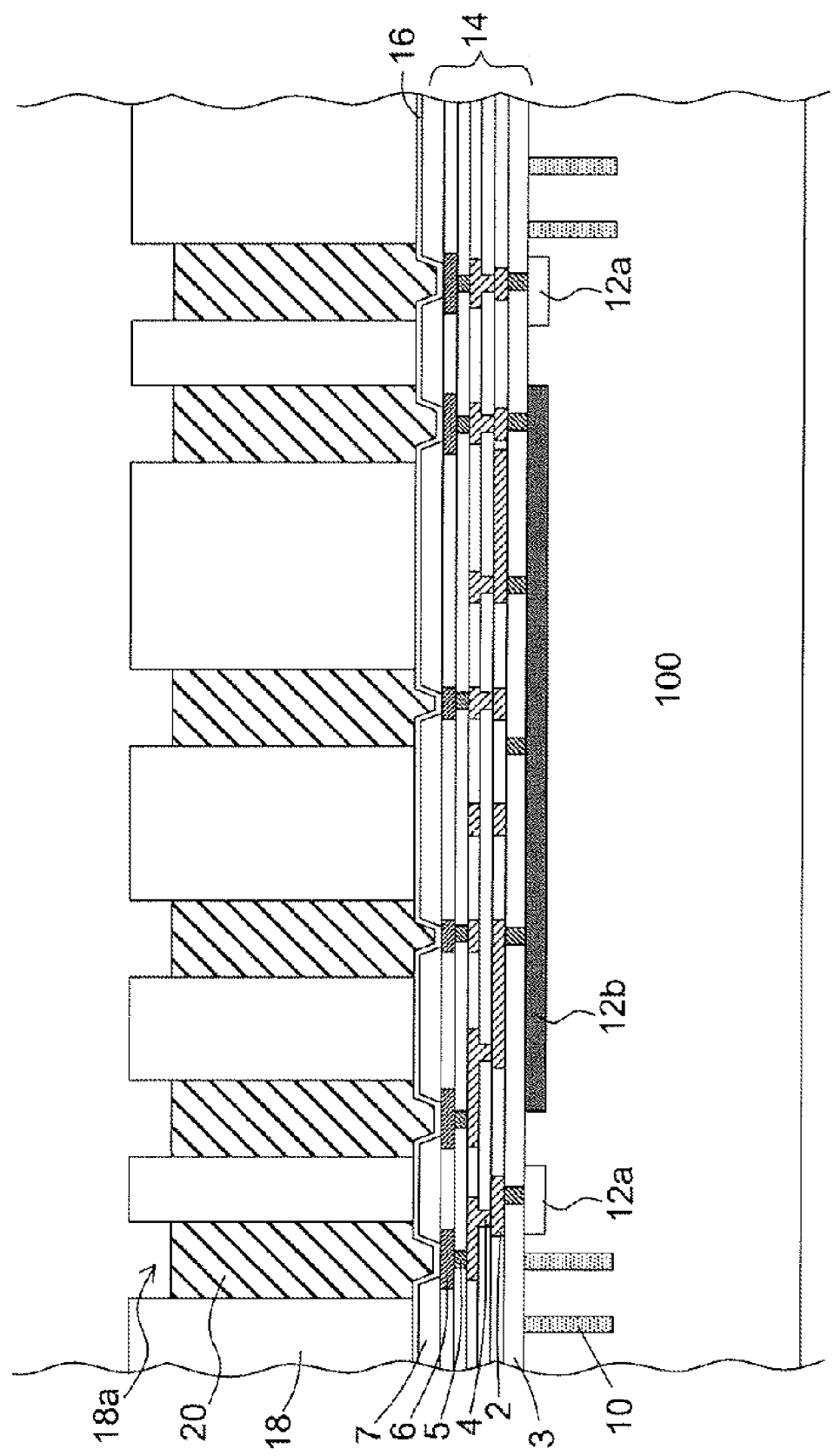
Figure 1K:
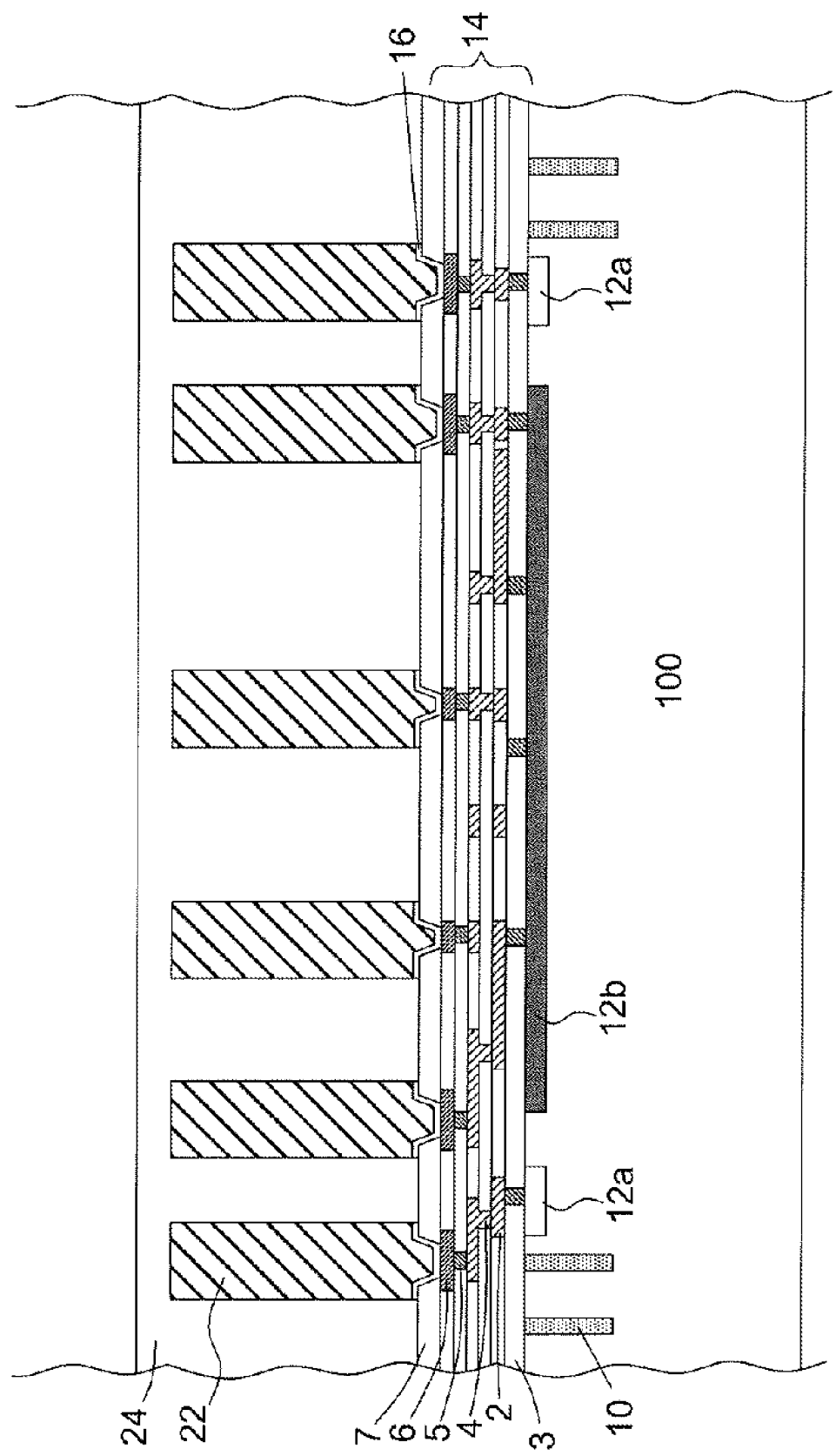
Figures 1, 1L, 2:
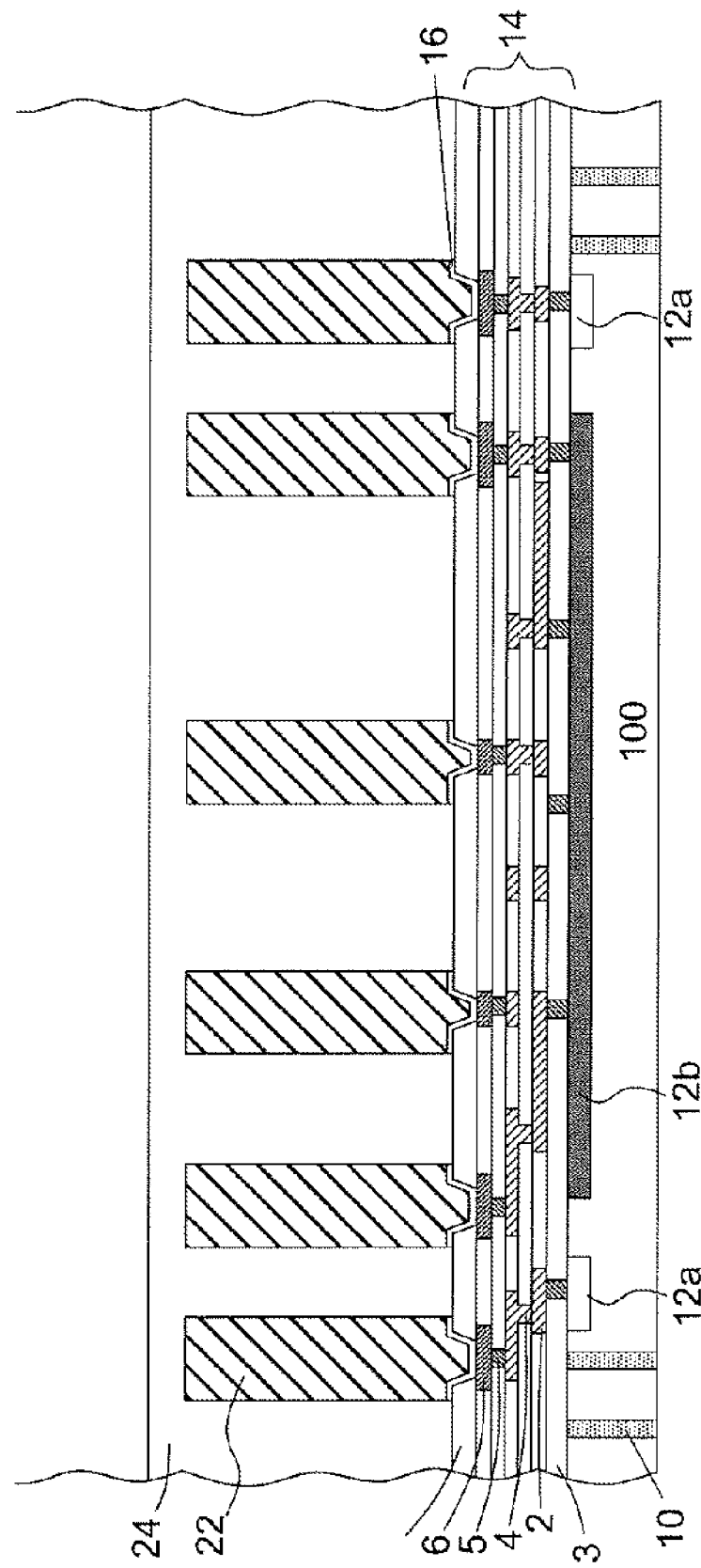
FIGS. 2A-2L are cross-sectional views and a process showing a embodiment 2 of a process of forming a semiconductor chip, in accordance with the present disclosure.
Figure 1M:
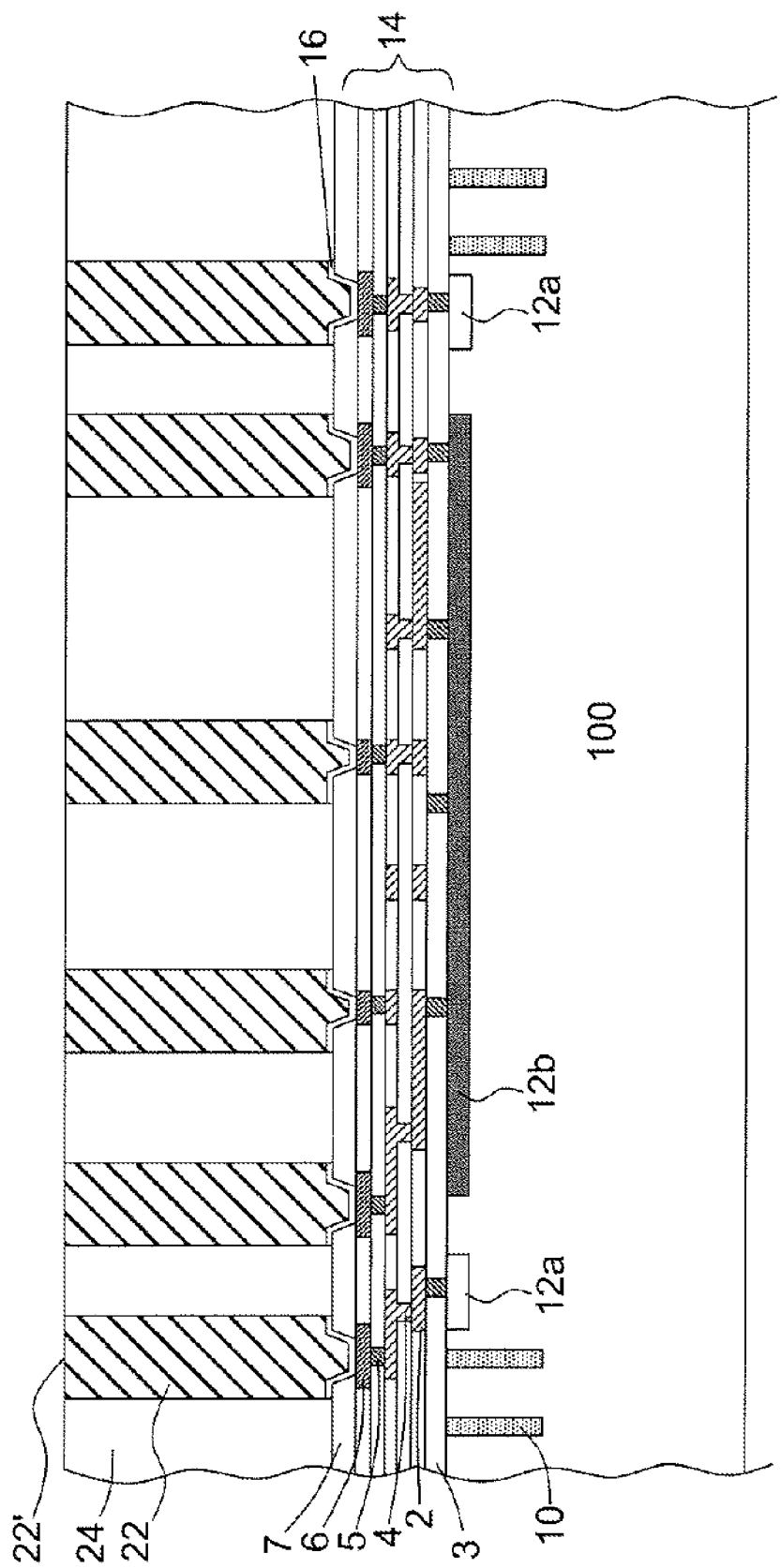
Figure 1N:
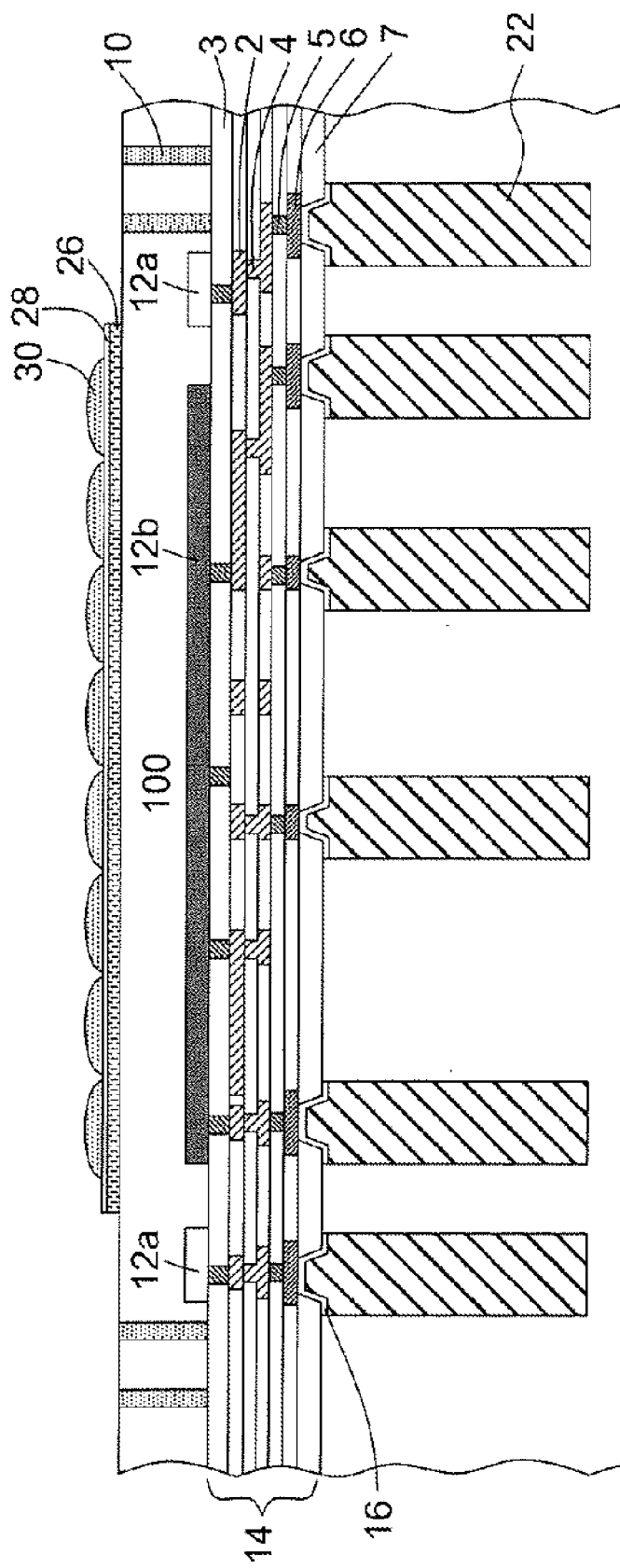
Figure 10:
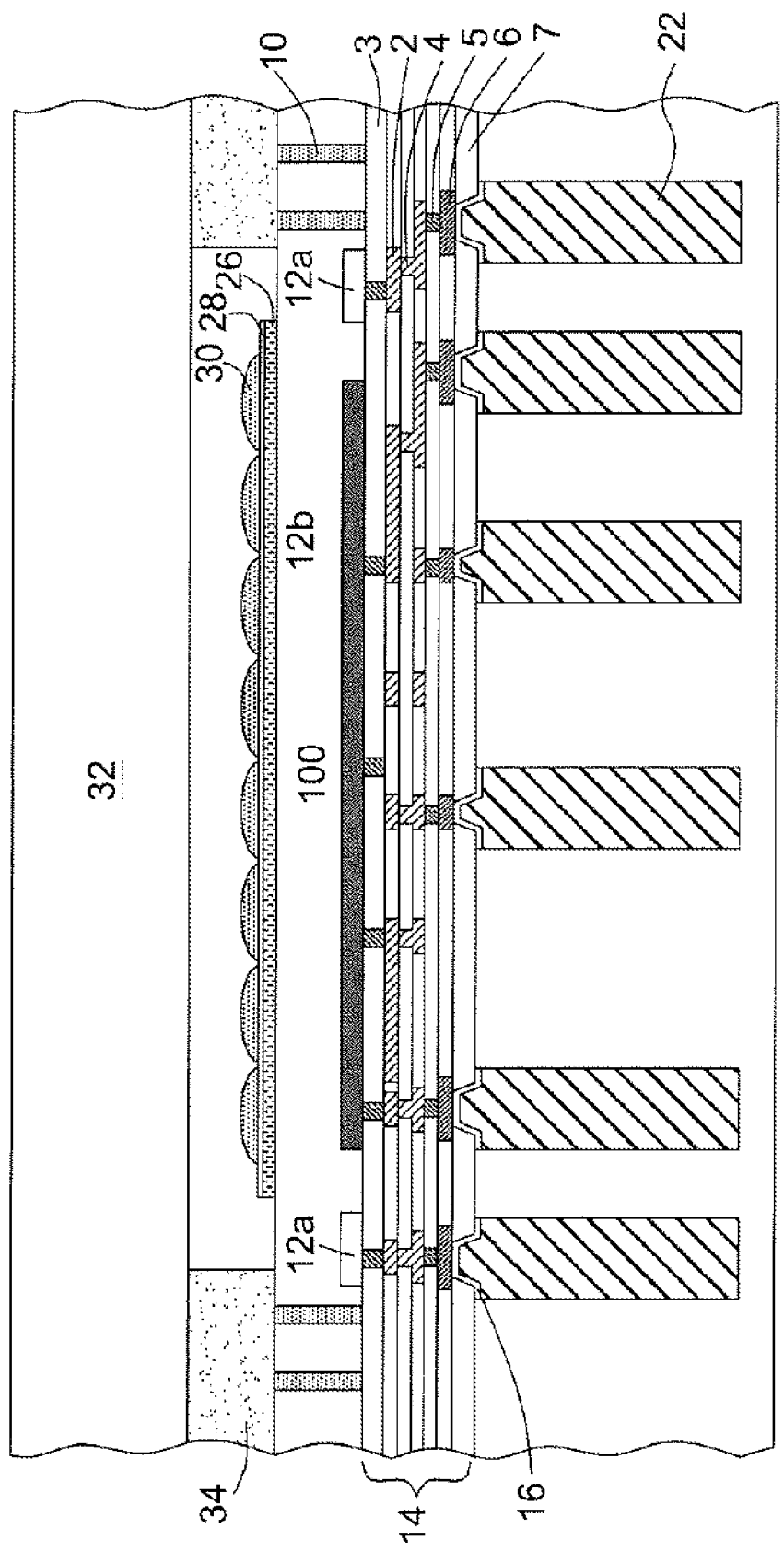
Figures 1, 10:
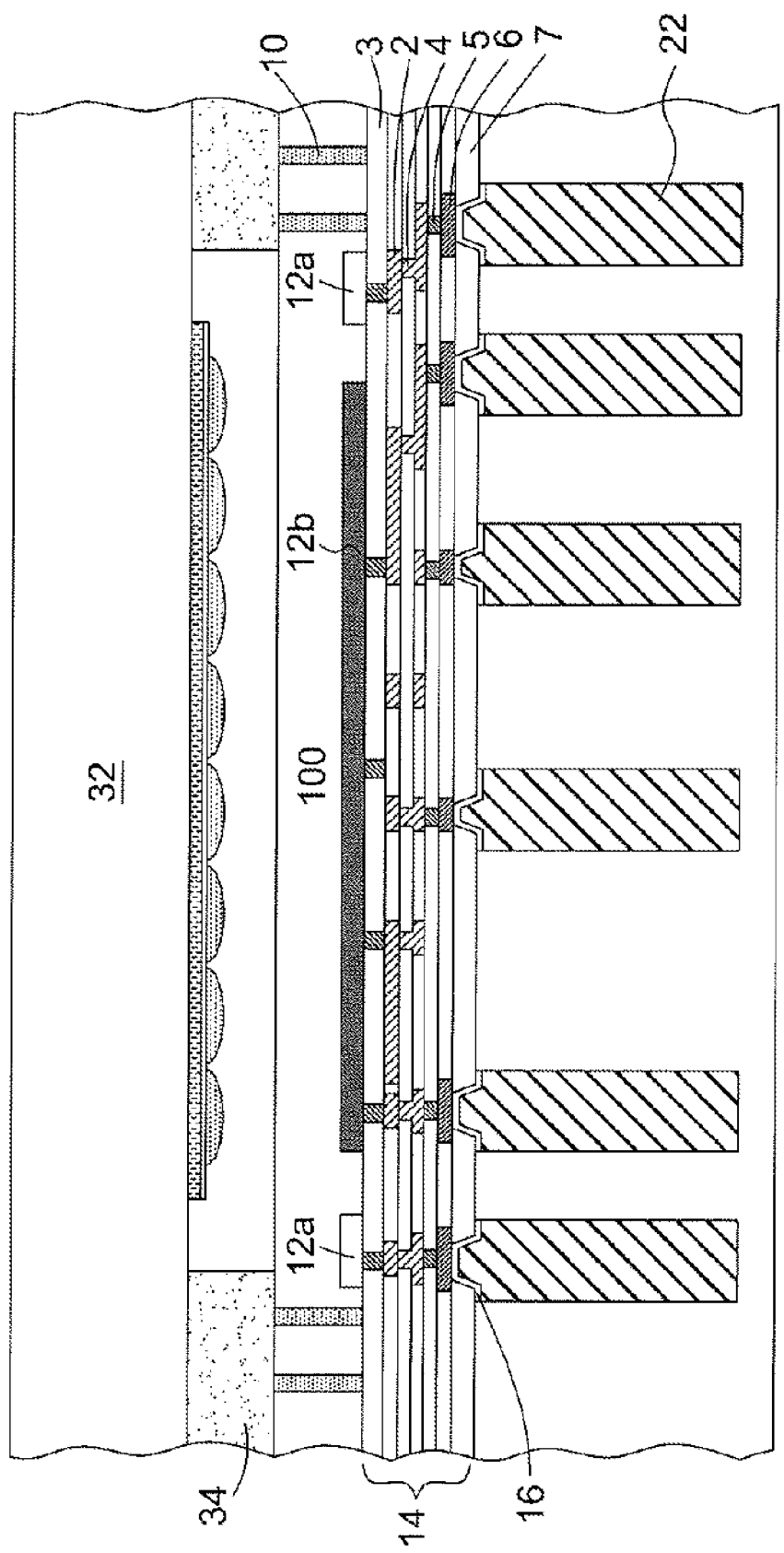
Figure 1P:
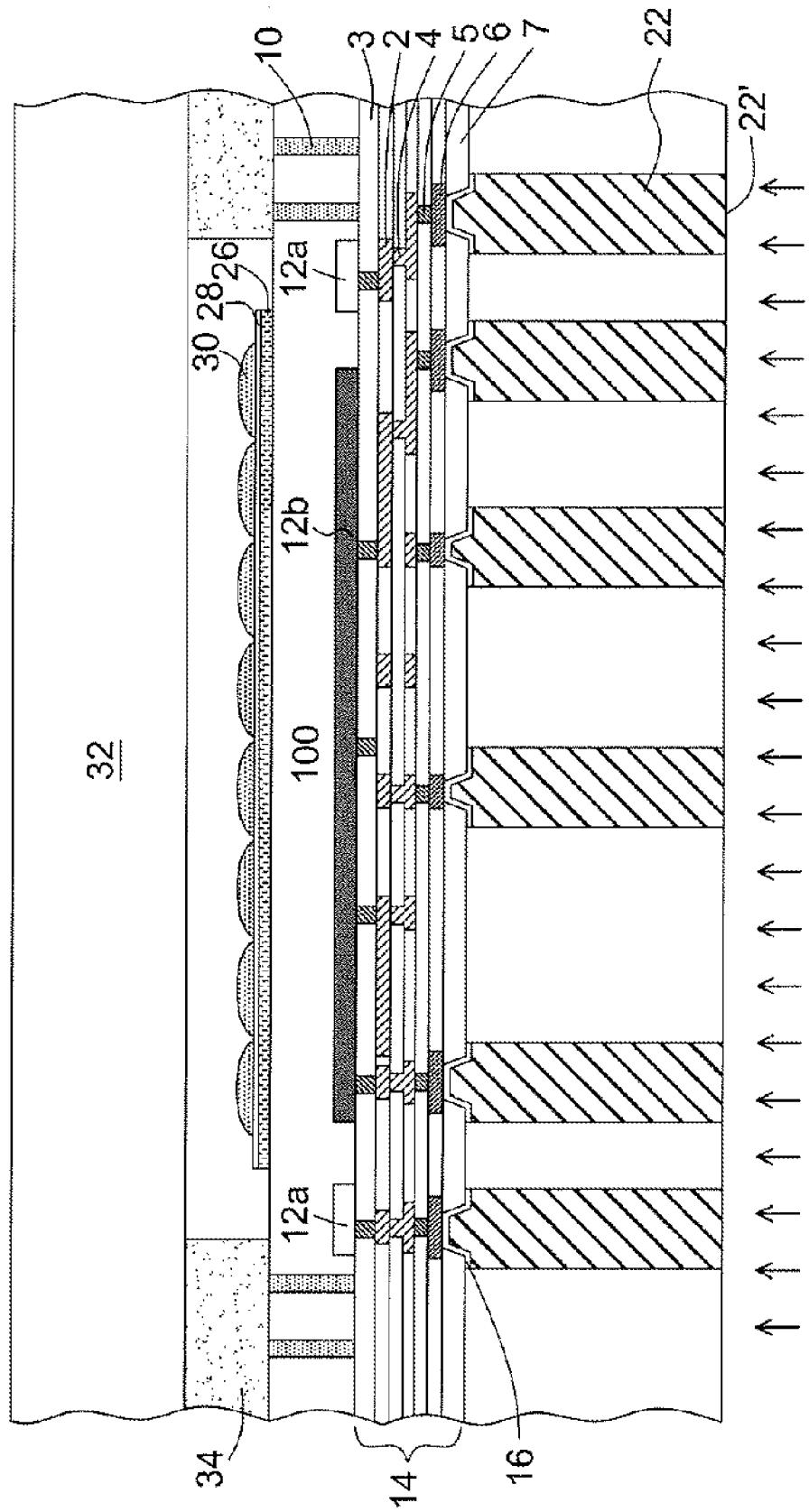
Figures 1, 1P:
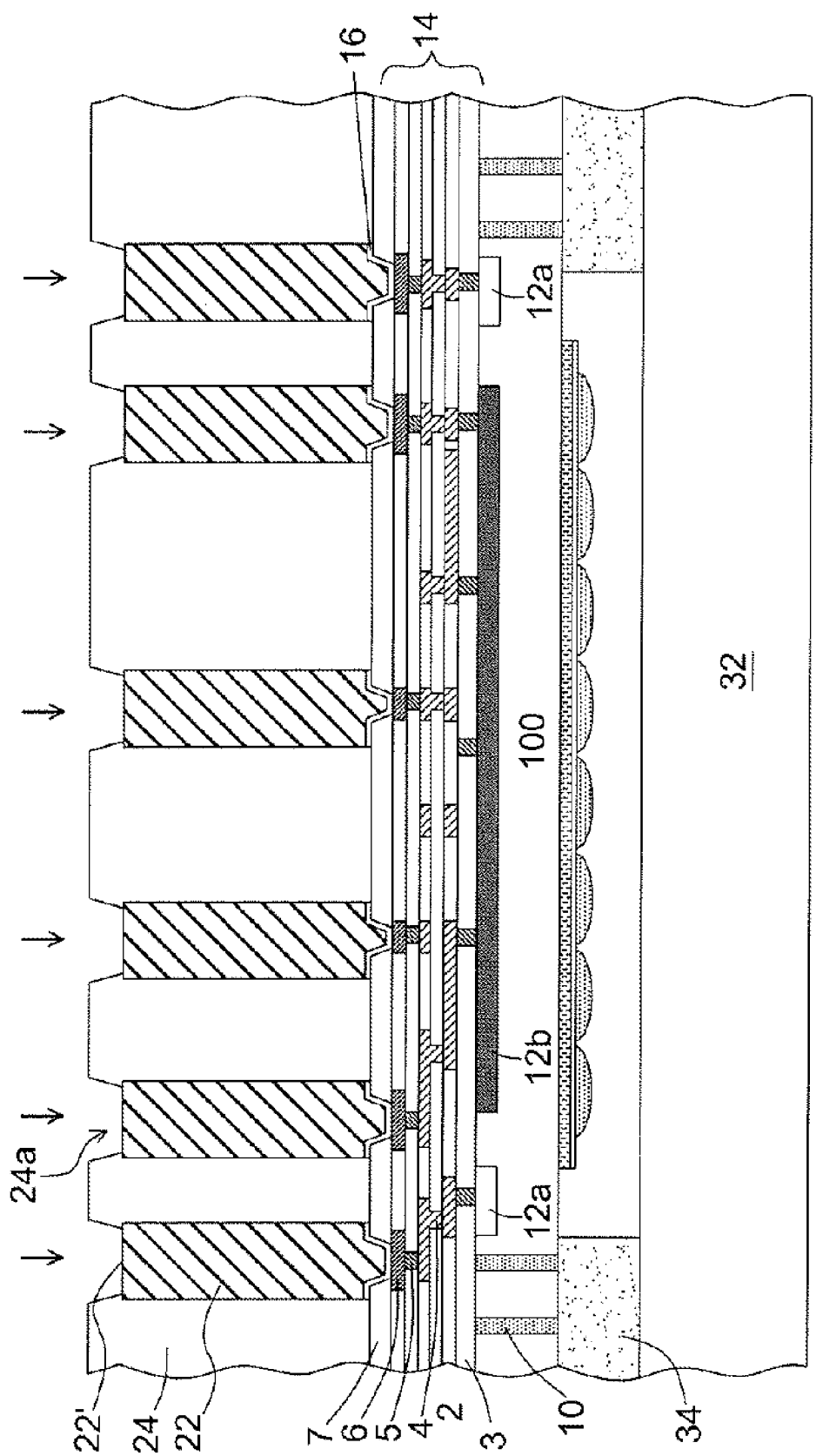
Figure 1Q:
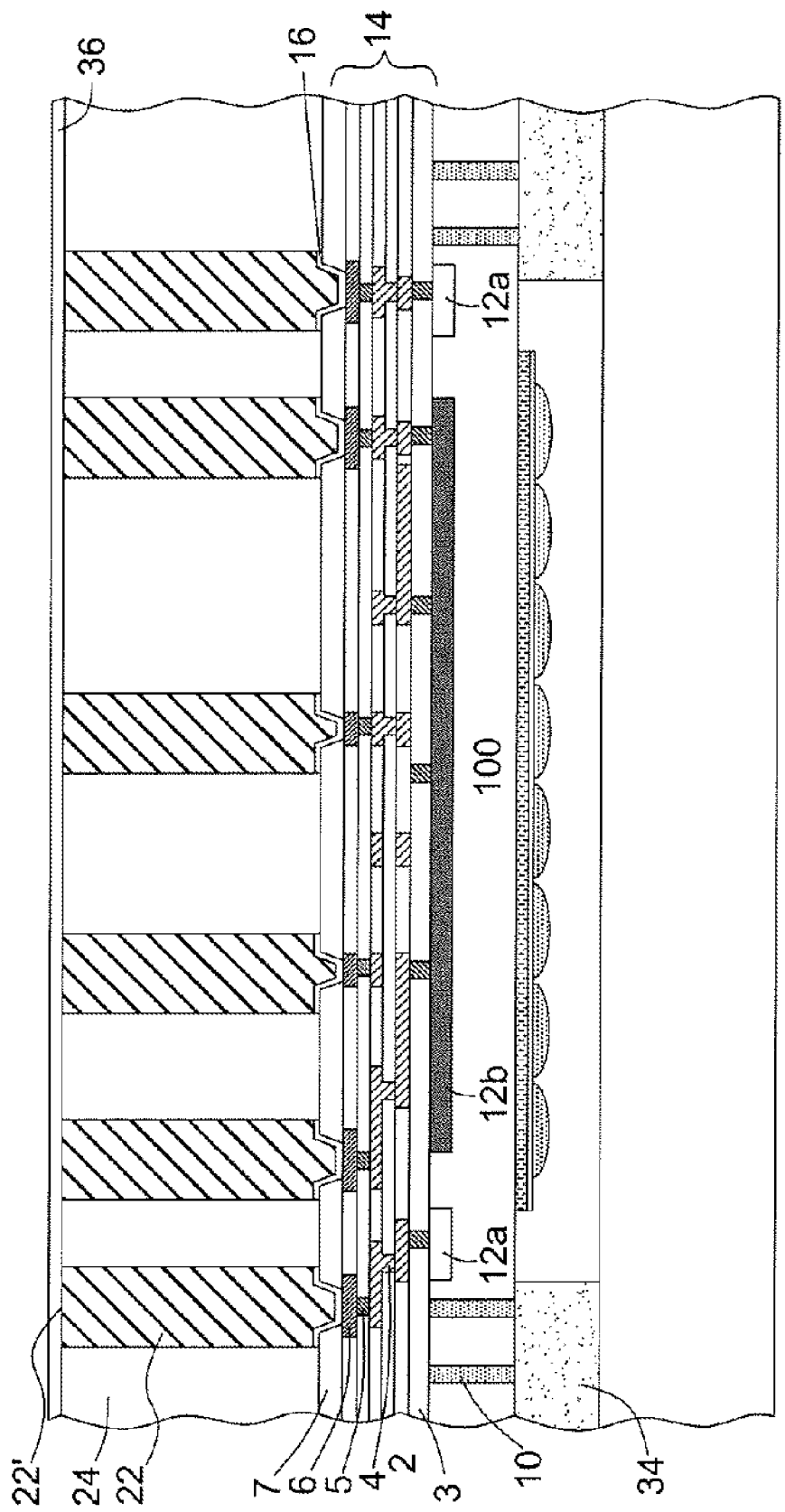
Figure 1R:
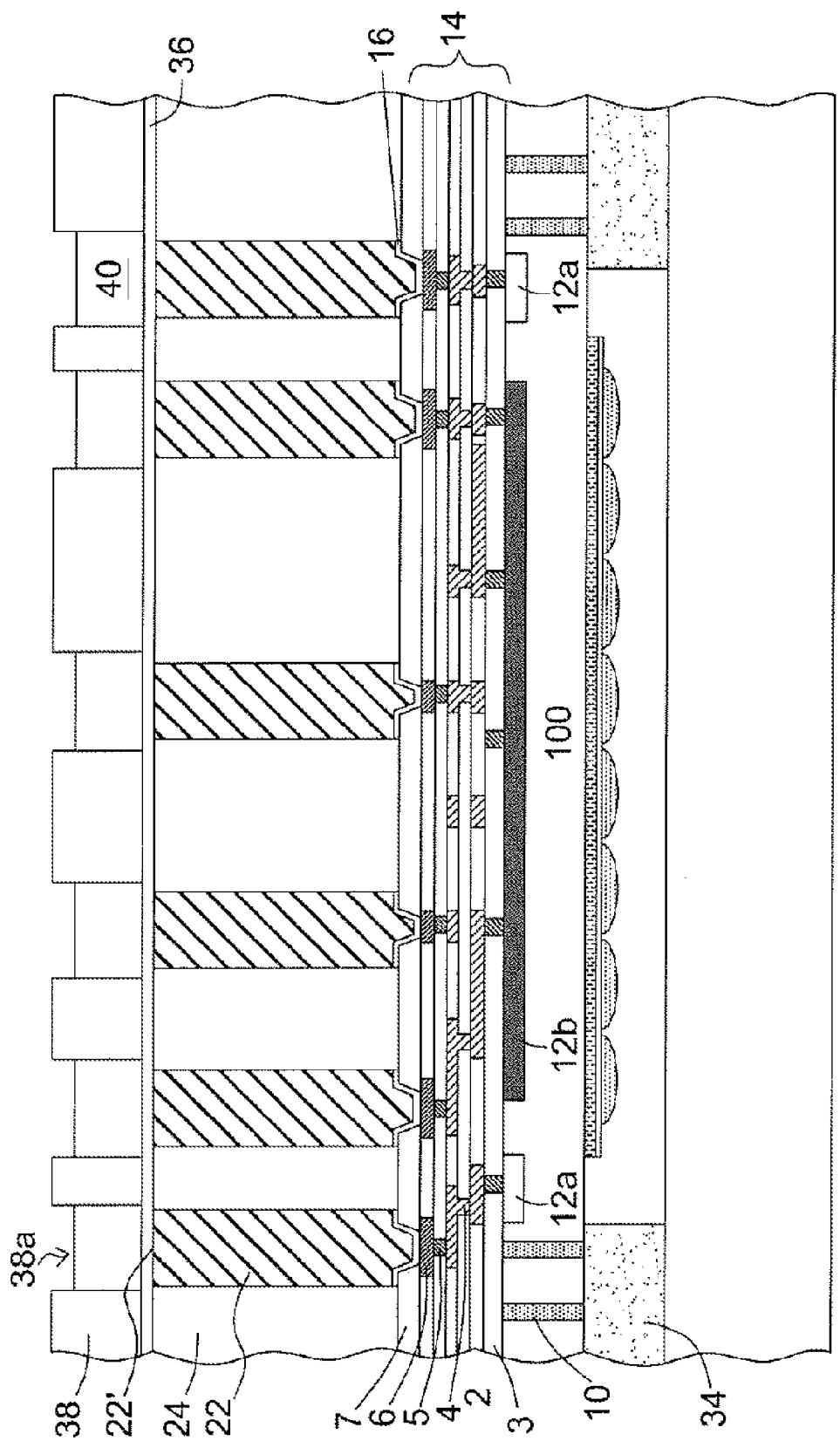
Figure 1S:
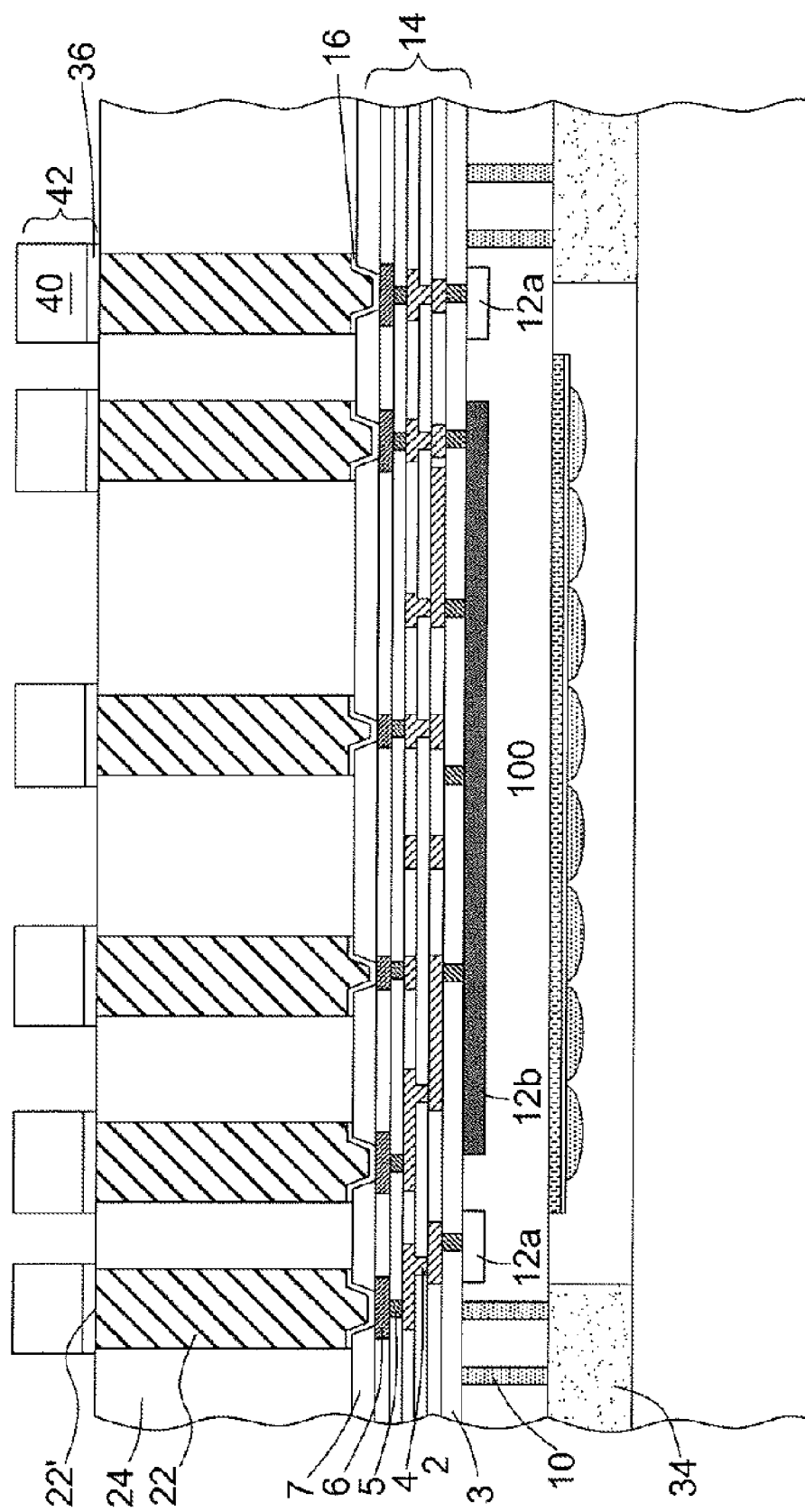
Figure 1T:
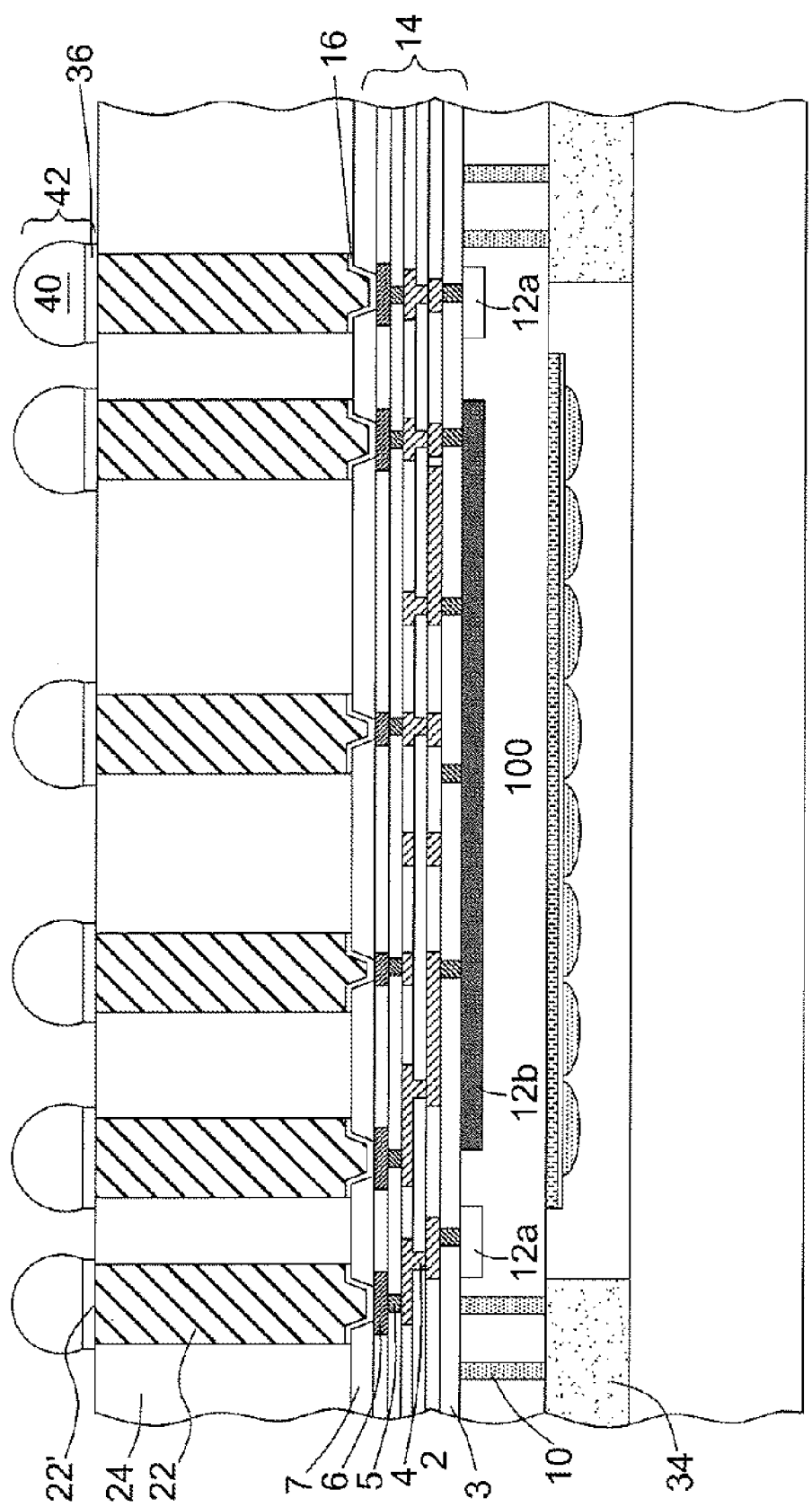
Figures 1, 1T, 2:
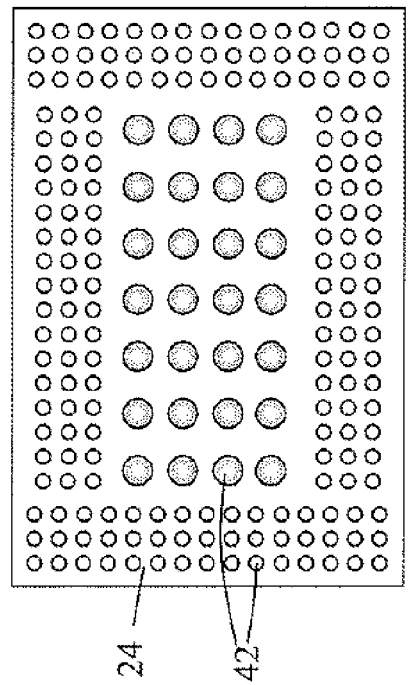
Figures 1, 1T:
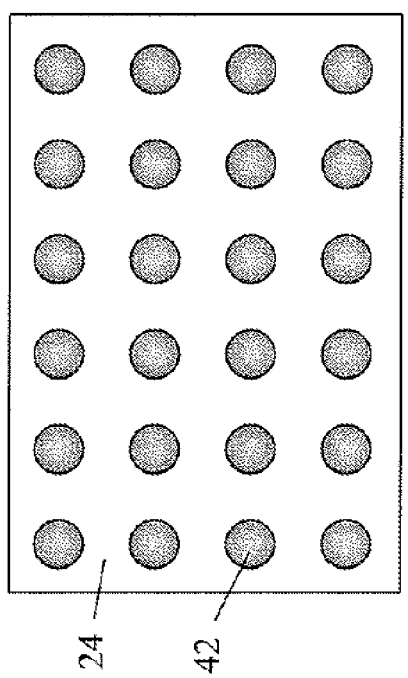
Figure 1U:
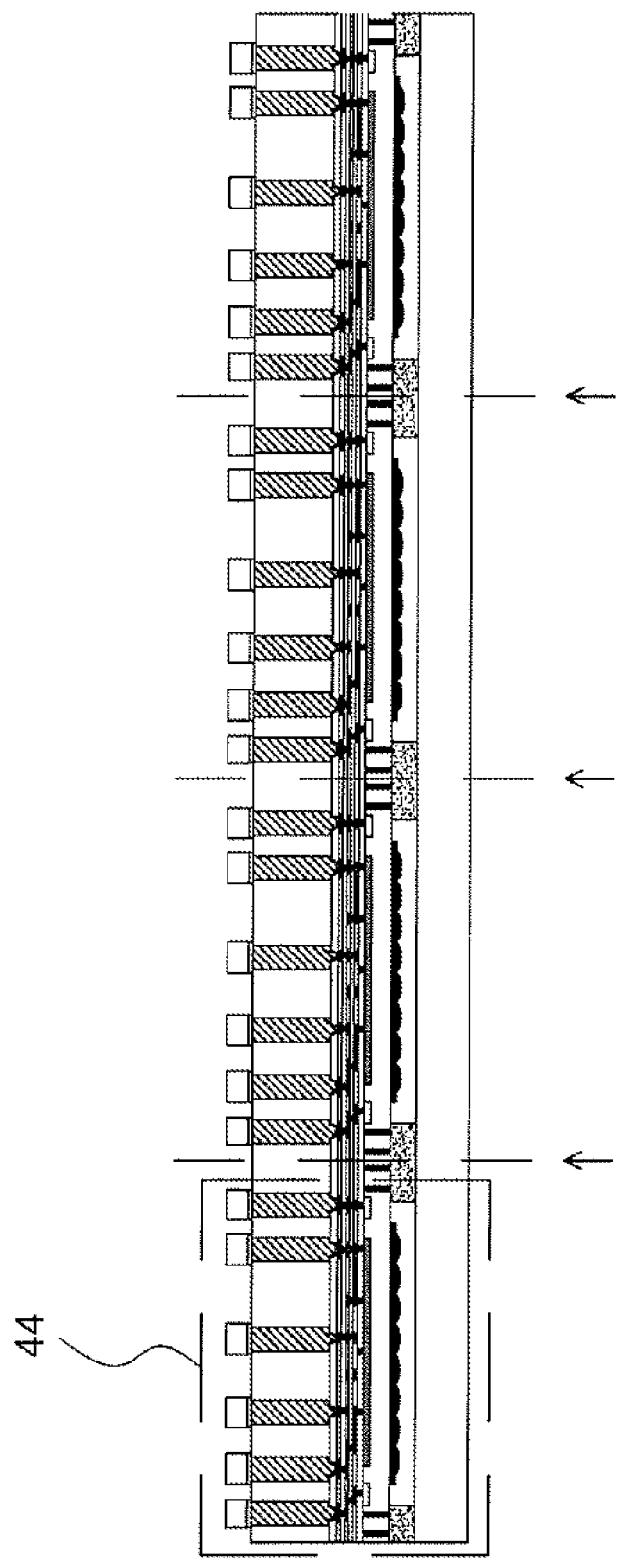
Figure 1V:
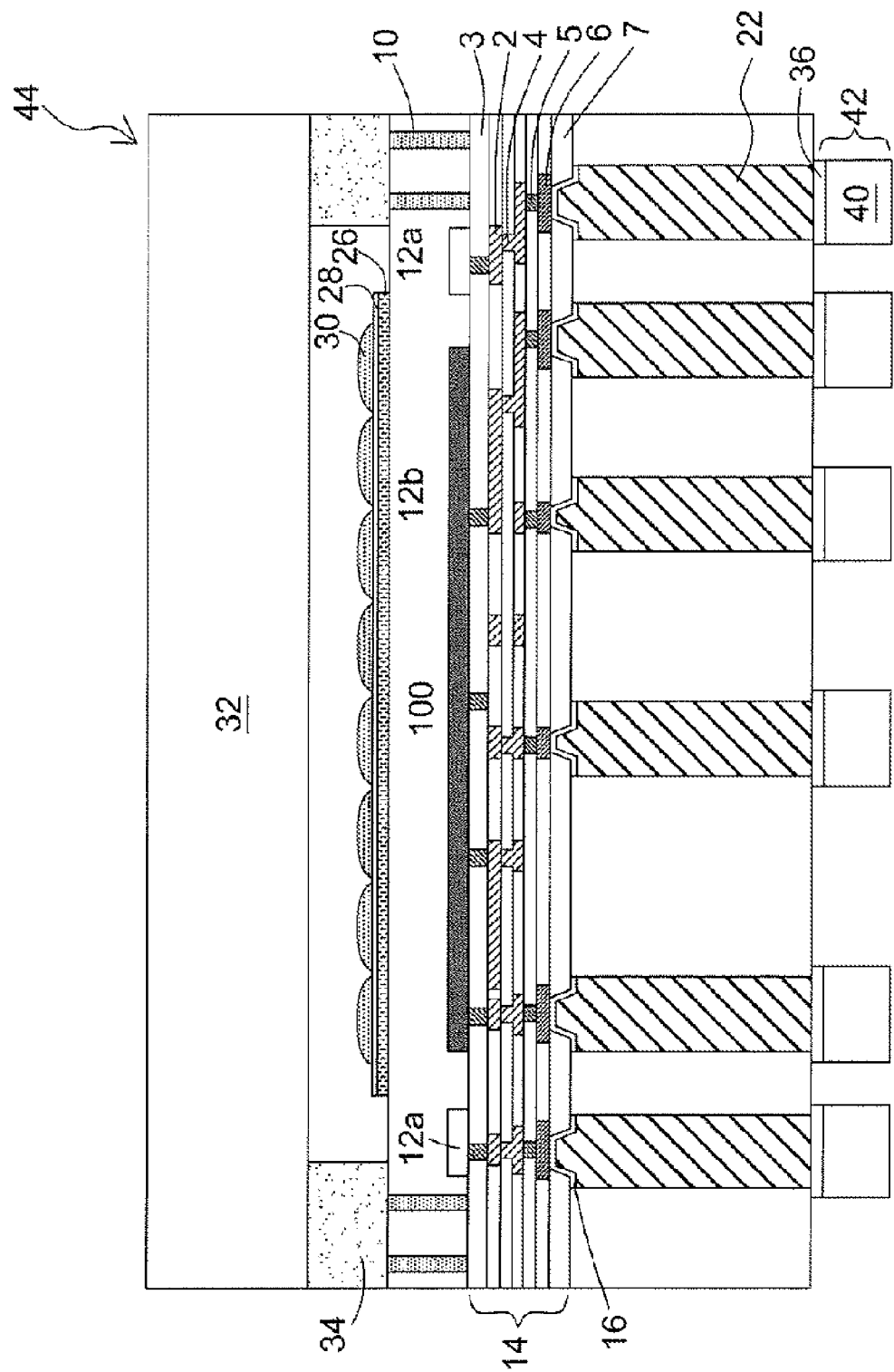
Figure 1W:
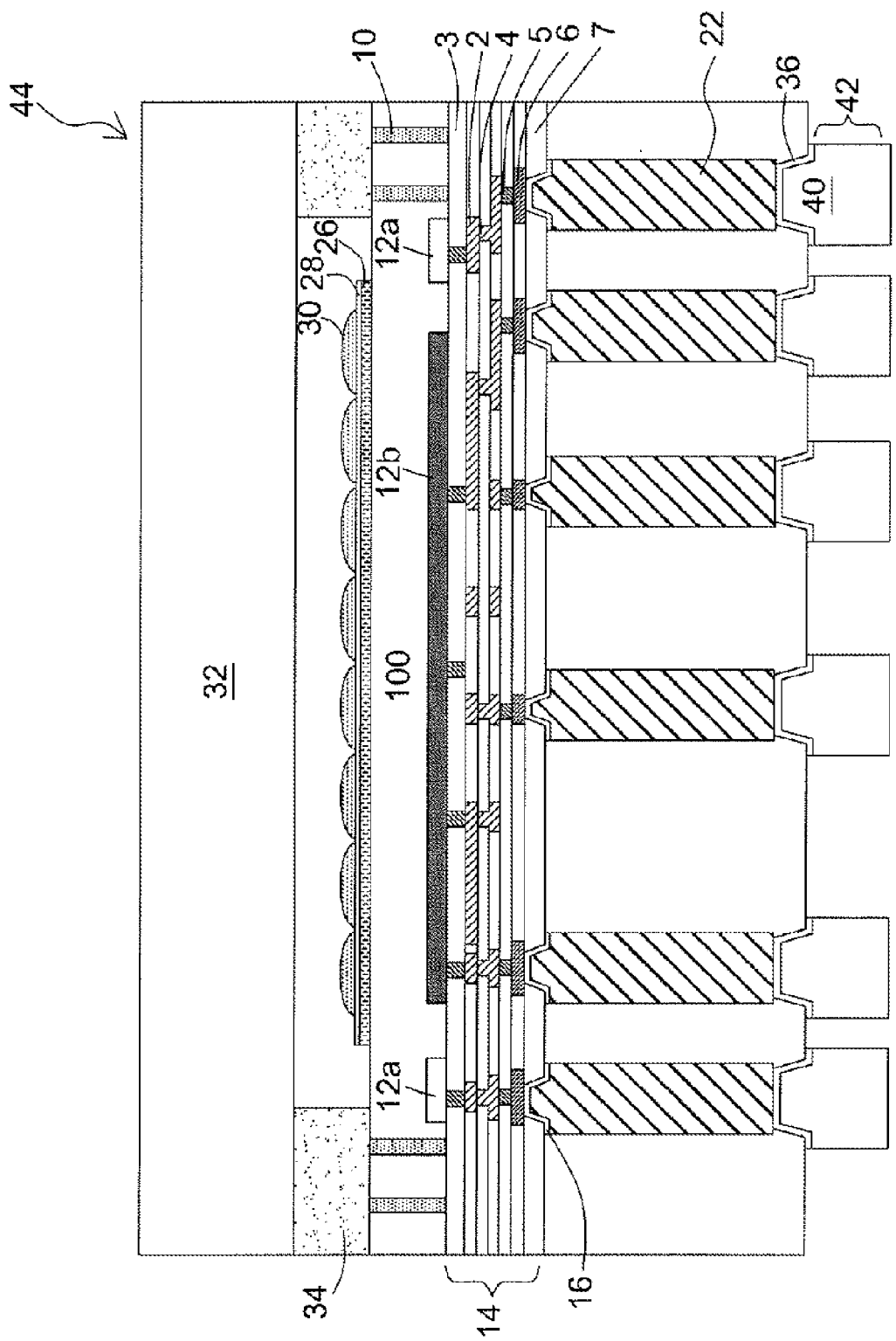
Figure 1X:
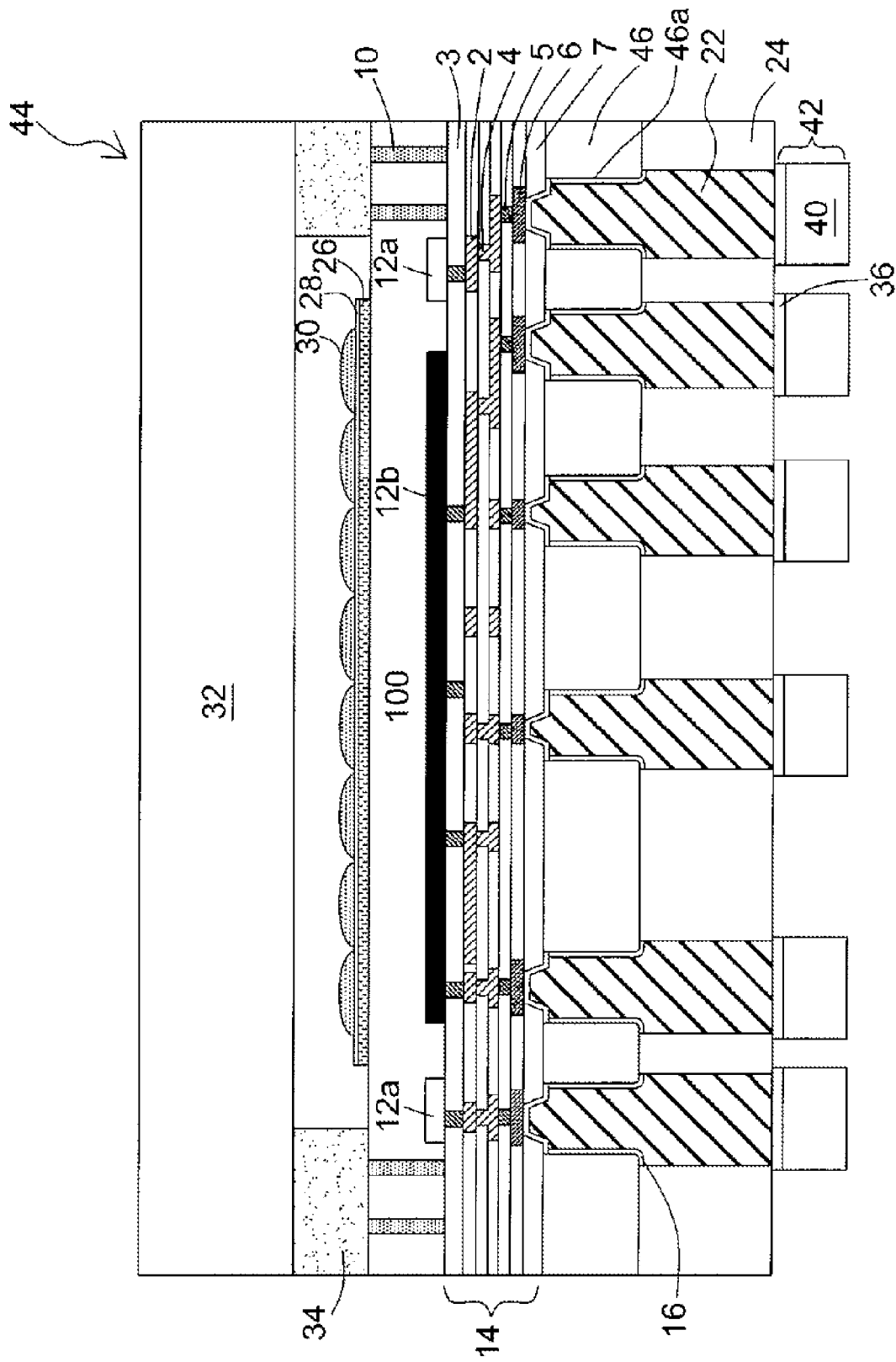
Figure 1Y:
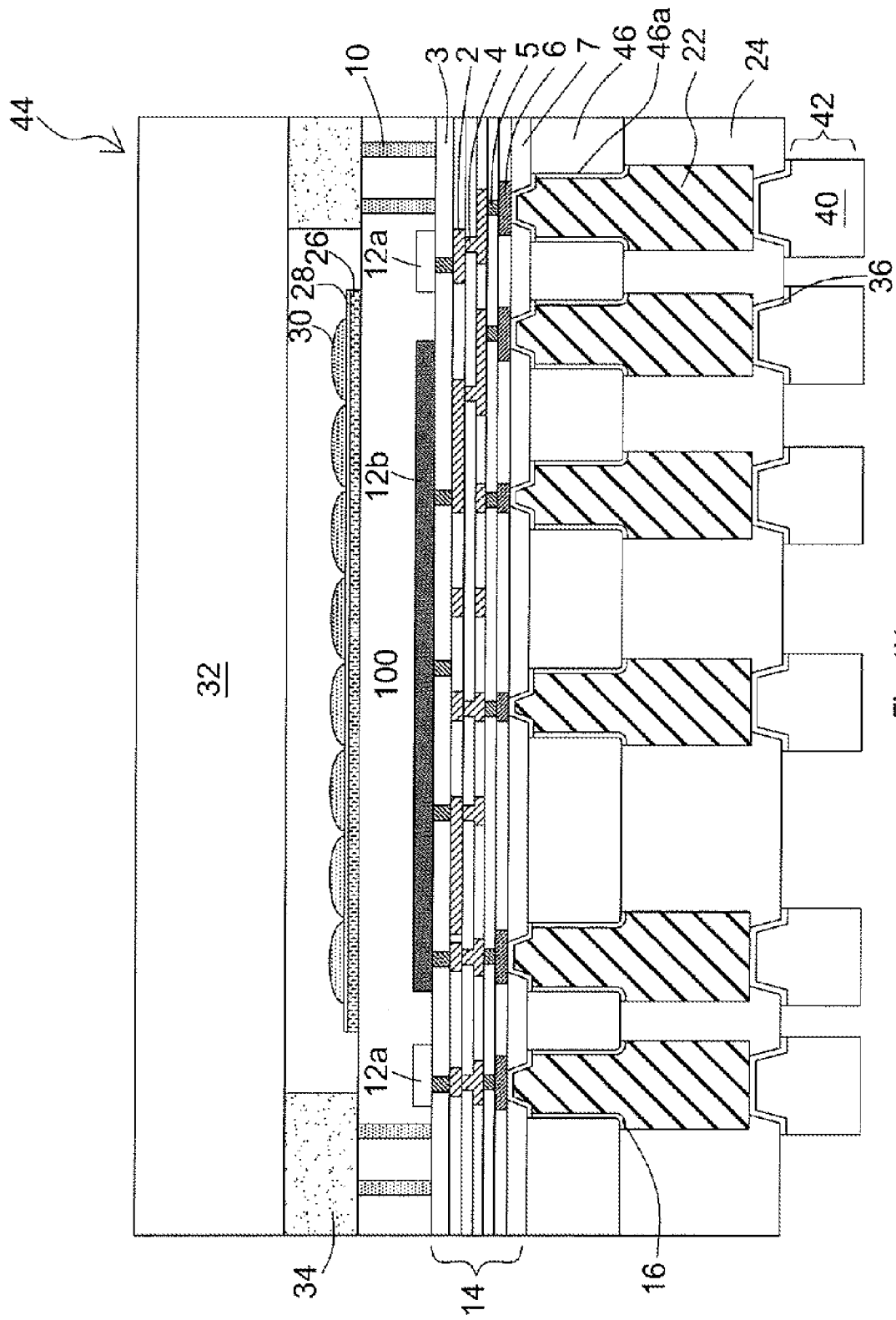

FIGS. 1A-1Y illustrate a first exemplary embodiment 1 of the present disclosure.

FIG. 1A depicts a substrate (or wafer) 100 made of a type of semiconductor. This substrate 100 can, for example, be silicon based, gallium arsenide (GaAs) based, silicon indium based (SiIn), silicon antimony based (SiSb), indium antimony based (InSb), or silicon germanium (SiGe) based. The afore-listed types of semiconductor materials/alloys are exemplary; accordingly, other types of semiconductor materials/alloys may be used in lieu of, or in combination with, the afore-listed types of semiconductor materials/alloys.

Referring to FIG. 1B, multiple etching stops 10 having a suitable thickness, e.g., between 0.01 micrometer and 10 micrometers, or between 0.05 micrometer and 3 micrometers, such as between 2 and 5 micrometers, can be formed in the substrate 100 exposed by the openings 100a. In FIG. 1L, FIG. 1L-1 and FIG. 1L-2, the thickness of etching stops 10 can be used to control a grinding thickness of silicon substrate 100.

Referring to FIG. 1C, the etching stops 10 may include a first layer 10a and a second layer 10b at a bottom surface and sidewalls of the first layer 10a. For example, if the first layer 10a includes a layer of silicon oxide or polysilicon having a thickness between, e.g., 0.5 and 5 micrometers, or between 1 and 10 micrometers, the second layer 10b may include a nitride layer, such as silicon nitride or silicon oxynitride, having a thickness, e.g., between 0.05 and 2 micrometers, or between 1 and 5 micrometers, at a bottom surface and sidewalls of the layer of silicon oxide or polysilicon. In this example, the nitride layer 10b and the layer 10a of silicon oxide or polysilicon can be formed by a chemical vapor deposition (CVD) process. Alternatively, if the first layer 10a includes a metal layer of copper, gold or aluminum having a thickness, e.g., between 1.5 and 5 micrometers, or between 1 and 10 micrometers, the second layer 10b may include a nitride layer, such as silicon nitride or silicon oxynitride, having a thickness, e.g., between 0.05 and 2 micrometers, or between 1 and 5 micrometers, at a bottom surface and sidewalls of the metal layer of copper, gold or aluminum. In this example, the metal layer 10a of copper, gold or aluminum can be formed by a process including electroplating, electroless plating or sputtering, and the nitride layer 10b can be formed by a chemical vapor deposition (CVD) process.

Referring to FIG. 1D, multiple semiconductor devices 12a and multiple light sensors 12b may be formed in and/or on the substrate 100. The light sensors 12b may include multiple transistors each having two diffusions (or areas with different doping characteristics) in the substrate 100. Each of the semiconductor devices 12a can be a diode or a transistor, such as p-channel metal-oxide-semiconductor (MOS) transistor or n-channel metal-oxide-semiconductor transistor, which is connected to the interconnection layers 4. The semiconductor devices 2 can, for example, be provided for NOR gates, NAND gates, AND gates, OR gates, flash memory cells, static random access memory (SRAM) cells, dynamic random access memory (DRAM) cells, non-volatile memory cells, erasable programmable read-only memory (EPROM) cells, read-only memory (ROM) cells, magnetic random access memory (MRAM) cells, sense amplifiers, inverters, operational amplifiers, adders, multiplexers, diplexers, multipliers, analog-to-digital (A/D) converters, digital-to-analog (D/A) converters or analog circuits. The light sensors 12b can include, e.g., complementary-metal-oxide-semiconductor (CMOS) sensors or charge coupled devices (CCD), which can include the semiconductor devices 12a, such as sense amplifiers, flash memory cells, static random access memory (SRAM) cells, dynamic random access memory (DRAM) cells, non-volatile memory cells, erasable programmable read-only memory (EPROM) cells, read-only memory (ROM) cells, magnetic random access memory (MRAM) cells, inverters, operational amplifiers, multiplexers, adders, diplexers, multipliers, analog-to-digital (A/D) converters, or digital-to-analog (D/A) converters.

Referring to FIG. 1E, a fine-line metallization structure 14 and a passivation layer 7 may be formed on the substrate 100 and over the multiple semiconductor devices 12a and multiple light sensors 12b. The fine-line metallization structure 14 may include multiple interconnection layers 2 over the top surface of the substrate 100, multiple dielectric layers 3 over the top surface of the substrate 100, multiple via plugs 4 and 5 in the dielectric layers 3, and multiple metal traces or pads 6 over the top surface of the substrate 100 and over the interconnection layers 2. The passivation layer 7 may be over the fine-line metallization structure 14, over the substrate 100, and over the multiple semiconductor devices 12a and multiple light sensors 12b.

The interconnection layers 2 can be connected to the semiconductor devices 12a and the light sensors 12b. Each of the interconnection layers 2 can have a suitable thickness, e.g., between 20 nanometers and 1.5 micrometers, such as between 100 nanometers and 1 micrometer. Each of the interconnection layers 2 may include a metal trace having a suitable width, e.g., smaller than 1 micrometer, such as between 0.05 and 0.95 micrometers. The material of the interconnection layers 2 may include electroplated copper, aluminum, aluminum-copper alloy, carbon nanotubes or a composite of the above-mentioned materials.

For example, each of the interconnection layers 2 may include an electroplated copper layer having a suitable thickness, e.g., between 20 nanometers and 1.5 micrometers, such as between 100 nanometers and 1 micrometer, in one of the dielectric layers 5, an adhesion/barrier layer, such as titanium-nitride layer, titanium-tungsten-alloy layer, tantalum-nitride layer, titanium layer or tantalum layer, at a bottom surface and sidewalls of the electroplated copper layer, and a seed layer of copper between the electroplated copper layer and the adhesion/barrier layer. The seed layer of copper may be at the bottom surface and sidewalls of the electroplated copper layer and may contact with the bottom surface and sidewalls of the electroplated copper layer. The electroplated copper layer, the seed layer of copper, and the adhesion/barrier layer can be formed by a damascene or double-damascene process including a damascene copper electroplating process, a sputtering process and a chemical mechanical polishing (CMP) process. For example, in one embodiment a layer formed by a damascene process, a double-damascene process, a damascene copper electroplating process, or other damascene processes, may be referred to as a damascene metal layer. Other suitable processes may be used to form such layers.

Alternatively, each of the interconnection layers 2 may include an adhesion/barrier layer on a top surface of one of the dielectric layers 3, a sputtered aluminum or aluminum-copper-alloy layer having a suitable thickness, e.g., between 20 nanometers and 1.5 micrometers, such as between 100 nanometers and 1 micrometer, on a top surface of the adhesion/barrier layer, and an anti-reflection layer on a top surface of the sputtered aluminum or aluminum-copper-alloy layer. The sputtered aluminum or aluminum-copper-alloy layer, the adhesion/barrier layer and the anti-reflection layer can be formed by a process including a sputtering process and an etching process. In some embodiments, sidewalls of the sputtered aluminum or aluminum-copper-alloy layer are not covered by the adhesion/barrier layer and the anti-reflection layer. In exemplary embodiments, the adhesion/barrier layer and the anti-reflection layer can be a titanium layer, a titanium-nitride layer or a titanium-tungsten layer.

The via plugs 4 can be in the bottommost dielectric layer 3 between the bottommost interconnection layer 2 and the substrate 100, and may connect the interconnection layers 2 to the semiconductor devices 12a and the light sensors 12b. In exemplary embodiments, the via plugs 4 may include copper formed by an electroplating process or tungsten formed by a process including a chemical vapor deposition (CVD) process and a chemical mechanical polishing (CMP) process. Of course, other materials may be substituted or used in addition to copper or tungsten.

The via plugs 5 can be in the dielectric layer 3 that has a top surface having the metal traces or pads 6 formed thereon, and the via plugs 5 can connect the metal traces or pads 6 to the interconnection layers 2. In exemplary embodiments, the via plugs 5 may include copper formed by an electroplating process or tungsten formed by a process including a chemical vapor deposition (CVD) process and a chemical mechanical polishing (CMP) process or by a process including a sputtering process and a chemical mechanical polishing (CMP) process. Of course, other materials may be substituted or used in addition to copper or tungsten.

The metal traces or pads 6 can be connected to the semiconductor devices 12a and the light sensors 12b through the interconnection layers 2 and the via plugs 4 and 5. Each of the metal traces or pads 6 can have a suitable thickness, e.g., between 0.5 and 3 micrometers, or between 20 nanometers and 1.5 micrometers, and a width smaller than 1 micrometer, such as between 0.2 and 0.95 micrometers.

For example, each of the metal traces or pads 6 may include an electroplated copper layer having a suitable thickness, e.g., between 0.5 and 3 micrometers, or between 20 nanometers and 1.5 micrometers, in the topmost dielectric layer 5 under the passivation layer 7, an adhesion/barrier layer, such as titanium layer, titanium-tungsten-alloy layer, titanium-nitride layer, tantalum-nitride layer or tantalum layer, at a bottom surface and sidewalls of the electroplated copper layer, and a seed layer of copper between the electroplated copper layer and the adhesion/barrier layer. The seed layer of copper is at the bottom surface and sidewalls of the electroplated copper layer and contacts with the bottom surface and sidewalls of the electroplated copper layer. The electroplated copper layer can have a top surface substantially coplanar with a top surface of the topmost dielectric layer 3 under the passivation layer 7, and the passivation layer 7 can be formed on the top surfaces of the electroplated copper layer and the topmost dielectric layer 3. The electroplated copper layer, the seed layer of copper and the adhesion/barrier layer can be formed by a damascene or double-damascene process including an electroplating process, a sputtering process and a chemical mechanical polishing (CMP) process or other suitable processes.

Alternatively, each of the metal traces or pads 6 may include an adhesion/barrier layer on a top surface of the topmost dielectric layer 3 under the passivation layer 7, a sputtered aluminum or aluminum-copper-alloy layer having a suitable thickness, e.g., between 0.5 and 3 micrometers, or between 20 nanometers and 1.5 micrometers, on a top surface of the adhesion/barrier layer, and an anti-reflection layer on a top surface of the sputtered aluminum or aluminum-copper-alloy layer. The sputtered aluminum or aluminum-copper-alloy layer, the adhesion/barrier layer and the anti-reflection layer can be formed by a process including a sputtering process and an etching process. Sidewalls of the sputtered aluminum or aluminum-copper-alloy layer are not covered by the adhesion/barrier layer and the anti-reflection layer. The adhesion/barrier layer and the anti-reflection layer can be, for example, a titanium layer, a titanium-nitride layer or a titanium-tungsten layer. Other materials may be used, in lieu of, or in combination with, the afore-listed materials. The passivation layer 7 can be formed on a top surface of the anti-reflection layer and on the top surface of the topmost dielectric layer 3.

The passivation layer 7 can protect the semiconductor devices 12a, the light sensors 12b, the via plugs 4 and 5, the interconnection layers 2 and the metal traces or pads 6 from being damaged by moisture and foreign ion contamination. For example, mobile ions (such as sodium ions), transition metals (such as gold, silver and copper) and impurities can be prevented from penetrating through the passivation layer 7 to the semiconductor devices 12a, the light sensors 12b, the via plugs 4 and 5, the interconnection layers 2 and the metal traces or pads 6.

The passivation layer 7 can be formed by a chemical vapor deposition (CVD) method, or other suitable technique(s), to a desired thickness, e.g., greater than 0.2 micrometers, such as between 0.3 and 1.5 micrometers. For exemplary embodiments, the passivation layer 7 can be made of silicon oxide (such as $SiO_2$), silicon nitride (such as $Si_3N_4$), silicon oxynitride (such as SiON), silicon oxycarbide (SiOC), phosphosilicate glass (PSG), silicon carbon nitride (such as SiCN) or a composite of the above-mentioned materials, though other suitable materials may be used in lieu of, or in combination with, the afore-listed materials.

The passivation layer 7 can be composed of one or more inorganic layers. For example, the passivation layer 7 can be a composite layer of an oxide layer, such as silicon oxide or silicon oxycarbide (SiOC), having a suitable thickness, e.g., between 0.2 and 1.2 micrometers, and a nitride layer, such as silicon nitride, silicon oxynitride or silicon carbon nitride (SiCN), having a thickness, e.g., between 0.2 and 1.2 micrometers, on the oxide layer. Alternatively, the passivation layer 7 can be a single layer of silicon nitride, silicon oxynitride or silicon carbon nitride (SiCN) having a thickness, e.g., between 0.2 and 1.2 micrometers. For example, the passivation layer 6 may include a topmost inorganic layer of the semiconductor wafer 100, and the topmost inorganic layer of the semiconductor wafer 100 can be a silicon nitride layer having a suitable thickness, e.g., greater than 0.2 micrometers, such as between 0.2 and 1.5 micrometers. Other thicknesses for these identified layers may be used within the scope of the present disclosure.

Referring to FIG. 1F, multiple openings 7a in passivation layer 7 may be formed to expose part(s) of the metal trace(s) or pad(s) 6 underneath. The opening 7a of the passivation layer 7 can be in any desired and practical shape, e.g., the shape of a circle, square, rectangle, or polygon, such as a polygon with more than five edges; different shapes can have different opening dimensions and characteristics. For example, a circular opening has dimensions defined by its diameter, a square opening has dimensions defined by its side length, and a polygon with more than five edges has dimensions defined by the longest diagonal. The shape of the openings 7a are not limited to regular shapes and irregular and/or composite shapes may be used for the passivation layer openings 7a.

The portions of the metal traces or pads 6 exposed by the passivation layer openings 7a in the passivation layer 7 define contact pads, e.g., contact pad or point 6', as shown. On contact pads 6', there can be an optional metal cap (not shown) to protect a contact pad 6' from being damaged by oxidation. Such metal caps can include, for example, an aluminum-copper alloy, a gold layer, a titanium tungsten alloy layer, a tantalum layer, a tantalum nitride layer, or a nickel layer, though other suitable cap materials can be used. For example, when contact pads 6' are copper pads, a metal cap may be included, such as an aluminum-copper alloy, to protect the copper pad exposed by the passivation layer openings 7a from oxidation, which could otherwise damage the copper pad. Also, when the metal cap is an aluminum-copper alloy, a barrier layer can be formed between the copper pad and aluminum-copper alloy. This barrier layer can include a suitable metal such as titanium, titanium tungsten alloy, titanium nitride, tantalum, tantalum nitride, chromium, or nickel. The afore-listed metals are exemplary; other suitable metals can be used. The following method is applicable for a situation where there is no metal cap, but a similar method can be used for the addition of a metal cap.

Referring to FIG. 1G, an adhesion/barrier layer 16 having a suitable thickness, e.g., between 1 nanometer and 0.8 micrometers, such as between 0.01 and 0.7 micrometers, can be formed on the contact pads 6' exposed by the openings 7a, on the passivation layer 7. The adhesion/barrier layer 16 can be formed by sputtering a titanium-containing layer, such as titanium-tungsten-alloy layer, titanium-nitride layer or titanium layer, having a suitable thickness, e.g., between 1 nanometer and 0.8 micrometers, such as between 0.01 and 0.7 micrometers, on the contact pads 6' exposed by the openings 7a, on the passivation layer 7. Alternatively, the adhesion/barrier layer 16 can be formed by sputtering a chromium-containing layer, such as chromium layer, having a thickness between, e.g., 1 nanometer and 0.8 micrometers, such as between 0.01 and 0.7 micrometers, on the contact pads 6' exposed by the openings 7a, on the passivation layer 7. Alternatively, the adhesion/barrier layer 16 can be formed by sputtering a tantalum-containing layer, such as tantalum layer or tantalum-nitride layer, having a suitable thickness, e.g., between 1 nanometer and 0.8 micrometers, such as between 0.01 and 0.7 micrometers, on the contact pads 6' exposed by the openings 7a, on the passivation layer 7. Alternatively, the adhesion/barrier layer 16 can be formed by sputtering a nickel layer having a thickness between 1 nanometer and 0.8 micrometers, such as between 0.01 and 0.7 micrometers, on the regions of the contact pads 6' exposed by the openings 7a, on the passivation layer 7.

After forming the adhesion/barrier layer 16, a seed layer (not shown) can be formed on the adhesion/barrier layer 16. The seed layer can have a desired thickness, e.g., between 0.01 and 2 micrometers, such as between 0.02 and 0.5 micrometers. The seed layer, for example, can be formed by sputtering a copper layer having a suitable thickness, for example, between 0.01 and 2 micrometers, such as between 0.02 and 0.5 micrometers, on the adhesion/barrier layer of any previously-described material. Alternatively, the seed layer can be formed by sputtering a gold layer having a suitable thickness, e.g., between 0.01 and 2 micrometers, such as between 0.02 and 0.5 micrometers, on the adhesion/barrier layer 16 of any previously-described material. Alternatively, the seed layer can be formed by sputtering a silver layer having a suitable thickness, for example, between 0.01 and 2 micrometers, such as between 0.02 and 0.5 micrometers, on the adhesion/barrier layer 16 of any previously-described material. Alternatively, the seed layer can be formed by sputtering an aluminum-containing layer, such as aluminum layer, aluminum-copper alloy layer or Al—Si—Cu alloy layer, having a suitable thickness, e.g., between 0.01 and 2 micrometers, or between 0.4 and 3 micrometers, on the adhesion/barrier layer 16 of any previously-described material. Alternatively, the seed layer can be formed by sputtering a titanium-copper alloy layer having a suitable thickness, for example, between 0.01 and 2 micrometers, such as between 0.02 and 0.5 micrometers, on the adhesion/barrier layer 16 of any previously-described material.

Referring to FIG. 1H, after forming the seed layer, a patterned photoresist layer 18 can be formed on the seed layer of any previously-described material. Multiple openings 18a can be formed in the patterned photoresist layer 18 to expose multiple regions of the seed layer of any previously-described material.

Next, referring to FIG. 1I, a metal layer 20 can be formed on the regions of the seed layer of any previously-described material. The metal layer 20 may have a suitable thickness (T1), for example, between 1 and 15 micrometers, between 5 and 50 micrometers, between 3 and 100 micrometers, between 20 and 150 micrometers, or between 50 and 250 micrometers, and greater than that of the seed layer, that of the adhesion/barrier layer 16, that of each of the contact pads 6', and that of each of the metal layers 20, respectively.

For example, metal layer 20 can be formed as, or composed, of a single metal layer formed by electroplating a gold layer having a suitable thickness, for example, between 1 and 15 micrometers, between 5 and 50 micrometers, or between 3 and 100 micrometers, on the regions of the seed layer. The seed layer can be, in exemplary embodiments, the previously-described gold layer. A suitable electroplating solution can be used, e.g., one containing gold of between 1 and 20 grams per liter (g/L), such as between 5 and 15 g/L, and sulfite ion of 10 and 120 g/L, such as between 30 and 90 g/L. The electroplating solution may further include sodium ion, to be turned into a solution of gold sodium sulfite ($Na_3Au(SO_3)_2$), or may further include ammonium ion, to be turned into a solution of gold ammonium sulfite (($NH_4)_3[Au(SO_3)_2]$).

Alternatively, metal layer 20 can be formed as, or composed of, a single metal layer formed by electroplating a copper layer having a desired thickness, e.g., between 1 and 15 micrometers, between 5 and 50 micrometers, or between 3 and 100 micrometers, on the regions of the seed layer, such as the previously-described copper layer for the seed layer. In this example, an electroplating solution containing Copper (II) sulfate ($CuSO_4$), Copper(II) cyanide ($Cu(CN)_2$), or Copper(II) hydrogenphosphate ($CuHPO_4$) can be used.

Alternatively, metal layer 20 can be formed as, or composed of, a single metal layer formed by electroplating a silver layer having a suitable thickness, e.g., between 1 and 15 micrometers, between 5 and 50 micrometers, or between 3 and 100 micrometers, on the regions of the seed layer, such as the previously-described silver layer for the seed layer.

Alternatively, metal layer 20 can be formed as, or composed of, two (double) metal layers formed by electroplating a copper layer having a suitable thickness, e.g., between 1 and 15 micrometers, between 5 and 50 micrometers, or between 3 and 100 micrometers, on the regions of the seed layer, such as the previously-described copper layer for the seed layer, using the previously-described electroplating solution for electroplating copper. Then a gold layer having a suitable thickness, for example, between 0.1 and 10 micrometers, such as between 0.5 and 5 micrometers, can be electroplated or electroless (e.g., immersion) plated on the electroplated copper layer in the openings 18a.

Alternatively, metal layer 20 can be formed as, or composed of, three (triple) metal layers formed by electroplating a copper layer having a suitable thickness, e.g., between 1 and 15 micrometers, between 5 and 50 micrometers, or between 3 and 100 micrometers, on the regions of the seed layer. In exemplary embodiments, the seed layer can be the previously-described copper layer, The previously-described electroplating solution can be used for electroplating copper. Next, a nickel layer having a desired thickness, e.g., between 0.5 and 8 micrometers, such as between 1 and 5 micrometers, can be formed on the electroplated copper layer in the openings 18a by electroplating of electroless plating. Then a gold layer having a suitable thickness, e.g., between 0.1 and 10 micrometers, such as between 0.5 and 5 micrometers, can be electroplated or electroless plated on the electroplated or electroless plated nickel layer in the openings 18a.

Alternatively, metal layer 20 can be formed as, or composed of, three (triple) metal layers formed by electroplating a copper layer having a suitable thickness, e.g., between 1 and 15 micrometers, between 5 and 50 micrometers, or between 3 and 100 micrometers, on the regions of the seed layer. The previously-described copper layer can be used for the seed layer. The previously-described electroplating solution can be used for electroplating copper. Next, a nickel layer having a desired thickness, for example, between 0.5 and 8 micrometers, such as between 1 and 5 micrometers, can be electroplated or electroless plated on the electroplated copper layer in the openings 18a. Then a platinum layer having a suitable thickness, e.g., between 0.1 and 10 micrometers, such as between 0.5 and 5 micrometers, can be electroplated or electroless plated on the electroplated or electroless plated nickel layer in the openings 18a.

Alternatively, metal layer 20 can be formed by electroplating a copper layer having a suitable thickness, for example, between 1 and 15 micrometers, between 5 and 50 micrometers, between 3 and 100 micrometers, between 20 and 250 micrometers, or between 30 and 350 micrometers, on the regions of the seed layer. The seed layer can be the previously-described copper layer. Then a nickel layer having a suitable thickness, e.g., between 0.5 and 8 micrometers, such as between 1 and 5 micrometers, can be electroplated or electroless plated on the electroplated copper layer in the openings 18a. Next a platinum layer having a suitable thickness, e.g., between 0.1 and 10 micrometers, such as between 0.5 and 5 micrometers, can be electroplated or electroless plated on the electroplated or electroless plated nickel layer in the openings 18a. Then a gold layer having a suitable thickness, for example, between 0.1 and 10 micrometers, such as between 0.5 and 5 micrometers, can be formed (e.g., by electroplating or electroless plating) on the electroplated or electroless plated platinum layer in the openings 18a.

Next, referring to FIG. 1J, the patterned photoresist layer 18 can be removed. After removing the photoresist layer 18, the seed layer not under the metal layer 20 can be removed by using a wet-etching process or a dry-etching process. After removing the seed layer not under the metal layer 20, the adhesion/barrier layer 16 not under the metal layer 20, can be removed by using a wet-etching process or a dry-etching process. After etching the seed layer and the adhesion/barrier layer 16 not under the metal layer 20, an undercut (not shown) may be formed under the seed layer and under the metal layer 20, when the adhesion/barrier layer 16 not under the metal layer 20 is removed using a wet etching method. The adhesion/barrier layer 16 under the metal layer 20 can have a first sidewall recessed from a second sidewall of the seed layer. A distance d1 between the first sidewall and the second sidewall can be between 0.3 and 2 micrometers.

After removing the adhesion/barrier layer 16 not under the metal layer 20, the metal pads, bumps, pillars, or posts 22 can be formed on the regions of the contact pads 6' exposed by the openings 7a and on the passivation layer 7. The metal pads or bumps or metal pillars or posts 22 can include an adhesion/barrier layer 16 of any previously-described material on the regions of the contact pads 6' exposed by the openings 7a and on the passivation layer 7, the seed layer of any previously-described material on the adhesion/barrier layer 16, and the metal layer 20 of any previously-described material on the seed layer. Sidewalls of the metal layer 20 are not necessarily covered by the adhesion/barrier layer 16 and the seed layer. The metal pads or bumps or metal posts (or metal pillars) 22 may have a suitable thickness or height, e.g., between 10 and 50 micrometers, between 25 and 70 micrometers, between 20 and 100 micrometers, between 30 and 150 micrometers, or between 30 and 200 micrometers, and a suitable width, for example, between 2 and 100 micrometers, between 10 and 20 micrometers, between 15 and 40 micrometers, or between 20 and 50 micrometers, such as between 5 and 50 micrometers. From a top perspective view, each of the metal pads or bumps or metal post 22 can, in exemplary embodiments, be circular in shape with a suitable diameter, e.g., between 2 and 100 micrometers, between 10 and 20 micrometers, between 15 and 40 micrometers, or between 20 and 50 micrometers, such as between 5 and 50 micrometers, or square-shaped with a desired width, e.g., between 2 and 100 micrometers, between 10 and 20 micrometers, between 15 and 40 micrometers, or between 20 and 50 micrometers, such as between 5 and 50 micrometers, or rectangular in shape with a shorter width, for example, between 2 and 100 micrometers, between 10 and 20 micrometers, between 15 and 40 micrometers, or between 20 and 50 micrometers, such as between 5 and 50 micrometers.

Next, referring to FIG. 1K, a polymer layer 24 having a thickness between 10 and 400 micrometers, between 20 and 200 micrometers, between 40 and 150 micrometers, or between 50 and 100 micrometers, such as between 20 and 100 micrometers, can be formed on a top surface of the passivation layer 7 and cover a top surface of the metal pads or bumps or metal post 22 by using a screen printing process, using a process including a laminating and a photolithography process, using a spin-coating process, or using a molding process and a photolithography process. In exemplary embodiments, the material of the polymer layer 24 can be epoxy, polyimide, SU-8 or acrylic, or other suitable materials may be used. The polymer layer 24 has a expansion coefficient between 3 and 6 ppm/° C., between 5 and 9 ppm/° C., or between 8 and 12 ppm/° C., approached silicon substrate, such as, the polyimide of "Zenomax" provide by Toyobo Co., Ltd. of Osaka, Japan. The polymer layer 24 can add some dielectric particle or glass fiber to raise the stress.

After formation, the polymer layer 24 can then be cured. The curing procedure may be performed by a suitable method/apparatus, e.g., a baking method, a microwave heating method, or an infrared heating method with temperature of between, e.g., 140 and 220 degrees centigrade, between 200 and 320 degrees centigrade, or between 320 and 400 degrees centigrade.

After the patterned adhesive polymer 24 has been cured, next process can be done either from FIG. 1L or FIG. 1M or vice versa.

Referring to FIG. 1L, FIG. 1L-1 and FIG. 1L-2, a suitable process, e.g., chemical mechanical polishing (CMP) procedure, mechanical grinding, laser drilling, can be used for backside of silicon substrate 100 end to etching stop 10, or to reveal the top ends of the etching stop 10. In the example where the top ends of the etching stop 10 are revealed, the silicon substrate 100 has a thickness between 0.2 and 5 micrometers, between 0.3 and 2 micrometers, between 3 and 7 micrometers, or between 4 and 10 micrometers. In some embodiments, a silicon substrate 100 having a thickness smaller than 5 micrometers may allow a light to pass through the silicon substrate 100.

Referring to FIG. 1M, a suitable process, e.g., chemical mechanical polishing (CMP) procedure, mechanical grinding, laser drilling, can be used for the polymer 24 to reveal the top ends of the metal pads or bumps or metal post 22. The top ends of the metal pads or bumps or metal post 22 are defined as contact pads 22' for the next process.

Next, doping multiple metal ions into a top surface of the epitaxy silicon substrate 100, can be performed by doping by, e.g., a sputtering process, a chemical vapor deposition (CVD) process, an implanting process, or a plasma-enhanced chemical vapor deposition (PECVD) process. The metal ion may include Arsenic (As), Germanium (Ge), Antimony (Sb), and/or Phosphorus (P). After the doping process, a laser anneal process may be performed. The laser anneal process may be of short wavelength and duration time, and may achieve the silicon melting needed to achieve low sheet resistance (R5) (i.e. good activation), and good Within-Wafer (WIW) sheet resistance uniformity, such as less than 1.5%.

If the process of FIG. 1L, FIG. 1L-1 and FIG. 1L-2 are performed first, the process of FIG. 1M may be performed after the process of FIG. 1O and FIG. 1O-1. If the process of FIG. 1M is performed first, the process of FIG. 1L, FIG. 1L-1 and FIG. 1L-2 may be performed after the process of FIG. 1M. In embodiment 1, the processes of FIG. 1L, FIG. 1L-1 and FIG. 1L-2 may be performed first.

Referring to FIG. 1N, after polishing or grinding backside of silicon substrate 100 end to etching stop 10, a layer 26 of optical or color filter array having a suitable thickness, e.g., between 0.3 and 1.5 micrometers, can be formed on the back side surface of the silicon substrate 100, over the light sensors 12b and over the transistors of the light sensors 12b. The material of the layer 26 of optical or color filter array may include dye, pigment, epoxy, acrylic or polyimide. The layer 26 of optical or color filter array, for example, may contain green filters, blue filters and red filters. Alternatively, the layer 26 of optical or color filter array may contain green filters, blue filters, red filters and white filters. Alternatively, the layer 26 of optical or color filter array may contain cyan filters, yellow filters, green filters and magenta filters. Other combinations of filters may be used.

Next, a buffer layer 28 having a suitable thickness, e.g., between 0.2 and 1 micrometers, can be formed on the layer 26 of optical or color filter array. The material of the buffer layer 28 may include epoxy, acrylic, siloxane or polyimide, and the like. Next, multiple microlenses 30 having a suitable thickness, e.g., between 0.5 and 2 micrometers, can be formed on the buffer layer 28, over the layer 26 of optical or color filter array, and over the light sensors 12b. The microlenses 30 may be made of poly methyl methacrylate (PMMA), siloxane, silicon oxide, or silicon nitride. Other suitable materials may be used in microlenses 30.

Referring to FIG. 1O, a transparent substrate 32 adhered to the back side surface of the silicon substrate 100 may be provided, and a space may be formed between transparent substrate 32 and the back-side surface of the silicon substrate 100. The transparent substrate 32 includes a patterned adhesive polymer 34 having a suitable thickness, e.g., between 10 and 300 micrometers, such as between 20 and 100 micrometers, and can be formed on a bottom surface of a transparent substrate 32 by using a screen printing process, using a process including a laminating and a photolithography process, or using a spin-coating process and a photolithography process. The material of the patterned adhesive polymer 34 can be epoxy, polyimide, SU-8 or acrylic or other suitable material. The transparent substrate 32, such as silicon based glass or acrylic, may have a thickness (T2), e.g., between 200 and 500 micrometers, such as between 300 and 400 micrometers. The transparent substrate 32 may also include silica, alumina, gold, silver or metal oxide, e.g., cuprous oxide ($Cu_2O$), cupric oxide (CuO), Cadium oxide (CdO), Cobalt(III) oxide ($CO_2O_3$), Nickel(III) oxide ($Ni_2O_3$) or Manganese(IV) oxide ($MnO_2$). The glass substrate may contain a ultra-violet (UV) absorption composition, such as cerium, iron, copper, lead. The glass substrate may have a thickness between 100 and 1000 microns, between 100 and 500 microns, or between 100 and 300 micrometers.

Referring to FIG. 1O-1, the layer 26 of optical or color filter array, the buffer layer 28, and the microlenses 30 may be formed on the bottom surface of the transparent substrate 32 beforehand. In embodiment 1, the layer 26 of optical or color filter array, the buffer layer 28, and the microlenses 30 may be formed on back-side surface of the silicon substrate 100.

Referring to FIG. 1P, illustrating the process of FIG. 1M, a suitable process, e.g., chemical mechanical polishing (CMP) procedure, or mechanical grinding, laser drilling, can be used for the polymer 24 to reveal the top ends of the metal pads or bumps or metal post 22. The top ends of the metal pads or bumps or metal post 22 are referred to as contact pads 22' for the next process.

Alternatively, or in addition to, using a polishing or grinding process to reveal the top ends of the metal pads or bumps or metal post 22, a dry etch process may be used to polish or grind the patterned adhesive polymer layer 24 to reveal or expose the top ends of the metal pads, bumps, or metal post 22. Referring to FIG. 1P-1, an opening 24a can be formed in the polymer layer 24 to expose the top ends of the metal pads or bumps or metal post 22. The top ends of the metal pads or bumps or metal post 22 may be referred to as contact pads 22' for the next process. In embodiment 1, a chemical mechanical polishing (CMP) procedure, mechanical grinding, and/or laser drilling may be used to reveal the top ends of the metal pads, bumps, or metal post 22, as shown in FIG. 1P.

Referring to FIG. 1Q, an adhesion/barrier layer 36 having a suitable thickness, e.g., between 1 nanometer and 0.8 micrometers, such as between 0.01 and 0.7 micrometers, can be formed on the contact pads 22' and on the polymer layer 24. The adhesion/barrier layer 36 can be formed by sputtering a titanium-containing layer, such as titanium-tungsten-alloy layer, titanium-nitride layer or titanium layer, having a suitable thickness between 1 nanometer and 0.8 micrometers, such as between 0.01 and 0.7 micrometers, on the contact pads 22' and on the polymer layer 24. Alternatively, the adhesion/barrier layer 36 can be formed by sputtering a chromium-containing layer, such as chromium layer, having a suitable thickness, e.g., between 1 nanometer and 0.8 micrometers, such as between 0.01 and 0.7 micrometers, on the contact pads 22' and on the polymer layer 24. Alternatively, the adhesion/barrier layer 36 can be formed by sputtering a tantalum-containing layer, such as tantalum layer or tantalum-nitride layer, having a suitable thickness between 1 nanometer and 0.8 micrometers, such as between 0.01 and 0.7 micrometers, on the contact pads 22' and on the polymer layer 24. Alternatively, the adhesion/barrier layer 36 can be formed by sputtering a nickel layer having a suitable thickness, e.g., between 1 nanometer and 0.8 micrometers, such as between 0.01 and 0.7 micrometers, on the regions of the contact pads 22' and on the polymer layer 24.

After forming the adhesion/barrier layer 36, a seed layer (not shown) having a suitable thickness, e.g., between 0.01 and 2 micrometers, such as between 0.02 and 0.5 micrometers, can be formed on the adhesion/barrier layer 36 by a suitable process. For example, the seed layer, can be formed by sputtering a copper layer having a thickness, e.g., between 0.01 and 2 micrometers, such as between 0.02 and 0.5 micrometers, on the adhesion/barrier layer 36 of any previously-described material. Alternatively, the seed layer can be formed by sputtering a gold layer having a suitable thickness, e.g., between 0.01 and 2 micrometers, such as between 0.02 and 0.5 micrometers, on the adhesion/barrier layer 36 of any previously-described material. Alternatively, the seed layer can be formed by sputtering a silver layer having a suitable thickness, e.g., between 0.01 and 2 micrometers, such as between 0.02 and 0.5 micrometers, on the adhesion/barrier layer 36 of any previously-described material. Alternatively, the seed layer can be formed by sputtering an aluminum-containing layer, such as aluminum layer, aluminum-copper alloy layer or Al—Si—Cu alloy layer, having a suitable thickness, e.g., between 0.01 and 2 micrometers, or between 0.4 and 3 micrometers, on the adhesion/barrier layer 36 of any previously-described material. Alternatively, the seed layer can be formed by sputtering an copper-containing layer, such as titanium-copper alloy layer, having a suitable thickness, e.g., between 0.01 and 2 micrometers, or between 0.4 and 3 micrometers, on the adhesion/barrier layer 36 of any previously-described material.

Referring to FIG. 1R, after forming the seed layer, a patterned photoresist layer 38 can be formed on the seed layer, which can be any suitable material, and multiple openings 38a in the patterned photoresist layer 38 can expose multiple regions of the seed layer. A metal layer 40 can be formed on the regions of the seed layer. The metal layer 40 may have a suitable thickness (T2), for example, between 1 and 15 micrometers, between 5 and 50 micrometers, between 3 and 100 micrometers, between 20 and 150 micrometers, between 30 and 250 micrometers, or between 40 and 320 micrometers.

For example, metal layer 40 can be formed as, or composed of, a single metal layer formed by electroplating a gold layer having a suitable thickness, for example, between 1 and 15 micrometers, between 5 and 50 micrometers, or between 3 and 100 micrometers, on the regions of the seed layer. The seed layer can be, in exemplary embodiments, the previously-described gold layer. A suitable electroplating solution can be used, e.g., one containing gold of between 1 and 20 grams per liter (g/L), such as between 5 and 15 g/L, and sulfite ion of 10 and 120 g/L, such as between 30 and 90 g/L. The electroplating solution may further include sodium ion, to be turned into a solution of gold sodium sulfite ($Na_3Au(SO_3)_2$), or may further include ammonium ion, to be turned into a solution of gold ammonium sulfite (($NH_4)_3[Au(SO_3)_2]$).

Alternatively, metal layer 40 can be formed as, or composed of, a single metal layer formed by electroplating a copper layer having a desired thickness, e.g., between 1 and 15 micrometers, between 5 and 50 micrometers, or between 3 and 100 micrometers, on the regions of the seed layer, such as the previously-described copper layer for the seed layer. For example, an electroplating solution containing Copper(II) sulfate ($CuSO_4$), Copper(II) cyanide ($Cu(CN)_2$), or Copper (II) hydrogenphosphate ($CuHPO_4$) can be used.

Alternatively, metal layer 40 can be formed as, or composed of, a single metal layer formed by electroplating a silver layer having a suitable thickness, e.g., between 1 and 15 micrometers, between 5 and 50 micrometers, or between 3 and 100 micrometers, on the regions of the seed layer, such as the previously-described silver layer for the seed layer.

Alternatively, metal layer 40 can be formed as, or composed of, two (double) metal layers formed by electroplating a copper layer having a suitable thickness, e.g., between 1 and 15 micrometers, between 5 and 50 micrometers, or between 3 and 100 micrometers, on the regions of the seed layer, such as the previously-described copper layer for the seed layer, using the previously-described electroplating solution for electroplating copper. Then a gold layer having a suitable thickness, for example, between 0.1 and 10 micrometers, such as between 0.5 and 5 micrometers, can be electroplated or electroless (e.g., immersion) plated on the electroplated copper layer in the openings 38a.

Alternatively, metal layer 40 can be formed as, or composed of, three (triple) metal layers formed by electroplating a copper layer having a suitable thickness, e.g., between 1 and 15 micrometers, between 5 and 50 micrometers, or between 3 and 100 micrometers, on the regions of the seed layer. In exemplary embodiments, the seed layer can be the previously-described copper layer. The previously-described electroplating solution can be used for electroplating copper. Next, a nickel layer having a desired thickness, e.g., between 0.5 and 8 micrometers, such as between 1 and 5 micrometers, can be formed on the electroplated copper layer in the openings 38a by electroplating or electroless plating. Then a gold layer having a suitable thickness, e.g., between 0.1 and 10 micrometers, such as between 0.5 and 5 micrometers, can be electroplated or electroless plated on the electroplated or electroless plated nickel layer in the openings 38a.

Alternatively, metal layer 40 can be formed as, or composed of, three (triple) metal layers formed by electroplating a copper layer having a suitable thickness, e.g., between 1 and 15 micrometers, between 5 and 50 micrometers, or between 3 and 100 micrometers, on the regions of the seed layer. The previously-described copper layer can be used for the seed layer. The previously-described electroplating solution can be used for electroplating copper. Next, a nickel layer having a desired thickness, for example, between 0.5 and 8 micrometers, such as between 1 and 5 micrometers, can be electroplated or electroless plated on the electroplated copper layer in the openings 38a. Then a platinum layer having a suitable thickness, e.g., between 0.1 and 10 micrometers, such as between 0.5 and 5 micrometers, can be electroplated or electroless plated on the electroplated or electroless plated nickel layer in the openings 38a.

Alternatively, metal layer 40 can be formed by electroplating a copper layer having a suitable thickness, for example, between 1 and 15 micrometers, between 5 and 50 micrometers, between 3 and 100 micrometers, between 20 and 250 micrometers, or between 30 and 350 micrometers, on the regions of the seed layer. The seed layer can be the previously-described copper layer. Then a nickel layer having a suitable thickness, e.g., between 0.5 and 8 micrometers, such as between 1 and 5 micrometers, can be electroplated or electroless plated on the electroplated copper layer in the openings 38a. Next a platinum layer having a suitable thickness, e.g., between 0.1 and 10 micrometers, such as between 0.5 and 5 micrometers, can be electroplated or electroless plated on the electroplated or electroless plated nickel layer in the openings 38a. Then a gold layer having a suitable thickness, for example, between 0.1 and 10 micrometers, such as between 0.5 and 5 micrometers, can be formed (e.g., by electroplating or electroless plating) on the electroplated or electroless plated platinum layer in the openings 38a.

Alternatively, the metal layer 40 can be formed by electroplating a copper layer having a suitable thickness, e.g., between 1 and 15 micrometers, between 5 and 50 micrometers, or between 3 and 100 micrometers, on the regions of the seed layer. In exemplary embodiments, the previously-described copper layer can be used for the seed layer. A nickel layer having a suitable thickness, for example, between 0.5 and 8 micrometers, such as between 1 and 5 micrometers, can be electroplated or electroless plated on the electroplated copper layer in the openings 38a. A solder layer having a suitable thickness, e.g., between 0.1 and 150 micrometers, or between 5 and 100 micrometers, such as between 15 and 50 micrometers, can be formed on the electroplated or electroless plated nickel layer in the openings 38a. The solder can be formed by screen plating, ball mounting, or an electroplating process, such as gold-tin alloy, tin-silver alloy, tin-silver-copper alloy, indium, tin-bismuth alloy, or other lead-free alloy. Lead alloy solders can also be used but may be less desirable in some embodiments due to toxicity considerations.

Next, referring to FIG. 1S, the patterned photoresist layer 38 can be removed. After removing the photoresist layer 38, the seed layer not under the metal layer 40 can be removed by using a wet-etching process or a dry-etching process. After removing the seed layer not under the metal layer 40, the adhesion/barrier layer 36 not under the metal layer 40, can be removed by using a wet-etching process or a dry-etching process. After etching the seed layer and the adhesion/barrier layer 36 not under the metal layer 40, an undercut (not shown) may be formed under the seed layer and under the metal layer 40, when the adhesion/barrier layer 36 not under the metal layer 40 is removed using a wet etching method. The adhesion/barrier layer 36 under the metal layer 40 can have a first sidewall recessed from a second sidewall of the seed layer. A distance (d1) between the first sidewall and the second sidewall can be between 0.3 and 2 micrometers.

After removing the adhesion/barrier layer 36 not under the metal layer 40, the metal bumps 42 can be formed on the contact pads 22' and on the polymer layer 24. The metal pads or bumps or metal pillars or posts 42 can include an adhesion/barrier layer 36 of any previously-described material on the contact pads 22' and on the polymer layer 24, the seed layer of any previously-described material on the adhesion/barrier layer 36, and/or the metal layer 40 of any previously-described material on the seed layer.

Next, referring to FIG. 1T, if the metal bumps 42 includes a solder bump, the metal bumps 42 can be configured in a hemispherical shape, e.g., through the process of reflow in an environment containing oxygen less than 20 parts per million (ppm).

Referring FIG. 1T-1 and FIG. 1T-2, a top view is illustrated. The metal layers 40 can be configured in a ball or circular shape or hemispherical, as shown. The metal bumps 42 can have similar diameters and regular pitch between them.

Next, referring to FIG. 1U and FIG. 1V, The semiconductor wafer (including the substrate 100 and the transparent substrate 32) can be cut into a plurality of individual semiconductor chips 44 by a die-sawing process.

Referring to FIG. 1W and FIG. 1P-1, FIG. 1W is a another exemplary structure of embodiment 1. Metal bumps 42 are formed on the contact pads 22' of metal pads, bumps, metal post 22, and on the polymer layer 24. The detailed process is similar to FIGS. 1Q-1V.

Referring to FIG. 1X, FIG. 1X is another exemplary structure of embodiment 1. The structure of FIG. 1X is similar to FIG. 1V. However, the process differs in that a patterned polymer layer 46 is formed having a thickness between 10 and 400 micrometers, between 20 and 200 micrometers, between 40 and 150 micrometers, or between 50 and 100 micrometers, such as between 20 and 100 micrometers, on the passivation layer 7 before the adhesion/barrier layer 16 is formed on the contact pads 6' exposed by the openings 7a on the passivation layer 7. Multiple openings 46a in the patterned polymer layer 46 can expose the contact pads 6' and passivation layer 7. The detailed process is similar to FIGS. 1H-1V.

The patterned polymer layer 46 having a thickness between 10 and 400 micrometers, between 20 and 200 micrometers, between 40 and 150 micrometers, or between 50 and 100 micrometers, such as between 20 and 100 micrometers, can be formed on a top surface of the passivation layer 7 and over the contact pads 6' by using a screen printing process, using a process including a laminating and a photolithography process, using a spin-coating process, or using a molding process and a photolithography process. In exemplary embodiments, the material of the patterned polymer layer 46 can be epoxy, polyimide, SU-8 or acrylic, though other suitable materials may be used. The patterned polymer layer 46 has an expansion coefficient between 3 and 6 ppm/° C., between 5 and 9 ppm/° C. or between 8 and 12 ppm/° C., approached silicon substrate, such as, the polyimide of "Zenomax" provide by Toyobo Co., Ltd. of Osaka, Japan. The patterned polymer layer 46 can add some dielectric particle or glass fiber to raise the stress.

Referring to FIG. 1Y, FIG. 1Y is a another exemplary structure of embodiment 1. The structure of FIG. 1Y is similar to FIG. 1W. However, the process differs in that the patterned polymer layer 46 is formed on the passivation layer 7 before the adhesion/barrier layer 16 is formed on the contact pads 6' exposed by the openings 7a on the passivation layer 7. Multiple openings 46a in the patterned polymer layer 46 can expose the contact pads 6' and passivation layer 7. The detailed process is similar to FIGS. 1H-1V.

Embodiment 2

Figure 2A:
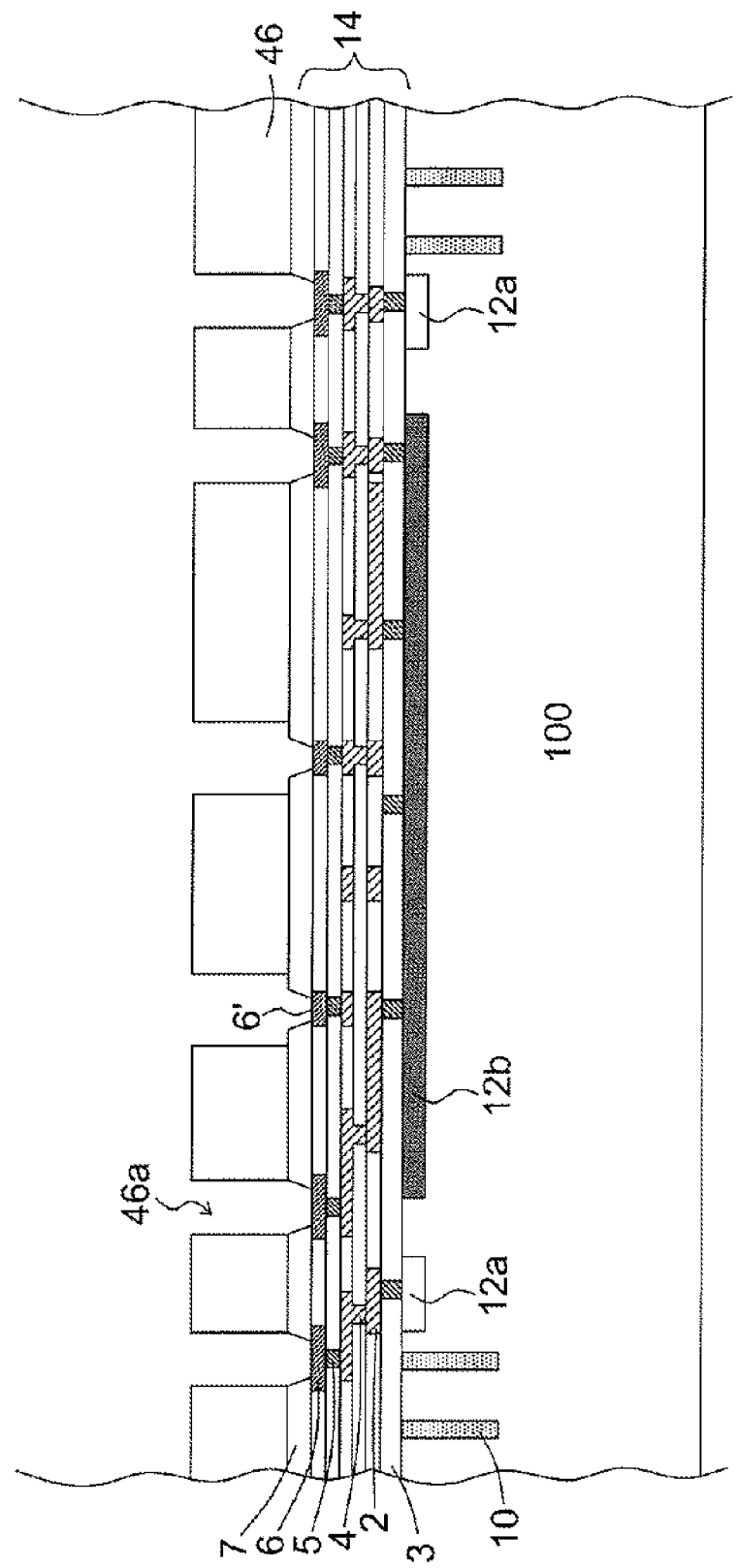

FIG. 2A-2L are cross-sectional views showing an exemplary embodiment 2 including a process of forming a chip, in accordance with the present disclosure. Embodiment 2 can be utilized for forming an metal interconnect trace on the contact pads 6' and on a top surface of the patterned polymer layer 46 or the passivation layer 7. The interconnect trace may include multiple passive devices, such as a inductor, a resistor, and/or a capacitor. After the steps illustrated in FIG. 1F, as shown in FIG. 2A, are performed, a patterned polymer layer 46 can be formed on a top surface of the passivation layer 7, and over the contact pads 6', by using a screen printing process, using a process including a laminating and a photolithography process, using a spin-coating process, or using a molding process and a photolithography process. In exemplary embodiments, the material of the patterned polymer layer 46 can be epoxy, polyimide, SU-8 or acrylic, though other suitable materials may be used. The patterned polymer layer 46 has a expansion coefficient between 3 and 6 ppm/° C., between 5 and 9 ppm/° C. or between 8 and 12 ppm/° C., approached silicon substrate, such as, the polyimide of "Zenomax" provide by Toyobo Co., Ltd. of Osaka, Japan. The patterned polymer layer 46 can add some dielectric particle or glass fiber to raise the stress.

Figure 2B:
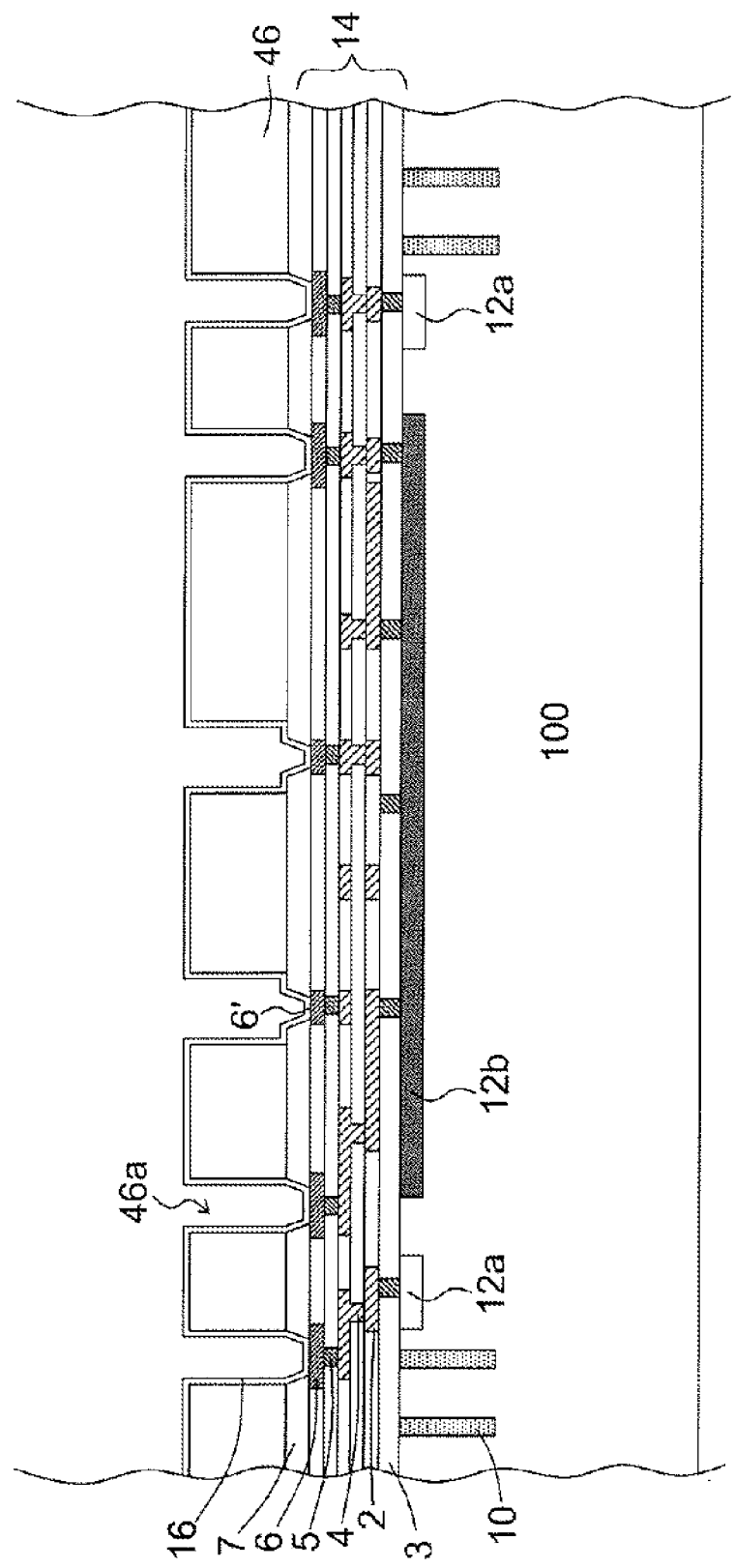

Referring to FIG. 2B, an adhesion/barrier layer 16 having a suitable thickness, e.g., between 1 nanometer and 0.8 micrometers, such as between 0.01 and 0.7 micrometers, can be formed on the contact pads 6' exposed by the openings 7a, on the patterned polymer layer 46 and on a portion of passivation layer 7. The adhesion/barrier layer 16 can be formed by sputtering a titanium-containing layer, such as titanium-tungsten-alloy layer, titanium-nitride layer or titanium layer, having a suitable thickness, e.g., between 1 nanometer and 0.8 micrometers, such as between 0.01 and 0.7 micrometers, on the contact pads 6' exposed by the openings 46a and the openings 7a, on the passivation layer 7. Alternatively, the adhesion/barrier layer 16 can be formed by sputtering a chromium-containing layer, such as a chromium layer, having a thickness between, e.g., 1 nanometer and 0.8 micrometers, such as between 0.01 and 0.7 micrometers, on the contact pads 6' exposed by openings 46a and the openings 7a, on the patterned polymer layer 46, and on a portion of passivation layer 7. Alternatively, the adhesion/barrier layer 16 can be formed by sputtering a tantalum-containing layer, such as tantalum layer or tantalum-nitride layer, having a suitable thickness, e.g., between 1 nanometer and 0.8 micrometers, such as between 0.01 and 0.7 micrometers, on the contact pads 6' exposed by the openings 46a and the openings 7a, on the patterned polymer layer 46 and on a portion of passivation layer 7. Alternatively, the adhesion/barrier layer 16 can be formed by sputtering a nickel layer having a thickness between 1 nanometer and 0.8 micrometers, such as between 0.01 and 0.7 micrometers, on the regions of the contact pads 6' exposed by the openings 46a and the openings 7a, on the patterned polymer layer 46 and on a portion of passivation layer 7.

After forming the adhesion/barrier layer 16, a seed layer (not shown) can be formed on the adhesion/barrier layer 16. The seed layer can have a desired thickness, e.g., between 0.01 and 2 micrometers, such as between 0.02 and 0.5 micrometers. The seed layer, for example, can be formed by sputtering a copper layer having a suitable thickness, for example, between 0.01 and 2 micrometers, such as between 0.02 and 0.5 micrometers, on the adhesion/barrier layer of any previously-described material. Alternatively, the seed layer can be formed by sputtering a gold layer having a suitable thickness, e.g., between 0.01 and 2 micrometers, such as between 0.02 and 0.5 micrometers, on the adhesion/barrier layer 16 of any previously-described material. Alternatively, the seed layer can be formed by sputtering a silver layer having a suitable thickness, for example, between 0.01 and 2 micrometers, such as between 0.02 and 0.5 micrometers, on the adhesion/barrier layer 16 of any previously-described material. Alternatively, the seed layer can be formed by sputtering an aluminum-containing layer, such as aluminum layer, aluminum-copper alloy layer, or Al—Si—Cu alloy layer, having a suitable thickness, e.g., between 0.01 and 2 micrometers, or between 0.4 and 3 micrometers, on the adhesion/barrier layer 16 of any previously-described material. Alternatively, the seed layer can be formed by sputtering a titanium-copper alloy layer having a suitable thickness, for example, between 0.01 and 2 micrometers, such as between 0.02 and 0.5 micrometers, on the adhesion/barrier layer 16 of any previously-described material.

Figure 2C:
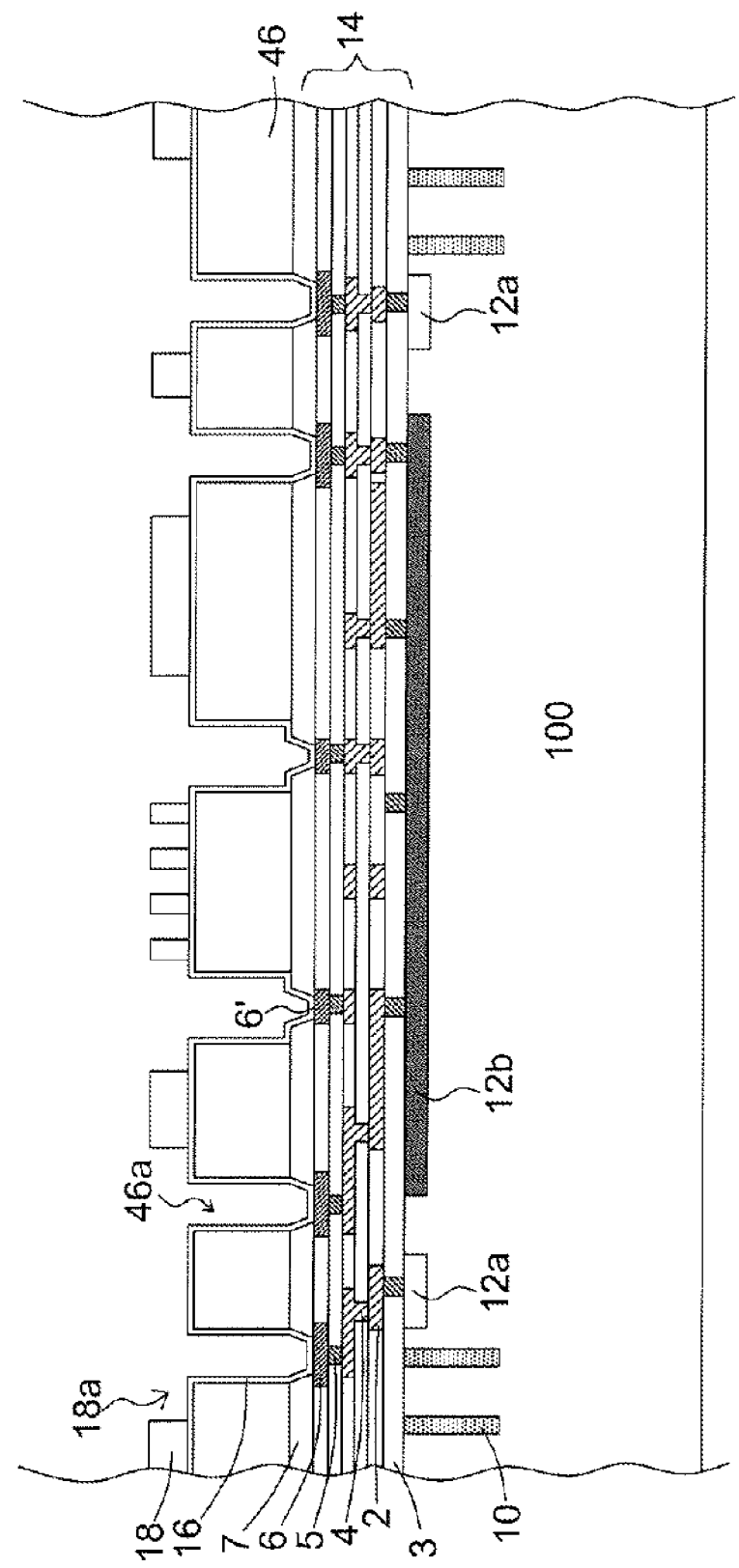

Referring to FIG. 2C, after forming the seed layer, a patterned photoresist layer 18 can be formed on the seed layer of any previously-described material. Multiple openings 18a can be formed in the patterned photoresist layer 18 to expose multiple regions of the seed layer of any previously-described material. The shape of the openings 18a can include a coil, multiple coils, a square coil, multiple square coils, or other shapes.

Figure 2D:
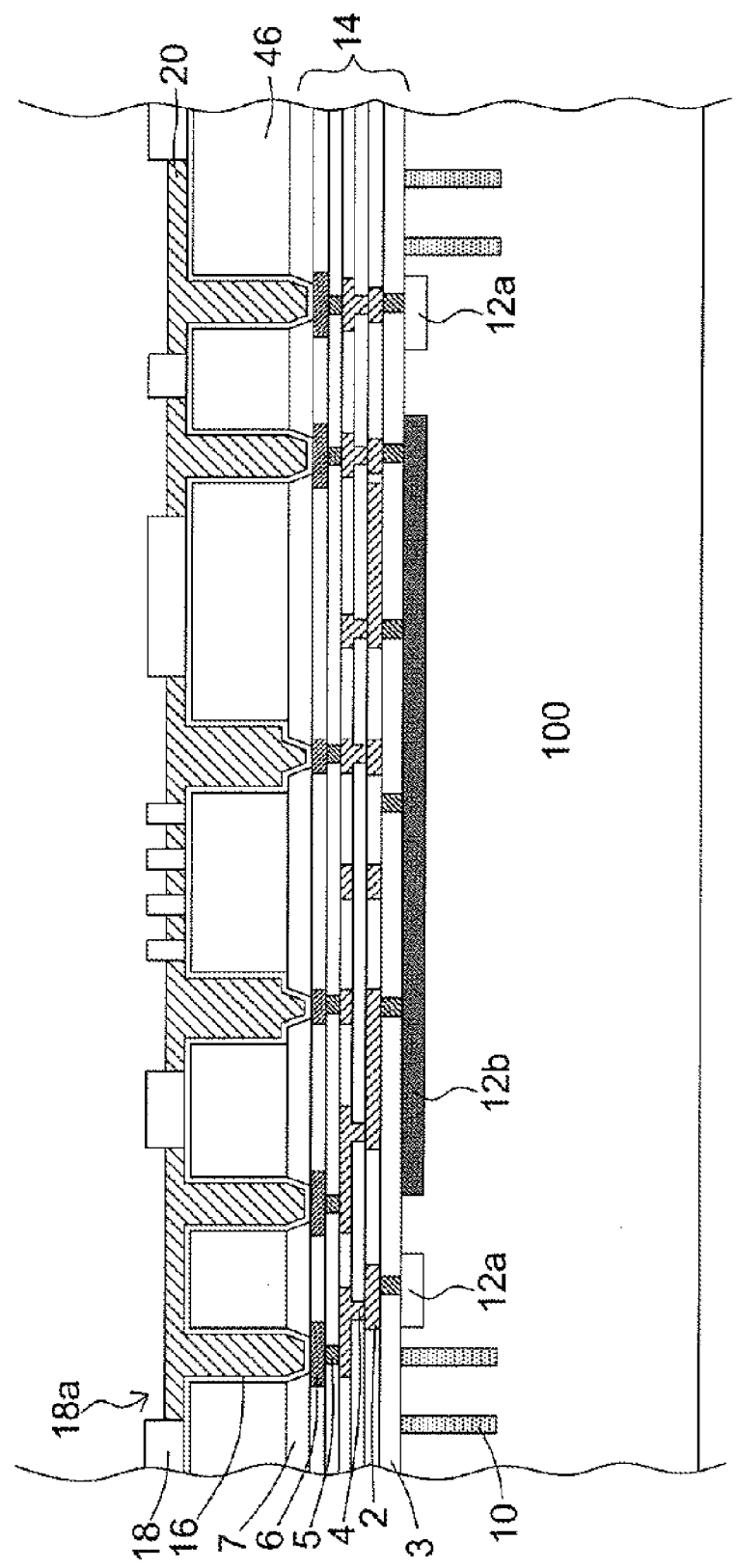

Next, referring to FIG. 2D, a metal layer 20 (as a metal interconnect trace) can be formed on the regions of the seed layer of any previously-described material. The metal layer 20 may have a suitable thickness between 1 and 15 micrometers, between 5 and 50 micrometers, between 3 and 100 micrometers, between 20 and 150 micrometers, or between 50 and 250 micrometers, and greater than that of the seed layer, that of the adhesion/barrier layer 16, that of each of the contact pads 6', and that of each of the metal layers 20, respectively.

For example, metal layer 20 can be formed as, or composed of, a single metal layer formed by electroplating a gold layer having a suitable thickness, for example, between 1 and 15 micrometers, between 5 and 50 micrometers, or between 3 and 100 micrometers, on the regions of the seed layer. The seed layer can be, in exemplary embodiments, the previously-described gold layer. A suitable electroplating solution can be used, e.g., one containing gold of between 1 and 20 grams per liter (g/L), such as between 5 and 15 g/L, and sulfite ion of 10 and 120 g/L, such as between 30 and 90 g/L. The electroplating solution may further include sodium ion, to be turned into a solution of gold sodium sulfite ($Na_3Au(SO_3)_2$), or may further include ammonium ion, to be turned into a solution of gold ammonium sulfite (($NH_4)_3[Au(SO_3)_2]$).

Alternatively, metal layer 20 can be formed as, or composed of, a single metal layer formed by electroplating a copper layer having a desired thickness, e.g., between 1 and 15 micrometers, between 5 and 50 micrometers, or between 3 and 100 micrometers, on the regions of the seed layer, such as the previously-described copper layer for the seed layer. In this example, an electroplating solution containing Copper (II) sulfate ($CuSO_4$), Copper(II) cyanide ($Cu(CN)_2$), or Copper(II) hydrogenphosphate ($CuHPO_4$) can be used.

Alternatively, metal layer 20 can be formed as, or composed of, a single metal layer formed by electroplating a silver layer having a suitable thickness, e.g., between 1 and 15 micrometers, between 5 and 50 micrometers, or between 3 and 100 micrometers, on the regions of the seed layer, such as the previously-described silver layer for the seed layer.

Alternatively, metal layer 20 can be formed as, or composed of, two (double) metal layers formed by electroplating a copper layer having a suitable thickness, e.g., between 1 and 15 micrometers, between 5 and 50 micrometers, or between 3 and 100 micrometers, on the regions of the seed layer, such as the previously-described copper layer for the seed layer, using the previously-described electroplating solution for electroplating copper. Then a gold layer having a suitable thickness, for example, between 0.1 and 10 micrometers, such as between 0.5 and 5 micrometers, can be electroplated or electroless (e.g., immersion) plated on the electroplated copper layer in the openings 18a.

Alternatively, metal layer 20 can be formed as, or composed of, three (triple) metal layers formed by electroplating a copper layer having a suitable thickness, e.g., between 1 and 15 micrometers, between 5 and 50 micrometers, or between 3 and 100 micrometers, on the regions of the seed layer. In exemplary embodiments, the seed layer can be the previously-described copper layer, The previously-described electroplating solution can be used for electroplating copper. Next, a nickel layer having a desired thickness, e.g., between 0.5 and 8 micrometers, such as between 1 and 5 micrometers, can be formed on the electroplated copper layer in the openings 18a by electroplating of electroless plating. Then a gold layer having a suitable thickness, e.g., between 0.1 and 10 micrometers, such as between 0.5 and 5 micrometers, can be electroplated or electroless plated on the electroplated or electroless plated nickel layer in the openings 18a.

Alternatively, metal layer 20 can be formed as, or composed of, three (triple) metal layers formed by electroplating a copper layer having a suitable thickness, e.g., between 1 and 15 micrometers, between 5 and 50 micrometers, or between 3 and 100 micrometers, on the regions of the seed layer. The previously-described copper layer can be used for the seed layer. The previously-described electroplating solution can be used for electroplating copper. Next, a nickel layer having a desired thickness, for example, between 0.5 and 8 micrometers, such as between 1 and 5 micrometers, can be electroplated or electroless plated on the electroplated copper layer in the openings 18a. Then a platinum layer having a suitable thickness, e.g., between 0.1 and 10 micrometers, such as between 0.5 and 5 micrometers, can be electroplated or electroless plated on the electroplated or electroless plated nickel layer in the openings 18a.

Alternatively, metal layer 20 can be formed by electroplating a copper layer having a suitable thickness, for example, between 1 and 15 micrometers, between 5 and 50 micrometers, between 3 and 100 micrometers, between 20 and 250 micrometers, or between 30 and 350 micrometers, on the regions of the seed layer. The seed layer can be the previously-described copper layer. Then a nickel layer having a suitable thickness, e.g., between 0.5 and 8 micrometers, such as between 1 and 5 micrometers, can be electroplated or electroless plated on the electroplated copper layer in the openings 18a. Next a platinum layer having a suitable thickness, e.g., between 0.1 and 10 micrometers, such as between 0.5 and 5 micrometers, can be electroplated or electroless plated on the electroplated or electroless plated nickel layer in the openings 18a. Then a gold layer having a suitable thickness, for example, between 0.1 and 10 micrometers, such as between 0.5 and 5 micrometers, can be formed (e.g., by electroplating or electroless plating) on the electroplated or electroless plated platinum layer in the openings 18a.

Figure 2E:
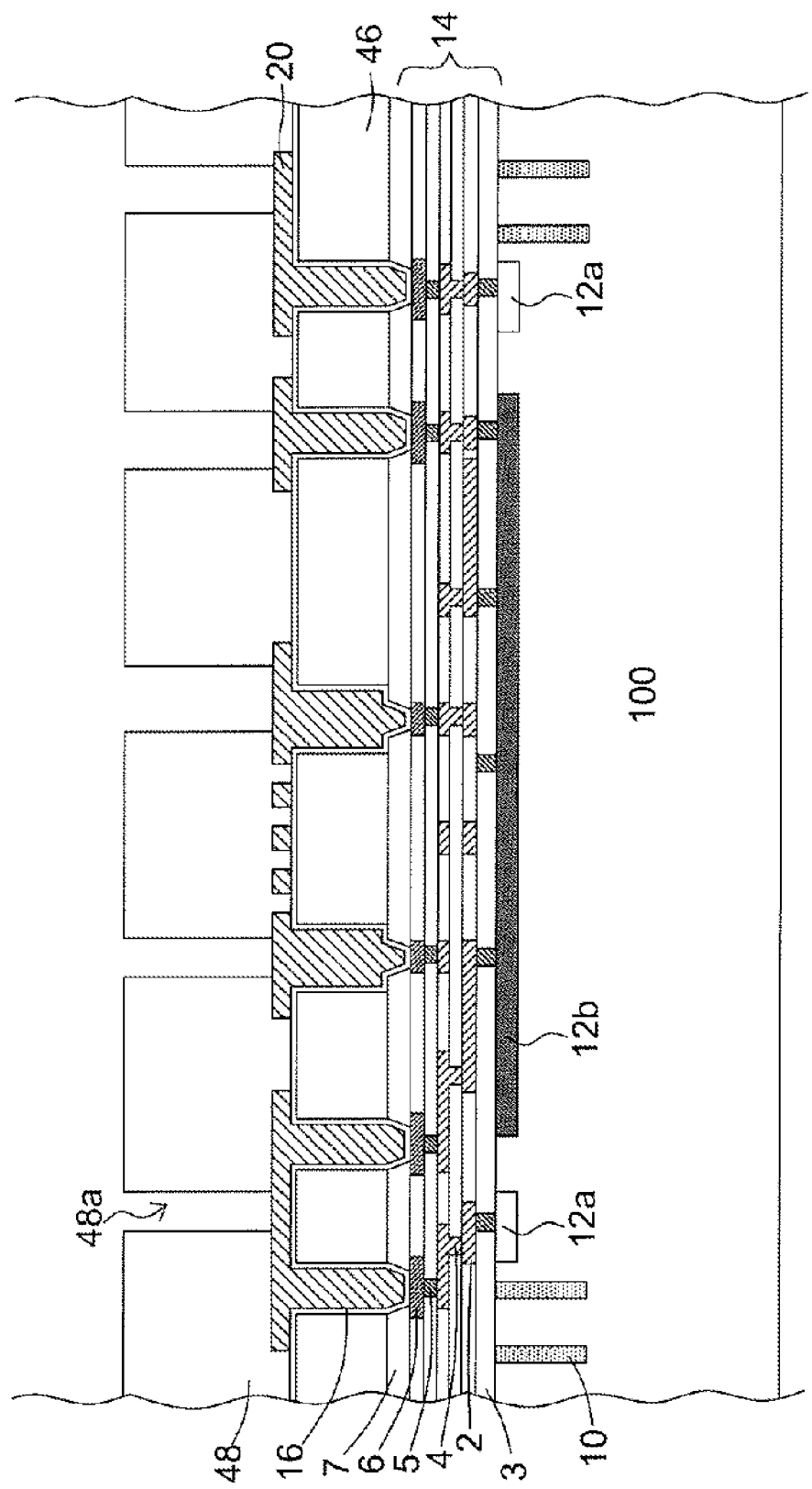

Next, referring to FIG. 2E, the patterned photoresist layer 18 can be removed. And a patterned photoresist layer 48 can be formed on the metal layer 20 of any previously-described material and on the patterned polymer layer 46. Multiple openings 48a can be formed in the patterned photoresist layer 48 to expose multiple regions of the metal layer 20 of any previously-described material.

Next, referring to FIG. 2F, a metal layer 50 (as a metal bumps, metal posts, or metal pillars) can be formed on the regions of the metal layer 20 of any previously-described material. The metal layer 50 may have a suitable thickness between 1 and 15 micrometers, between 5 and 50 micrometers, between 3 and 100 micrometers, between 20 and 150 micrometers, or between 50 and 250 micrometers.

For example, metal layer 50 can be formed as, or composed of, a single metal layer formed by electroplating a gold layer having a suitable thickness, for example, between 1 and 15 micrometers, between 5 and 50 micrometers, or between 3 and 100 micrometers, on the regions of the metal layer 20. A suitable electroplating solution can be used, e.g., one containing gold of between 1 and 20 grams per liter (g/L), such as between 5 and 15 g/L, and sulfite ion of 10 and 120 g/L, such as between 30 and 90 g/L. The electroplating solution may further include sodium ion, to be turned into a solution of gold sodium sulfite ($Na_3Au(SO_3)_2$), or may further include ammonium ion, to be turned into a solution of gold ammonium sulfite (($NH_4)_3[Au(SO_3)_2]$).

Alternatively, metal layer 50 can be formed as, or composed of, a single metal layer formed by electroplating a copper layer having a desired thickness, e.g., between 1 and 15 micrometers, between 5 and 50 micrometers, or between 3 and 100 micrometers, on the regions of the metal layer 20, such as the previously-described copper layer. In this example, an electroplating solution containing Copper(II) sulfate ($CuSO_4$), Copper(II) cyanide ($Cu(CN)_2$), or Copper (II) hydrogenphosphate ($CuHPO_4$), can be used.

Alternatively, metal layer 50 can be formed as, or composed of, a single metal layer formed by electroplating a silver layer having a suitable thickness, e.g., between 1 and 15 micrometers, between 5 and 50 micrometers, or between 3 and 100 micrometers, on the regions of the metal layer 20, such as the previously-described silver layer.

Alternatively, metal layer 50 can be formed as, or composed of, two (double) metal layers formed by electroplating a copper layer having a suitable thickness, e.g., between 1 and 15 micrometers, between 5 and 50 micrometers, or between 3 and 100 micrometers, on the regions of the metal layer 20, such as the previously-described copper layer, using the previously-described electroplating solution for electroplating copper. Then a gold layer having a suitable thickness, for example, between 0.1 and 10 micrometers, such as between 0.5 and 5 micrometers, can be electroplated or electroless (e.g., immersion) plated on the electroplated copper layer in the openings 48a.

Alternatively, metal layer 50 can be formed as, or composed of, three (triple) metal layers formed by electroplating a copper layer having a suitable thickness, e.g., between 1 and 15 micrometers, between 5 and 50 micrometers, or between 3 and 100 micrometers, on the regions of the metal layer 20. In exemplary embodiments, the previously-described electroplating solution can be used for electroplating copper. Next, a nickel layer having a desired thickness, e.g., between 0.5 and 8 micrometers, such as between 1 and 5 micrometers, can be formed on the electroplated copper layer in the openings 48a by electroplating of electroless plating. Then a gold layer having a suitable thickness, e.g., between 0.1 and 10 micrometers, such as between 0.5 and 5 micrometers, can be electroplated or electroless plated on the electroplated or electroless plated nickel layer in the openings 48a.

Alternatively, metal layer 50 can be formed as, or composed of, three (triple) metal layers formed by electroplating a copper layer having a suitable thickness, e.g., between 1 and 15 micrometers, between 5 and 50 micrometers, or between 3 and 100 micrometers, on the regions of the metal layer 20. The previously-described electroplating solution can be used for electroplating copper. Next, a nickel layer having a desired thickness, for example, between 0.5 and 8 micrometers, such as between 1 and 5 micrometers, can be electroplated or electroless plated on the electroplated copper layer in the openings 48a. Then a platinum layer having a suitable thickness, e.g., between 0.1 and 10 micrometers, such as between 0.5 and 5 micrometers, can be electroplated or electroless plated on the electroplated or electroless plated nickel layer in the openings 48a.

Alternatively, metal layer 50 can be formed by electroplating a copper layer having a suitable thickness, for example, between 1 and 15 micrometers, between 5 and 50 micrometers, between 3 and 100 micrometers, between 20 and 250 micrometers, or between 30 and 350 micrometers, on the regions of the metal layer 20. Then a nickel layer having a suitable thickness, e.g., between 0.5 and 8 micrometers, such as between 1 and 5 micrometers, can be electroplated or electroless plated on the electroplated copper layer in the openings 18a. Next a platinum layer having a suitable thickness, e.g., between 0.1 and 10 micrometers, such as between 0.5 and 5 micrometers, can be electroplated or electroless plated on the electroplated or electroless plated nickel layer in the openings 48a. Then a gold layer having a suitable thickness, for example, between 0.1 and 10 micrometers, such as between 0.5 and 5 micrometers, can be formed (e.g., by electroplating or electroless plating) on the electroplated or electroless plated platinum layer in the openings 48a.

Next, referring to FIG. 2G, the patterned photoresist layer 48 can be removed. And after removing the photoresist layer 48, the seed layer not under the metal layer 20 can be removed by using a wet-etching process or a dry-etching process. After removing the seed layer not under the metal layer 20, the adhesion/barrier layer 16 not under the metal layer 20, can be removed by using a wet-etching process or a dry-etching process. After etching the seed layer and the adhesion/barrier layer 16 not under the metal layer 20, an undercut (not shown) may be formed under the seed layer and under the metal layer 20, when the adhesion/barrier layer 16 not under the metal layer 20 is removed using a wet etching method. The adhesion/barrier layer 16 under the metal layer 20 can have a first sidewall recessed from a second sidewall of the seed layer. A distance (d1) between the first sidewall and the second sidewall can be between 0.3 and 2 micrometers. After removing the adhesion/barrier layer 16 not under the metal layer 20, the metal layer 50 may be formed as metal pads, bumps, pillars, or posts 52. A metal coil 54 (as a inductor) can be formed on the patterned polymer layer 46. The metal pads, bumps, pillars, or posts 52 can be formed on the regions of metal layer 20 and on the metal coil 54.

The metal pads, bumps, pillars, or posts 52 may have a suitable thickness or height, e.g., between 10 and 50 micrometers, between 25 and 70 micrometers, between 20 and 100 micrometers, between 30 and 150 micrometers, or between 30 and 200 micrometers, and a suitable width, for example, between 2 and 100 micrometers, between 10 and 20 micrometers, between 15 and 40 micrometers, or between 20 and 50 micrometers, such as between 5 and 50 micrometers. From a top perspective view, each of the metal pads or bumps or metal post 52 can, in exemplary embodiments, be circular in shape with a suitable diameter, e.g., between 2 and 100 micrometers, between 10 and 20 micrometers, between 15 and 40 micrometers, or between 20 and 50 micrometers, such as between 5 and 50 micrometers, or square-shaped with a desired width, e.g., between 2 and 100 micrometers, between 10 and 20 micrometers, between 15 and 40 micrometers, or between 20 and 50 micrometers, such as between 5 and 50 micrometers, or rectangular in shape with a shorter width, for example, between 2 and 100 micrometers, between 10 and 20 micrometers, between 15 and 40 micrometers, or between 20 and 50 micrometers, such as between 5 and 50 micrometers.

Figure 2H:
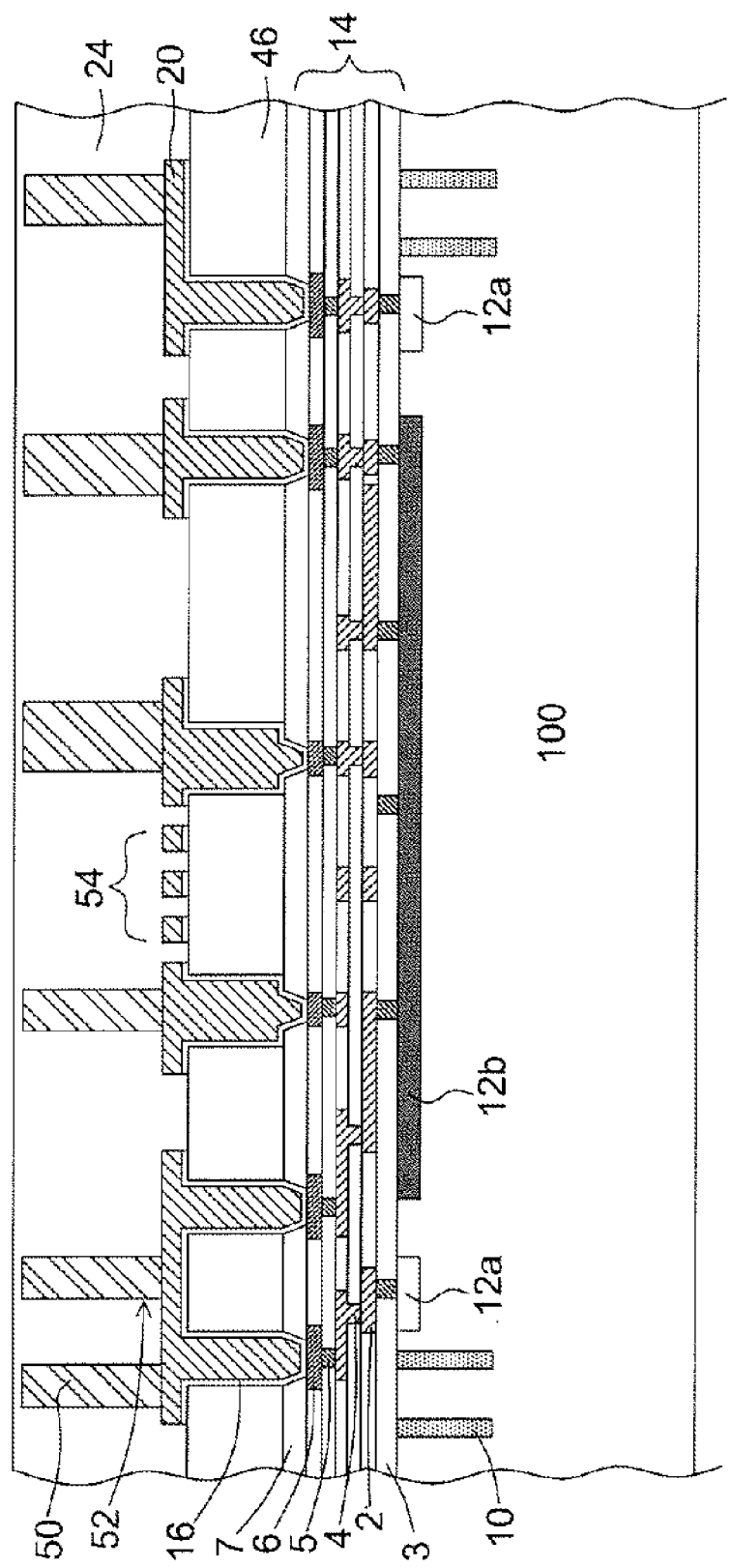

Next, referring to FIG. 2H, a polymer layer 24 having a thickness between 10 and 400 micrometers, between 20 and 200 micrometers, between 40 and 150 micrometers, or between 50 and 100 micrometers, such as between 20 and 100 micrometers, can be formed on the patterned polymer layer 46, on the metal layer 20, on the metal coil 54 and cover a top surface of the metal pads or bumps or metal post 52 by using a screen printing process, using a process including a laminating and a photolithography process, using a spin-coating process, or using a molding process and a photolithography process. In exemplary embodiments, the material of the polymer layer 24 can be epoxy, polyimide, SU-8 or acrylic, though other suitable materials may be used. The polymer layer 24 has a expansion coefficient between 3 and 6 ppm/° C., between 5 and 9 ppm/° C. or between 8 and 12 ppm/° C., approached silicon substrate, such as, the polyimide of "Zenomax" provide by Toyobo Co., Ltd. of Osaka, Japan. The polymer layer 24 can add some dielectric particle or glass fiber to raise the stress.

After formation, the polymer layer 24 can then be cured. The curing procedure may be performed by a suitable method/apparatus, e.g., a baking method, a microwave heating method, or an infrared heating method with temperature between, e.g., 140 and 220 degrees centigrade, between 200 and 320 degrees centigrade, or between 320 and 400 degrees centigrade.

Figure 2I:
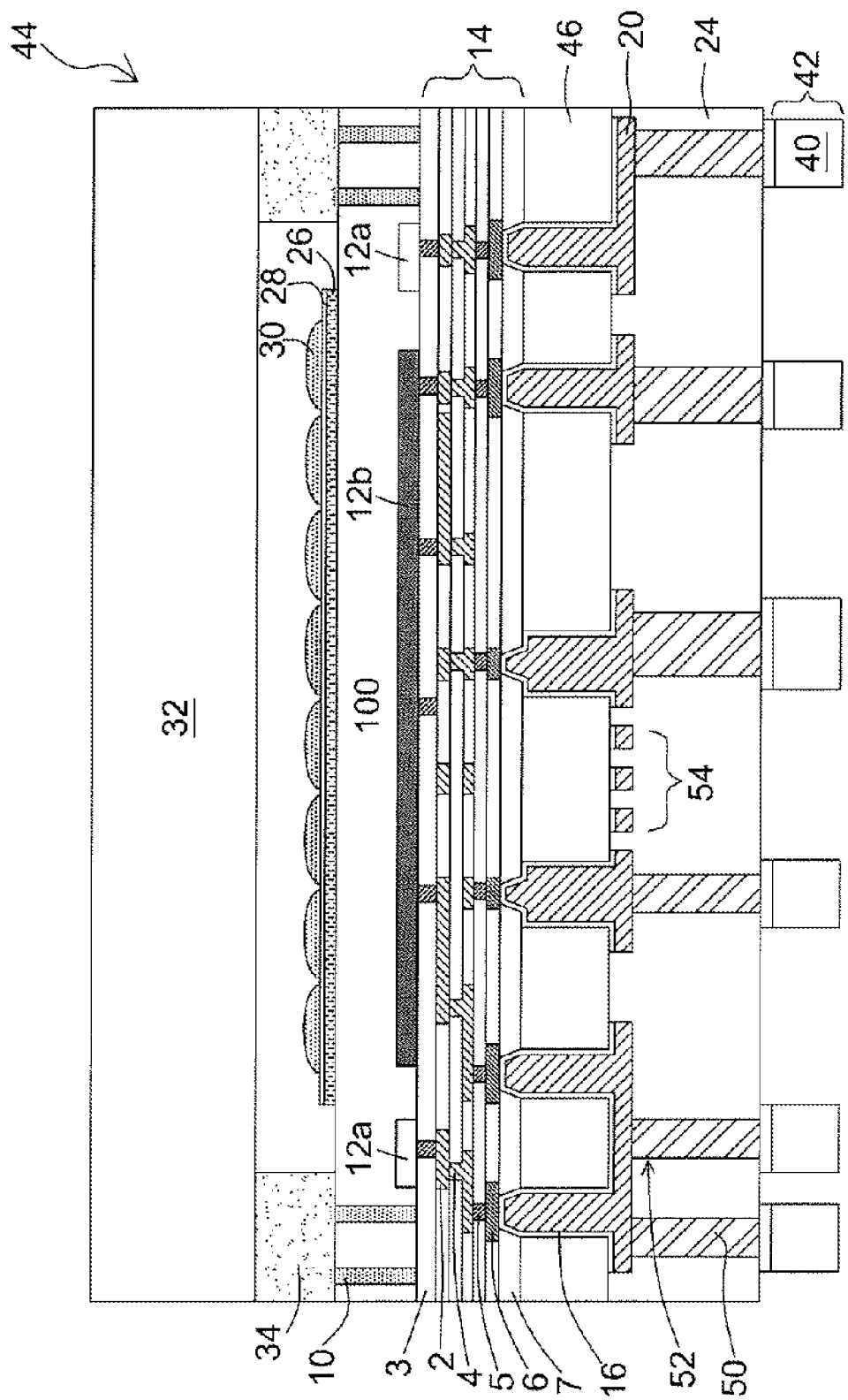

After the patterned adhesive polymer 24 has been cured, the next steps illustrated in FIG. 1L, FIG. 1L-1, FIG. 1L-2, FIG. 1M-FIG. 1P, FIG. 1P-1, FIG. 1Q-FIG. 1T, FIG. 1T-1, FIG. 1T-2, FIG. 1U, can be performed to provide a semiconductor chip 44 as shown in FIG. 2I.

Figure 2J:
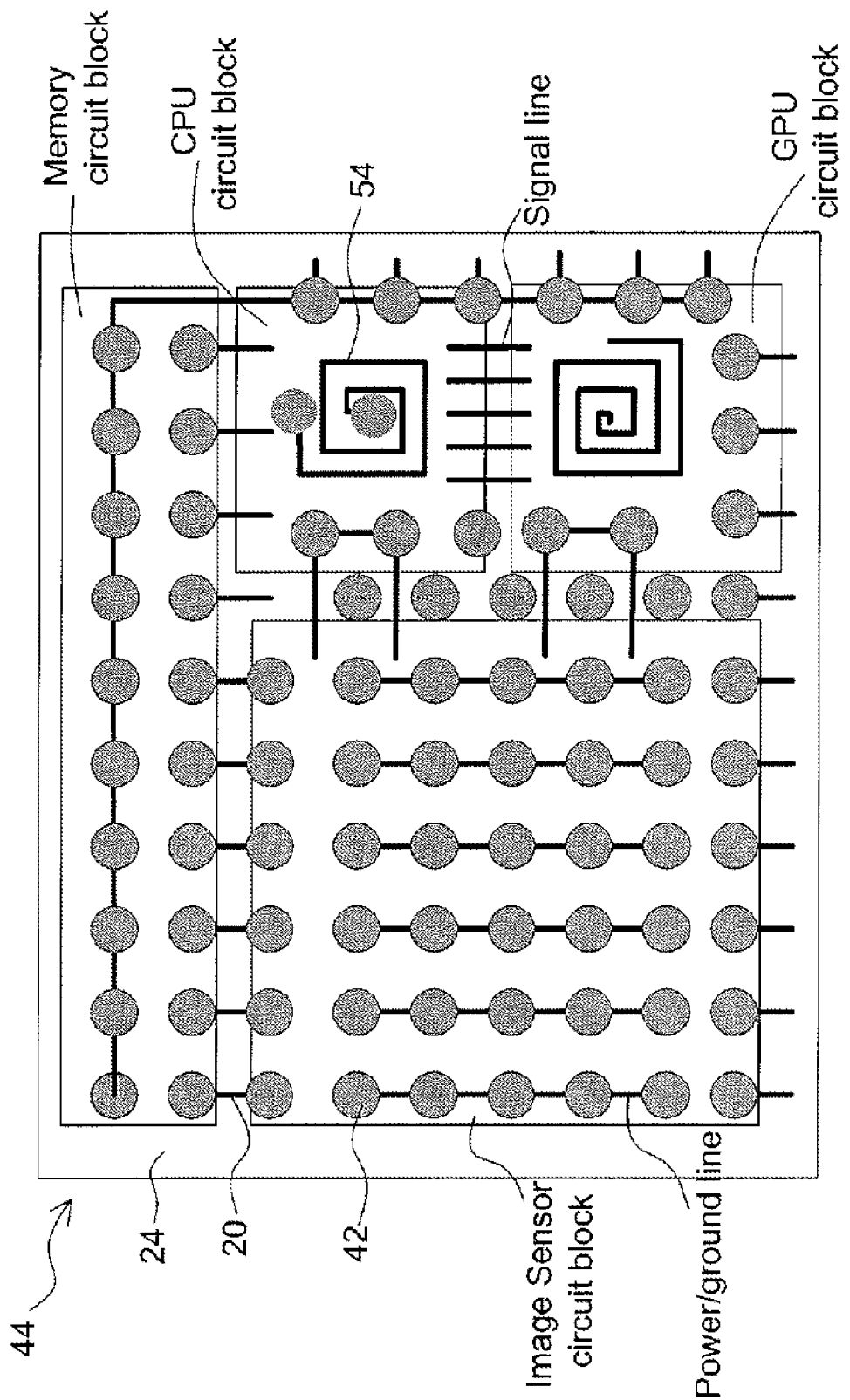

Each of the semiconductor chip 44 include an image sensor circuit block. The semiconductor chip 44 further includes multiple functional circuit block, such as a central-processing-unit (CPU) circuit block designed by x86 architecture or by non x86 architecture, a graphics-processing-unit (GPU) circuit block, a baseband circuit block, a digital-signal-processing (DSP) circuit block, a memory circuit block, a Bluetooth circuit block, a global-positioning-system (GPS) circuit block, a wireless local area network (WLAN) circuit block, and/or a modem circuit block. The metal layer 20 can connect to 2 or 3 functional circuit block. For example, FIG. 2J illustrates a top view of the metal layer 20, the metal coil 54 and the metal pads, bumps, pillars, or posts 52, in accordance with the present disclosure. The CPU circuit block is connected to the GPU circuit block and the memory circuit block through the metal layer 20. The metal layer 20 can be used for power distribution line or as a ground line or signal line.

Figure 2K:
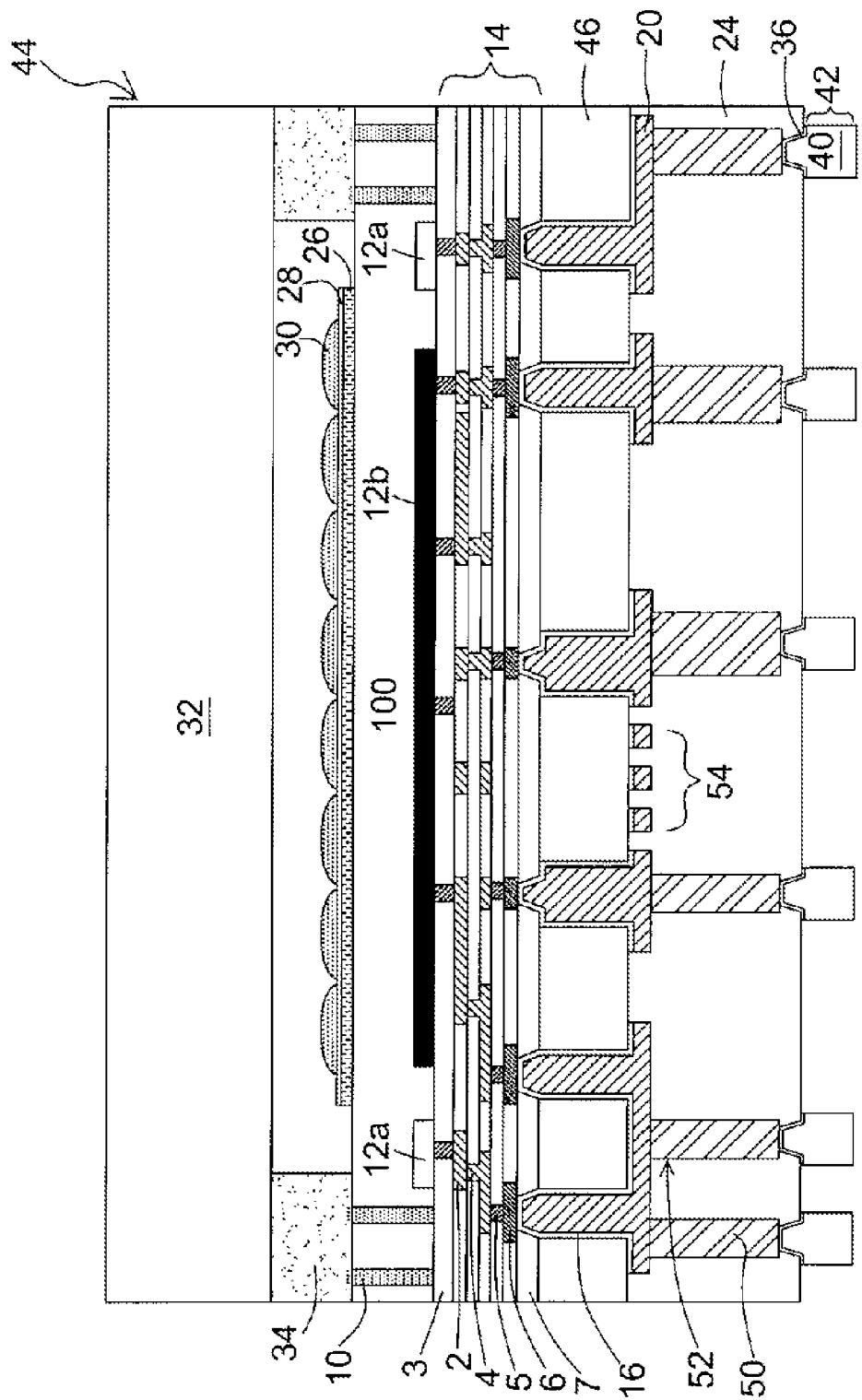

Referring to FIG. 2K and FIG. 1P-1, FIG. 2K is another exemplary structure of embodiment 1. Metal bumps 42 are formed on the contact pads 22' of metal pads, bumps, or metal post 22, and on the polymer layer 24. The detailed process is similar to the processes described in regards to FIG. 1L, FIG. 1L-1, FIG. 1L-2, FIG. 1M-FIG. 1P, FIG. 1P-1, FIG. 1Q-FIG. 1T, FIG. 1T-1, FIG. 1T-2, FIG. 1U, and can be performed to provide an semiconductor chip 44 as shown in FIG. 2K.

Figure 2L:
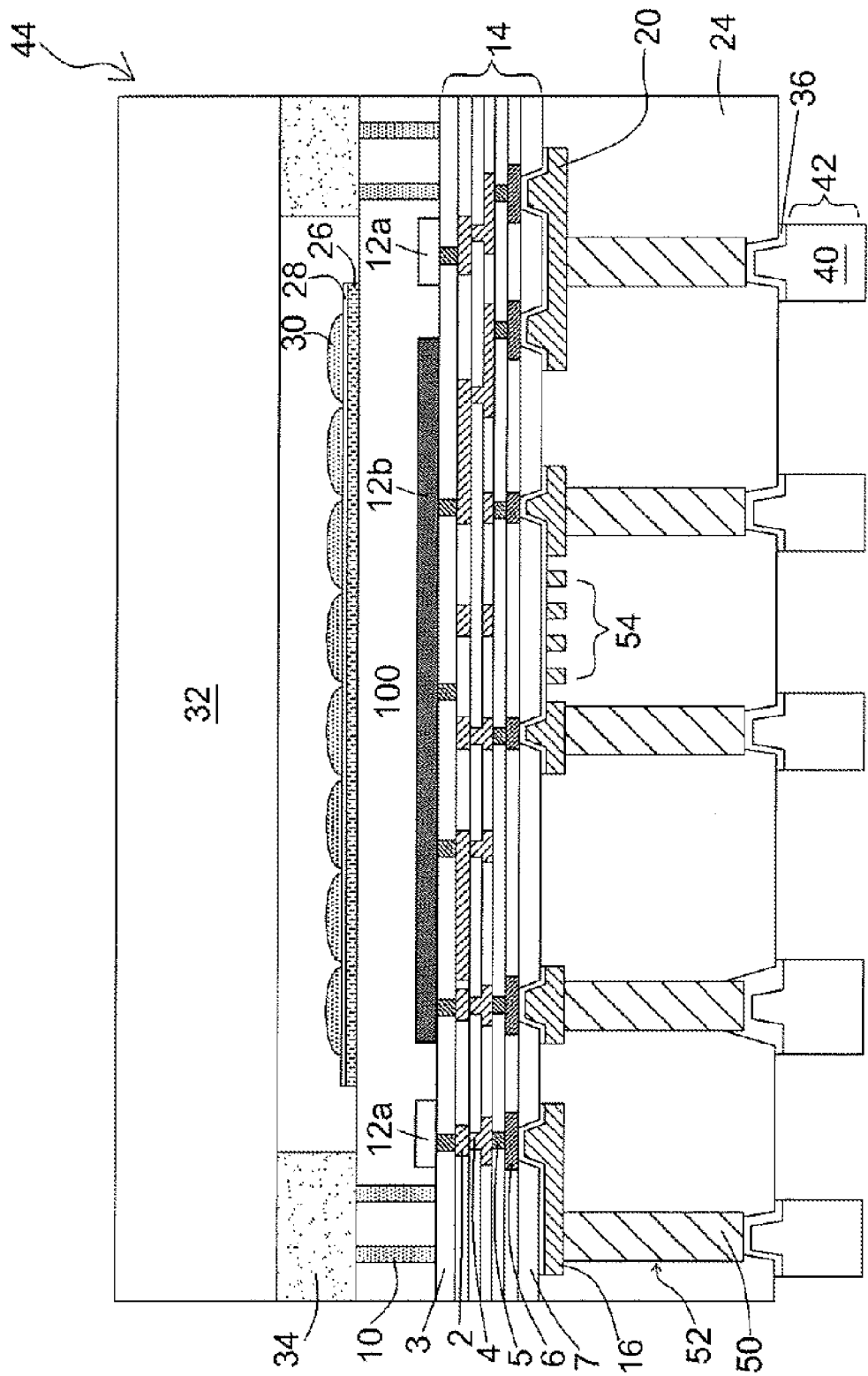

Alternatively, referring to FIG. 2L, the polymer layer 46 can be omitted, that is, the adhesion/barrier layer 46 can be formed on the passivation layer 7 and on the metal pads 6' exposed by the openings 7a in the passivation layer 7. Accordingly, the metal layer 20 provided by the adhesion/barrier layer 16 and the seed layer, the metal pads, bumps, pillars, or posts 52 can be formed over the metal pads 6' exposed by the openings 7a, on the passivation layer 7, and at the active side of the thinned silicon substrate 100.

Embodiment 3

Chip Packaging

Figure 3A:
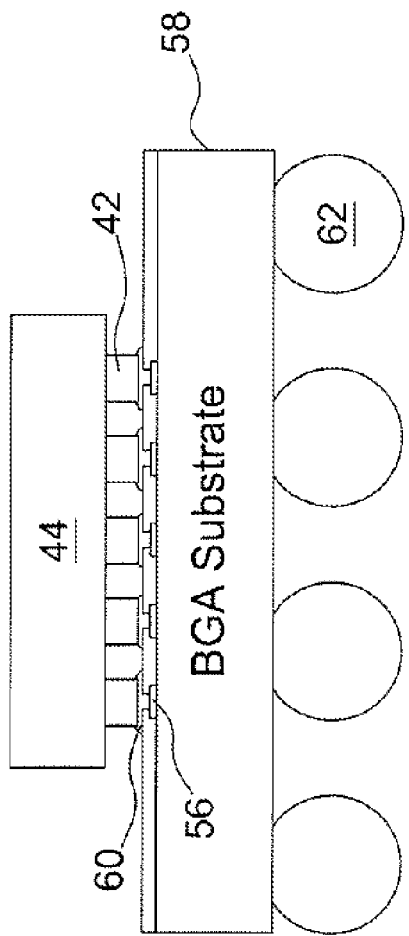

The semiconductor chip 44 of embodiment 1 and/or embodiment 2 can be connected to a contact pad 56 of a Ball Grid Array (BGA) substrate 58 through a solder metal joint 60 by a flip chip process as shown in FIG. 3A. Multiple solder balls 62 may be formed on bottom surface of the Ball Grid Array (BGA) substrate 58.

Figure 3B:
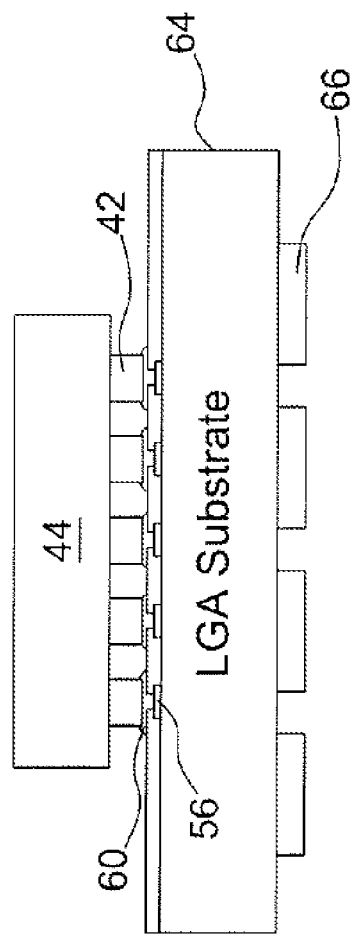

The semiconductor chip 44 of embodiment 1 and/or embodiment 2 can be connected to a contact pad 56 of a Land Grid Array (LGA) substrate 64 through a solder metal joint 60 by a flip chip process as shown in FIG. 3B. Multiple metal contact pads 66 may be formed on bottom surface of the LGA substrate 64.

Figure 3C:
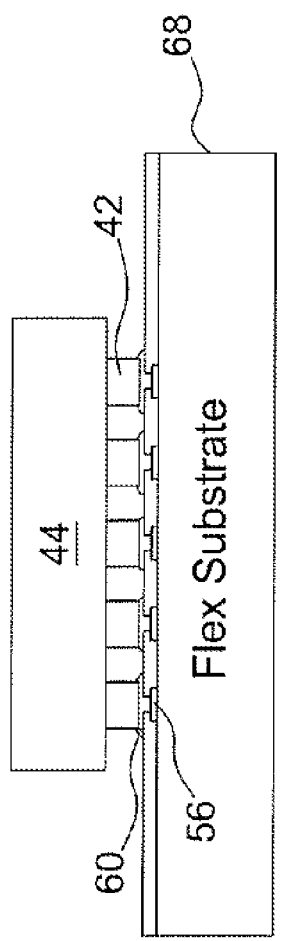

The semiconductor chip 44 of embodiment 1 and/or embodiment 2 can be connected to a contact pad 56 of a Flex substrate 68 through a solder metal joint 60 by a chip-on-film (COF) process as shown in FIG. 3C.

Figure 3D:
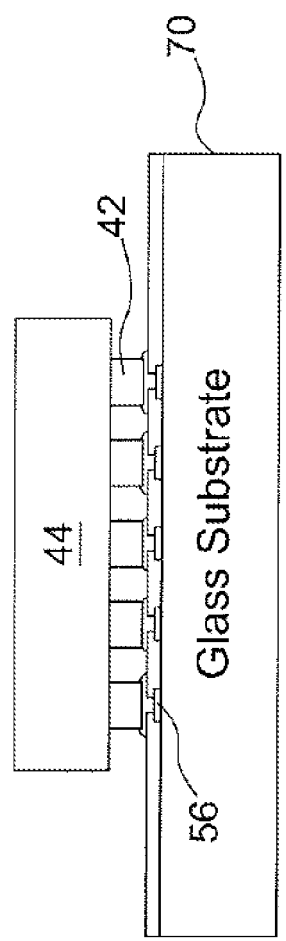

The semiconductor chip 44 of embodiment 1 and/or embodiment 2 can be connected to a contact pad 56 of a glass substrate 70 through an anisotropic conductive film (ACF) or a non-conductive film (NCF) by a chip-on-film (COF) process as shown in FIG. 3D.

The semiconductor chip 44 of embodiment 1 and/or embodiment 2 can be connected to a contact pad 56 of a semiconductor chip 72 through a metal contact 60 by a flip chip process as shown in FIG. 3E. The semiconductor chip 72 may further include multiple wirebonded pads 74 connected to other external substrates or devices through metal wire 76. The material of metal wire 76 can be gold wire or copper wire. The metal contact 60 can be a copper pad, copper bump, gold pad, gold bump, nickel bump, nickel pad, solder joint, a tin-containing layer on a copper bump or a tin-containing layer on a nickel bump. The semiconductor chip 72 can be a memory chip, such as Dynamic random-access memory (DRAM), Static random-access memory (SRAM), or Flash memory, or a logic chip, such as a CPU, a GPU, or a power management chip.

The semiconductor chip 44 of embodiment 1 and/or embodiment 2 can be connected to a contact pad 56 of a semiconductor chip 78 through a metal contact 60 by a flip chip process, as shown in FIG. 3F. The semiconductor chip 78 may further include multiple through silicon via (TSV) metal pads 80 connected to other external substrate or device through a metal bump 82. The material of the metal pads 80 can be copper interconnect or aluminum interconnect. The metal contact 60 can be a copper pad, copper bump, gold pad, gold bump, nickel bump, nickel pad, solder joint, a tin-containing layer on a copper bump or a tin-containing layer on a nickel bump. The semiconductor chip 78 can be a memory chip, such as DRAM, SRAM, or Flash memory, or a logic chip, such as a CPU, a GPU, or a power management chip.

Figure 3G:
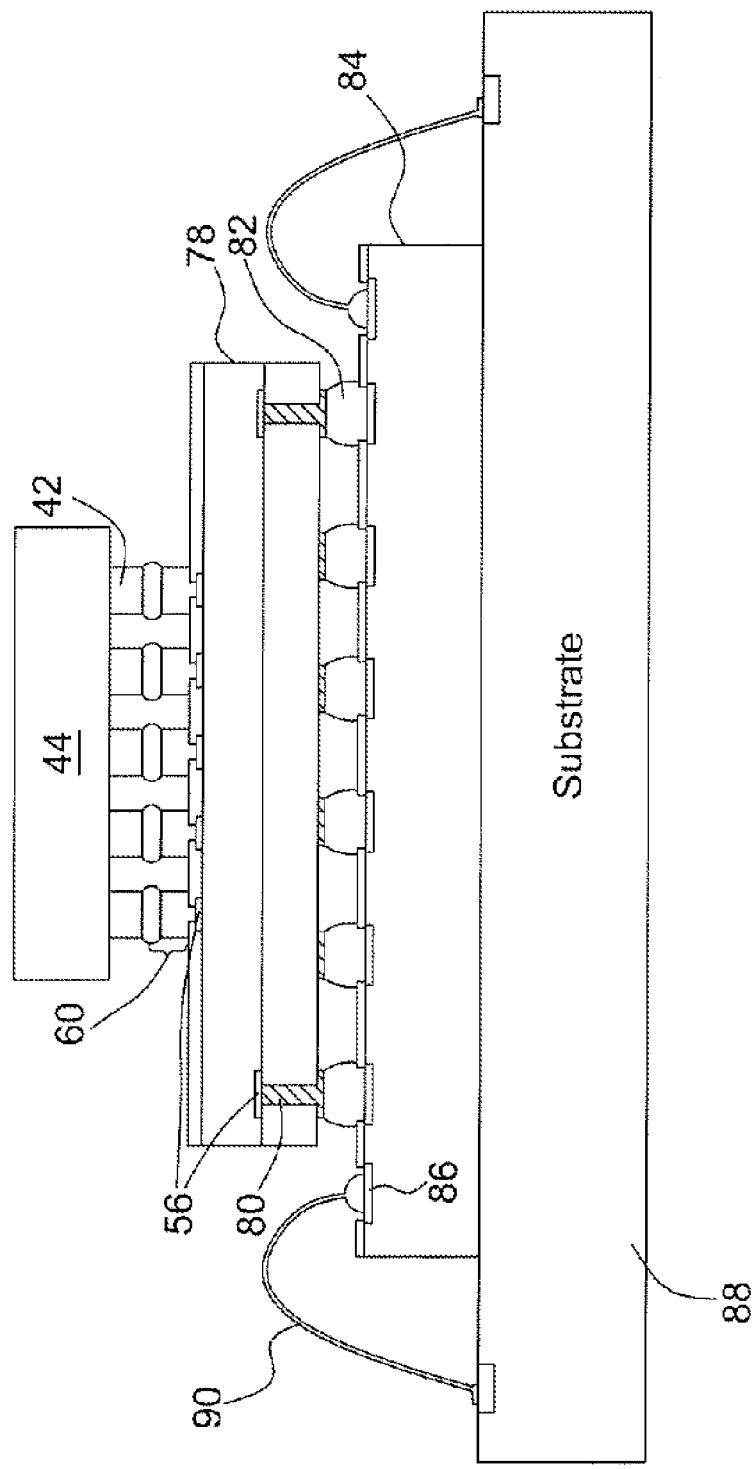

Referring to FIG. 3G, the semiconductor chip 44 of embodiment 1 and/or embodiment 2 can be applied in 3D chip packaging. The chip package of FIG. 3F can be connected to another semiconductor chip 84. The semiconductor chip 84 may further include multiple wirebonded pads 86 connected to another external substrate or device 88 through metal wire 90. The material of metal wire 90 can be gold wire or copper wire. The external substrate or device 88 can be a Ball Grid Array (BGA) substrate, a LGA substrate, a Flex substrate, a glass substrate, a Lead frame or silicon substrate. The semiconductor chip 84 can be a memory chip, such as DRAM, SRAM, or Flash memory, or a logic chip, such as a CPU, a GPU, or a power management chip.

Those described above are the embodiments to exemplify the present disclosure to enable the person skilled in the art to understand, make and use embodiments of the present disclosure. This description, however, is not intended to limit the scope of the present disclosure. Any equivalent modification and variation according to the spirit of the present disclosure is to be also included within the scope of the claims stated below.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

In reading the present disclosure, one skilled in the art will appreciate that embodiments of the present disclosure can be implemented in hardware, software, firmware, or any combinations of such, and over one or more networks. Suitable software can include computer-readable or machine-readable instructions for performing methods and techniques (and portions thereof) of designing and/or controlling the fabrication and design of integrated circuit chips according to the present disclosure. Any suitable software language (machine-dependent or machine-independent) may be utilized. Moreover, embodiments of the present disclosure can be included in or carried by various signals, e.g., as transmitted over a wireless radio frequency (RF) or infrared (IR) communications link or downloaded from the Internet.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. The scope of protection is limited solely by the claims. That scope is intended and should be interpreted to be as broad as is consistent with the ordinary meaning of the language that is used in the claims when interpreted in light of this specification and the prosecution history that follows and to encompass all structural and functional equivalents.

What is claimed is:

1. A semiconductor chip comprising:
   a silicon substrate comprising a top side surface and a bottom side surface, wherein said silicon substrate has a thickness smaller than 10 micrometers;
   a transistor in or on said bottom side surface;
   a metallization structure under said bottom side surface, wherein said metallization structure comprises a first metal layer and a second metal layer over said first metal layer;
   a dielectric layer under said silicon substrate and between said first and second metal layers;
   a passivation layer under said metallization structure and under said dielectric layer, wherein said passivation layer comprises a nitride layer, wherein an opening in said passivation layer is vertically under a contact point of said metallization structure;

a polymer layer under said passivation layer, wherein said polymer layer has a thickness between 20 and 200 micrometers;

a metal post under said passivation layer and in said polymer layer, wherein said polymer layer does not cover a bottom surface of said metal post, wherein a portion of a top surface of said metal post is in said opening and vertically under said contact point;

a metal bump directly vertically under said bottom surface of said metal post and physically connected with said bottom surface of said metal post;

a micro-lense over said top side surface; and a glass substrate over said micro-lense and over said top side surface.

2. The semiconductor chip of claim 1, wherein said metal post comprises an electroplated copper layer.

3. The semiconductor chip of claim 1, wherein said metal bump comprises an electroplated copper layer.

4. The semiconductor chip of claim 1, wherein said metal bump comprises a tin-containing layer.

5. The semiconductor chip of claim 1, wherein said first metal layer comprises a damascene metal layer.

6. The semiconductor chip of claim 1, wherein said first metal layer comprises a damascene metal layer and said second metal layer comprises an aluminum layer over said damascene metal layer.

7. The semiconductor chip of claim 1, wherein said first metal layer comprises an electroplated copper layer.

8. The semiconductor chip of claim 1, wherein said silicon substrate has a thickness smaller than 5 micrometers.

9. The semiconductor chip of claim 1, wherein said polymer layer comprises a polyimide layer.

10. The semiconductor chip of claim 1, wherein said polymer layer has an expansion coefficient between 3 and 6 ppm/° C.

11. A semiconductor chip comprising:

a silicon substrate comprising a top side surface and a bottom side surface, wherein said silicon substrate has a thickness smaller than 10 micrometers;

a transistor in or on said bottom side surface;

a metallization structure under said bottom side surface, wherein said metallization structure comprises a first metal layer and a second metal layer over said first metal layer;

a dielectric layer under said silicon substrate and between said first and second metal layers;

a passivation layer under said metallization structure and under said dielectric layer, wherein said passivation layer comprises a nitride layer, wherein an opening in said passivation layer is vertically under a contact point of said metallization structure;

a metal trace under said passivation layer;

a polymer layer under said passivation layer and under said metal trace, wherein said polymer layer has a thickness between 20 and 200 micrometers;

a metal post under said metal trace and in said polymer layer, wherein said polymer layer does not cover a bottom surface of said metal post, wherein a portion of a top surface of said metal post is in said opening and vertically under said contact point, wherein said portion of said top surface of said metal post is connected to said contact point through said metal trace;

a metal bump directly vertically under said bottom surface of said metal post and physically connected with said bottom surface of said metal post;

a micro-lense over said top side surface; and a glass substrate over said micro-lense and over said top side surface.

12. The semiconductor chip of claim 11, wherein said metal post comprises an electroplated copper layer.

13. The semiconductor chip of claim 11, wherein said metal bump comprises an electroplated copper layer.

14. The semiconductor chip of claim 11, wherein said metal bump comprises a tin-containing layer.

15. The semiconductor chip of claim 11, wherein said first metal layer comprises a damascene metal layer.

16. The semiconductor chip of claim 11, wherein said first metal layer comprises a damascene metal layer and said second metal layer comprises an aluminum layer over said damascene metal layer.

17. The semiconductor chip of claim 11, wherein said first metal layer comprises an electroplated copper layer.

18. The semiconductor chip of claim 11, wherein said silicon substrate has a thickness smaller than 5 micrometers.

19. The semiconductor chip of claim 11, wherein said polymer layer comprises a polyimide layer.

20. The semiconductor chip of claim 11, wherein said polymer layer has an expansion coefficient between 3 and 6 ppm/° C.

* * * * *